(12) United States Patent
Sugie

(10) Patent No.: US 10,608,631 B2
(45) Date of Patent: Mar. 31, 2020

(54) BRIDGE OUTPUT CIRCUIT, MOTOR DRIVER DEVICE AND SEMICONDUCTOR DEVICE

(71) Applicant: ROHM CO., LTD., Kyoto (JP)

(72) Inventor: Hisashi Sugie, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/416,612

(22) Filed: May 20, 2019

(65) Prior Publication Data

US 2019/0356310 A1 Nov. 21, 2019

(30) Foreign Application Priority Data

May 21, 2018 (JP) .................................. 2018-097028

(51) Int. Cl.
*H03K 17/0812* (2006.01)
*H03K 17/687* (2006.01)
*H02M 1/08* (2006.01)

(52) U.S. Cl.
CPC ............................... *H03K 17/6872* (2013.01)

(58) Field of Classification Search
CPC combination set(s) only.
See application file for complete search history.

(56) References Cited

U.S. PATENT DOCUMENTS

| 8,970,265 | B2 * | 3/2015 | McIntosh | ................ H02M 1/08 |
| | | | | 327/112 |
| 9,094,006 | B2 * | 7/2015 | Gravati | ................ H03K 17/082 |
| 9,111,764 | B2 * | 8/2015 | Hirler | ............... H01L 29/42372 |
| 2011/0187439 | A1 | 8/2011 | Sugie | |

FOREIGN PATENT DOCUMENTS

JP 2011055470 A 3/2011

* cited by examiner

*Primary Examiner* — An T Luu
(74) *Attorney, Agent, or Firm* — Cantor Colburn LLP

(57) ABSTRACT

A bridge output circuit includes: a voltage-controlled first transistor provided between a first power supply terminal and an output terminal; a voltage-controlled second transistor provided between the output terminal and a second power supply terminal having a potential lower than the potential of the first power supply terminal; a first OFF detection circuit detecting whether the first transistor is in an OFF state based on a gate voltage of the first transistor; a second OFF detection circuit detecting whether the second transistor is in an OFF state based on a gate voltage of the second transistor; and an output control circuit performing a first source transition operation of turning off the second transistor and then turning on the first transistor, and then performing a second source transition operation of turning off the first transistor and then turning on the second transistor.

12 Claims, 22 Drawing Sheets

FIG. 2

| | 1 | 0 |
|---|---|---|
| 31<br>High side off sensor — Output<br>SNS_TrH_OFF | TrH OFF<br>($V_{GS}$ of TrH lower than $T_{HH}$) | TrH not OFF |
| 32<br>(VPWR+Vth1) sensor — Output<br>SNS_(VPWR+Vth1) | (Gate voltage HG of TrH)<br>$\geq$ (VPWR+Vth1) | (Gate voltage HG of TrH)<br>< (VPWR+Vth1) |
| 33<br>Vth2 sensor — Output<br>SNS_Vth2 | $V_{OUT} \geq$ Vth2 | $V_{OUT} <$ Vth2 |
| 34<br>Low side off sensor — Output<br>SNS_TrL_OFF | TrL OFF<br>($V_{GS}$ of TrH lower than $T_{HL}$) | TrL not OFF |
| 35<br>(VPWR−Vth3) sensor — Output<br>SNS_(VPWR−Vth3) | $V_{OUT} \geq$ (VPWR−Vth3) | $V_{OUT} <$ (VPWR−Vth3) |

FIG. 3

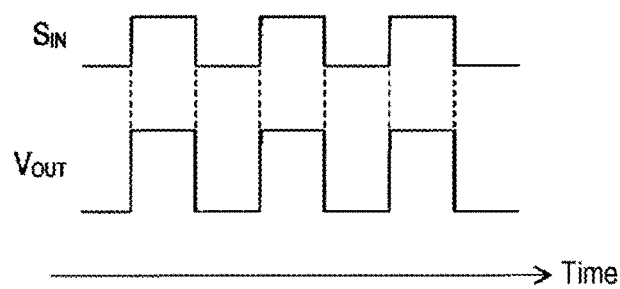

Time

FIG. 8A

| SNS_Vth2 | Constant current circuit 121 |
|---|---|
| 0 ($V_{OUT} <$ Vth2) | ON |
| 1 ($V_{OUT} \geq$ Vth2) | OFF |

FIG. 8B

| $S_{IN}$ | SNS_Vth2 | Constant current circuit 122 |
|---|---|---|
| 0 | 0 | OFF |
| 0 | 1 | ON |
| 1 | 0 | OFF |
| 1 | 1 | OFF |

FIG. 8C

| HIONsig | Switch 126 |
|---|---|
| 0 | OFF |
| 1 | ON |

|  | $T_{A2}$ | $T_{B2}$ |  |
|---|---|---|---|
| IHon | OFF | ON | OFF |
| HIONsig | 1 | 0 | 1 |
| Switch 126 | ON | OFF | ON |

OR

|  | $T_{A2}$ | $T_{B2}$ |  |
|---|---|---|---|
| IHon | OFF | ON | OFF |
| HIONsig | 1 | 0 | 1 |
| Switch 126 | ON | OFF | ON |

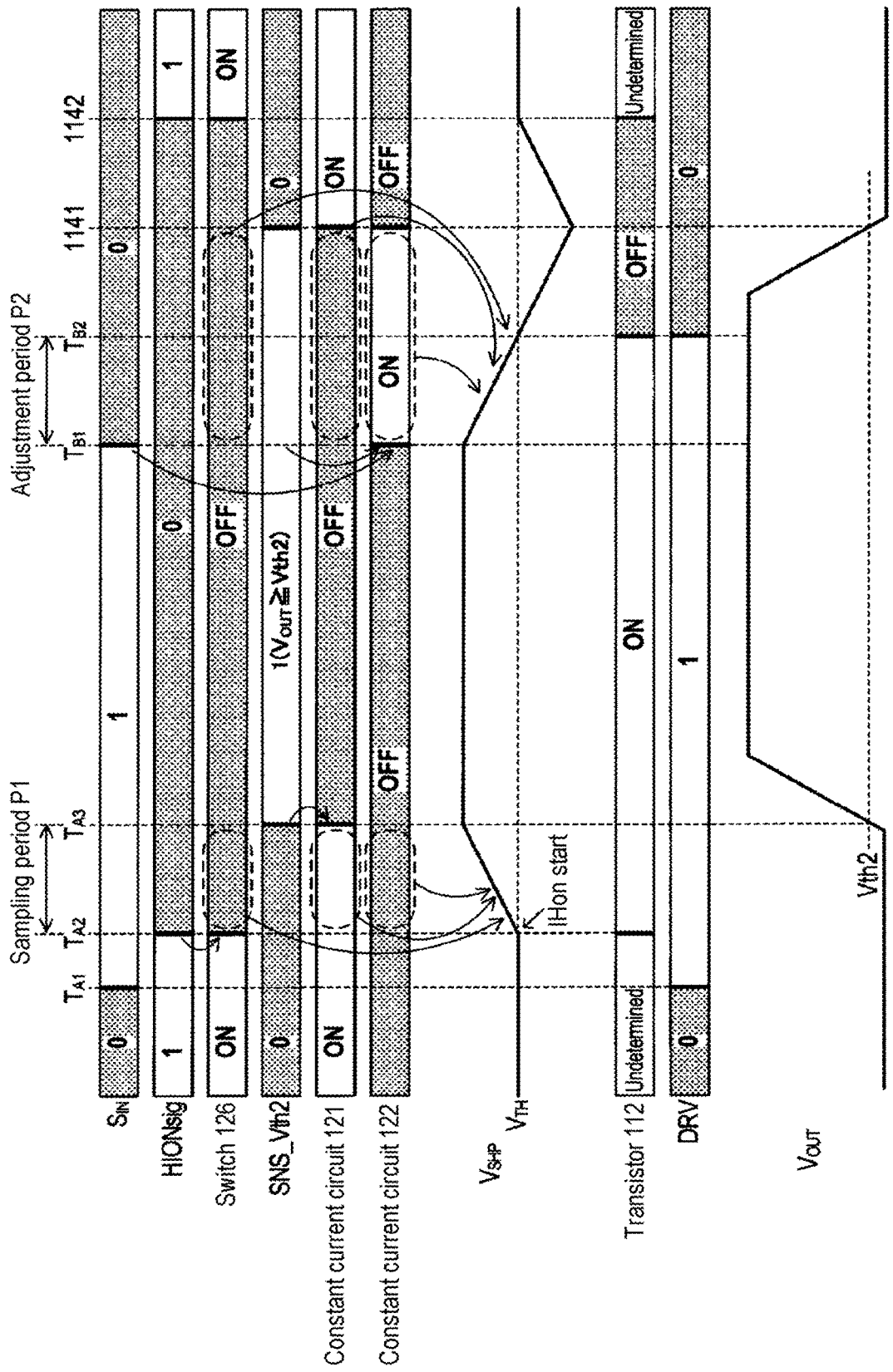

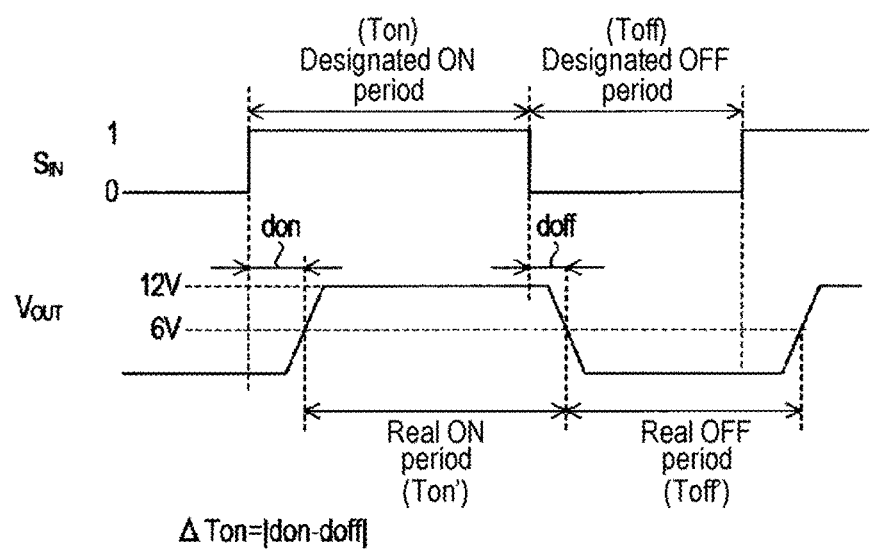

[Comparison bridge output circuit (source state)]

[Bridge output circuit according to first Example (source state)]

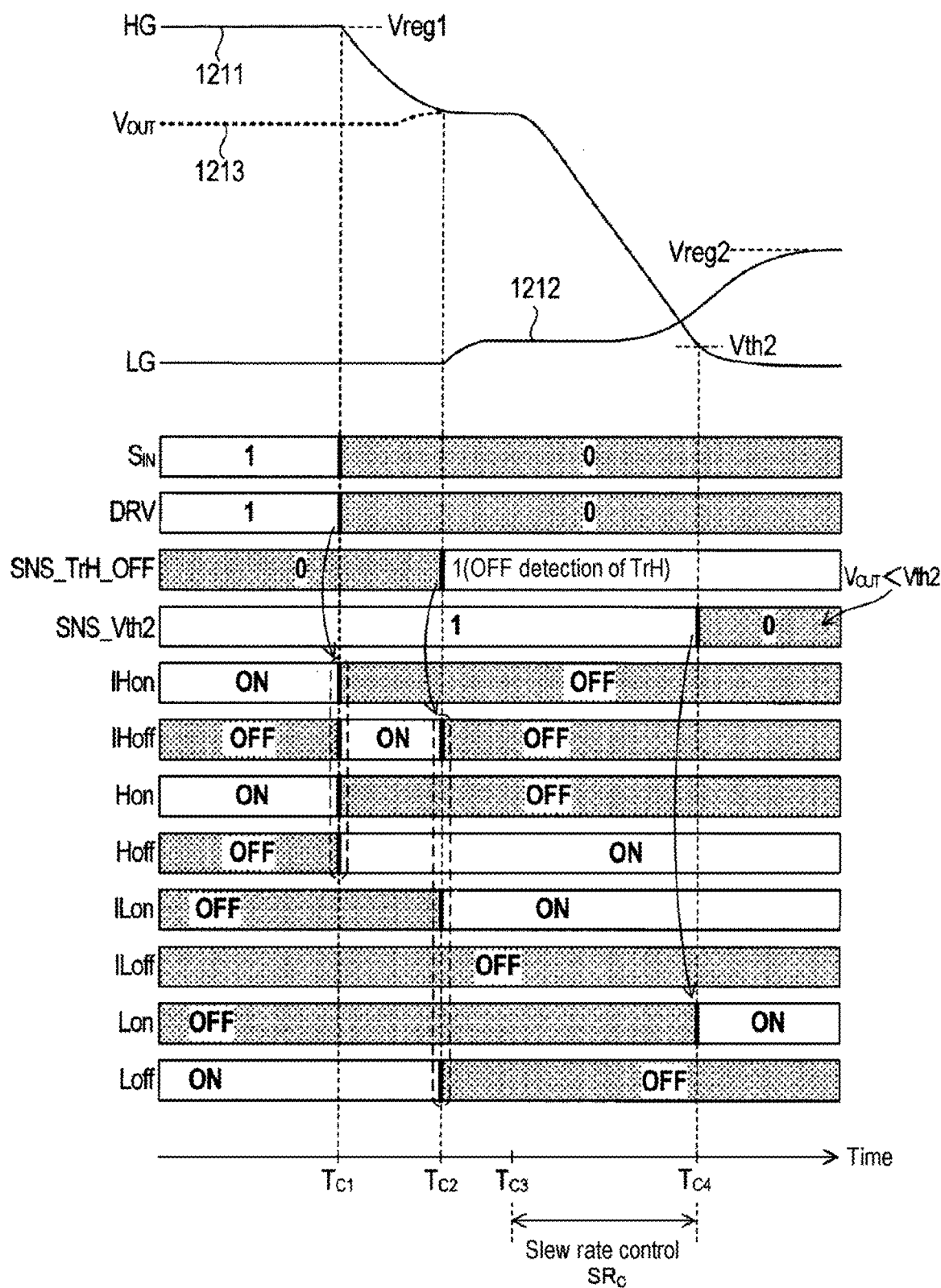

FIG. 15A

| SNS_(VPWR-Vth3) | Constant current circuit 221 |
|---|---|
| 0 ($V_{OUT} <$ (VPWR-Vth3)) | OFF |
| 1 ($V_{OUT} \geq$ (VPWR-Vth3)) | ON |

FIG. 15B

| $S_{IN}$ | SNS_(VPWR-Vth3) | Constant current circuit 222 |
|---|---|---|
| 0 | 0 | OFF |
| 0 | 1 | OFF |
| 1 | 0 | ON |
| 1 | 1 | OFF |

FIG. 15C
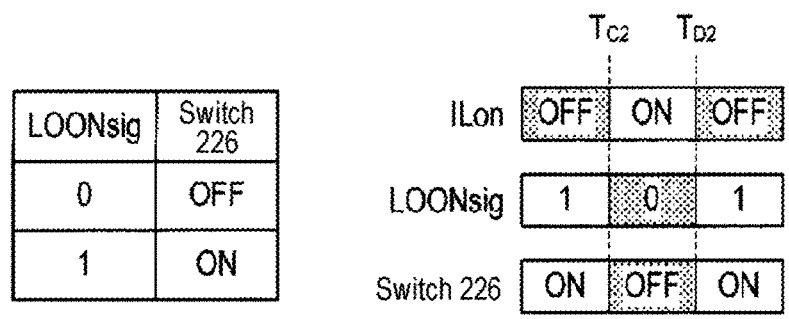
OR
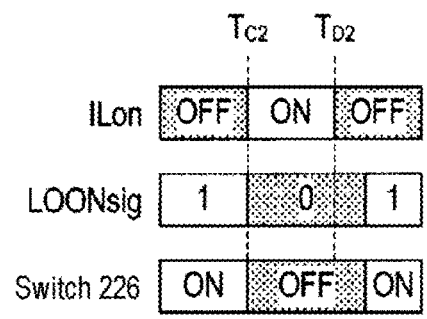

[When comparison bridge output circuit is used]

[When bridge output circuit of the present disclosure is used]

BRIDGE OUTPUT CIRCUIT, MOTOR DRIVER DEVICE AND SEMICONDUCTOR DEVICE

CROSS-REFERENCE TO RELATED APPLICATION

The present application claims priority under 35 U.S.C. § 119 to Japanese Patent Application No. 2018-097028, filed on May 21, 2018, the entire contents of which are incorporated herein by reference.

TECHNICAL FIELD

The present disclosure relates to a bridge output circuit, a motor driver device and a semiconductor device.

BACKGROUND

A bridge output circuit, which supplies a rectangular wave switching voltage to a load by alternately turning on/off a high side transistor and a low side transistor connected in series in response to a change in a rectangular wave input signal level, is known.

In this type of bridge output circuit, there is a period during which both the high side transistor and the low side transistor are turned off simultaneously in order to reliably prevent the high side transistor and the low side transistor from being turned on simultaneously. Such period called a dead time (dead time period). In the related art, a method is generally employed in which a gate voltage of one transistor is used as a feedback signal and the other transistor is turned on after the off state of the one transistor is confirmed.

The dead time is required to suppress a through current caused by the simultaneous turning on of a pair of transistors connected in series, but due to the existence of the dead time, a desired output duty may not be obtained in a half bridge circuit constituted with a pair of transistors. That is, due to the influence of the dead time, a non-negligible deviation may occur between an output duty designated by an input signal and an output duty actually obtained in the half bridge circuit, and this deviation becomes noticeable as a frequency of the input signal increases (this is discussed in more detail later). As a matter of course, it is not desirable to drive a load with an output duty deviating significantly from the output duty designated by the input signal.

SUMMARY

Some embodiments of the present disclosure provide a bridge output circuit which contributes to reduction of a deviation between an output duty designated by an input signal and a real output duty, a motor driver device and a semiconductor device.

According to one embodiment of the present disclosure, there is provided a first bridge output circuit that receives a rectangular wave input signal and supplies an output voltage corresponding to the rectangular wave input signal to a load connected to an output terminal, including: a voltage-controlled first transistor provided between a first power supply terminal to which a predetermined power supply voltage is applied and the output terminal; a voltage-controlled second transistor provided between the output terminal and a second power supply terminal having a potential lower than the potential of the first power supply terminal; a first OFF detection circuit configured to detect whether or not the voltage-controlled first transistor is in an OFF state based on a gate voltage of the voltage-controlled first transistor; a second OFF detection circuit configured to detect whether or not the voltage-controlled second transistor is in an OFF state based on a gate voltage of the voltage-controlled second transistor; and an output control circuit configured to perform a first source transition operation of turning off the voltage-controlled second transistor and then turning on the voltage-controlled first transistor in response to a first signal change in the rectangular wave input signal based on the rectangular wave input signal, a detection result of the first OFF detection circuit and a detection result of the second OFF detection circuit in a source state in which a current flows from a connection node between the voltage-controlled first transistor and the voltage-controlled second transistor toward the load via the output terminal, and then to perform a second source transition operation of turning off the voltage-controlled first transistor and then turning on the voltage-controlled second transistor in response to a second signal change in the rectangular wave input signal, wherein the output control circuit acquires an analog signal according to the length of dead time in which both the voltage-controlled first transistor and the voltage-controlled second transistor are turned off during the first source transition operation, and then starts the second source transition operation after waiting for a lapse of time based on the acquired analog signal when the second signal change occurs in the rectangular wave input signal.

In some embodiments, the first bridge output circuit further includes: an ON current supply circuit configured to supply a current to the gate of the voltage-controlled first transistor to turn on the voltage-controlled first transistor after detecting that the voltage-controlled second transistor is in the OFF state in the first source transition operation; and a voltage comparison circuit configured to compare the output voltage with a predetermined comparison voltage, wherein the output control circuit uses a comparison result signal indicating a comparison result of the voltage comparison circuit to acquire, as the analog signal, a signal corresponding to a period from a supply start time of the current by the ON current supply circuit to a time when the output voltage reaches the predetermined comparison voltage.

In some embodiments, the output control circuit includes a capacitor configured to acquire the analog signal, changes a terminal voltage of the capacitor from an initial voltage by flowing a first constant current to the capacitor from the supply start time of the current by the ON current supply circuit to the time when the output voltage reaches the predetermined comparison voltage, holds the change as the analog signal, and then allows a second constant current to flow through the capacitor in a reverse direction to the first constant current from a time when the second signal change occurs in the rectangular wave input signal, and starts the second source transition operation in response to the terminal voltage of the capacitor returning to the initial voltage.

According to another embodiment of the present disclosure, there is provided a second bridge output circuit that receives a rectangular wave input signal and supplies an output voltage corresponding to the rectangular wave input signal to a load connected to an output terminal, including: a voltage-controlled first transistor provided between a first power supply terminal to which a predetermined power supply voltage is applied and the output terminal; a voltage-controlled second transistor provided between the output terminal and a second power supply terminal having a potential lower than the potential of the first power supply terminal; a first OFF detection circuit configured to detect whether or not the voltage-controlled first transistor is in an OFF state based on a gate voltage of the voltage-controlled first transistor; a second OFF detection circuit configured to detect whether or not the voltage-controlled second transistor is in an OFF state based on a gate voltage of the voltage-controlled second transistor; and an output control circuit configured to perform a first sink transition operation of turning off the voltage-controlled first transistor and then turning on the voltage-controlled second transistor in response to a first signal change in the rectangular wave input signal based on the rectangular wave input signal, a detection result of the first OFF detection circuit and a detection result of the second OFF detection circuit in a sink state in which a current flows from the load toward a connection node between the voltage-controlled first transistor and the voltage-controlled second transistor via the output terminal, and then to perform a second sink transition operation of turning off the voltage-controlled second transistor and then turning on the voltage-controlled first transistor in response to a second signal change in the rectangular wave input signal, wherein the output control circuit acquires an analog signal according to a length of dead time in which both the voltage-controlled first transistor and the voltage-controlled second transistor are turned off during the first sink transition operation, and then starts the second sink transition operation after waiting for a lapse of time based on the acquired analog signal when the second signal change occurs in the rectangular wave input signal.

In some embodiments, the second bridge output circuit further includes: an ON current supply circuit configured to supply a current to the gate of the voltage-controlled second transistor to turn on the voltage-controlled second transistor after detecting that the voltage-controlled first transistor is in the OFF state in the first sink transition operation; and a voltage comparison circuit configured to compare the output voltage with a predetermined comparison voltage, wherein the output control circuit uses a comparison result signal indicating a comparison result of the voltage comparison circuit to acquire, as the analog signal, a signal corresponding to a period from a supply start time of the current by the ON current supply circuit to a time when the output voltage falls below the predetermined comparison voltage.

In some embodiments, the output control circuit includes a capacitor configured to acquire the analog signal, changes a terminal voltage of the capacitor from an initial voltage by flowing a first constant current to the capacitor from the supply start time of the current by the ON current supply circuit to the time when the output voltage falls below the predetermined comparison voltage, holds the change as the analog signal, and then allow a second constant current to flow through the capacitor in a reverse direction to the first constant current from a time when the second signal change occurs in the rectangular wave input signal, and starts the second sink transition operation in response to the terminal voltage of the capacitor returning to the initial voltage.

According to another embodiment of the present disclosure, there is provided a third bridge output circuit that receives a rectangular wave input signal and supplies an output voltage corresponding to the rectangular wave input signal to a load connected to an output terminal, including: a voltage-controlled first transistor provided between a first power supply terminal to which a predetermined power supply voltage is applied and the output terminal; a voltage-controlled second transistor provided between the output terminal and a second power supply terminal having a potential lower than the potential of the first power supply terminal; a first OFF detection circuit configured to detect whether or not the voltage-controlled first transistor is in an OFF state based on a gate voltage of the voltage-controlled first transistor; a second OFF detection circuit configured to detect whether or not the voltage-controlled second transistor is in an OFF state based on a gate voltage of the voltage-controlled second transistor; a voltage comparison circuit configured to compare the output voltage with a plurality of comparison voltages; and an output control circuit configured to control the ON/OFF state of the voltage-controlled first transistor and the voltage-controlled second transistor based on the rectangular wave input signal, a detection result of the first OFF detection circuit and a detection result of the second OFF detection circuit, wherein the output control circuit performs a first source transition operation of turning off the voltage-controlled second transistor and then turning on the voltage-controlled first transistor in response to a first signal change in the rectangular wave input signal in a source state in which a current flows from a connection node between the voltage-controlled first transistor and the voltage-controlled second transistor toward the load via the output terminal, and then performs a second source transition operation of turning off the voltage-controlled first transistor and then turning on the voltage-controlled second transistor in response to a second signal change in the rectangular wave input signal, wherein the output control circuit performs a first sink transition operation of turning off the voltage-controlled first transistor and then turning on the voltage-controlled second transistor in response to the second signal change in the rectangular wave input signal in a sink state in which a current flows from the load toward the connection node via the output terminal, and then performs a second sink transition operation of turning off the voltage-controlled second transistor and then turning on the voltage-controlled first transistor in response to the first signal change in the rectangular wave input signal, wherein the output control circuit includes a determination circuit that determines whether the output control circuit is in the source state or the sink state based on the detection result of the first OFF detection circuit, the detection result of the second OFF detection circuit and a comparison result of the voltage comparison circuit, wherein, upon determining by the determination circuit that the output control circuit is in the source state, the output control circuit acquires a first analog signal according to a length of dead time in which both the voltage-controlled first transistor and the voltage-controlled second transistor are turned off during the first source transition operation, and then starts the second source transition operation after waiting for a lapse of time based on the acquired first analog signal when the second signal change occurs in the rectangular wave input signal, and wherein, upon determining by the determination circuit that the output control circuit is in the sink state, the output control circuit acquires a second analog signal according to a length of dead time in which both the voltage-controlled first transistor and the voltage-controlled second transistor are turned off during the first sink transition operation, and then starts the second sink transition operation after waiting for a lapse of time based on the acquired second analog signal when the first signal change occurs in the rectangular wave input signal.

In some embodiments, the third bridge output circuit further includes: a first ON current supply circuit configured to supply a current to the gate of the voltage-controlled first transistor to turn on the voltage-controlled first transistor; and a second ON current supply circuit configured to supply a current to the gate of the voltage-controlled second transistor to turn on the voltage-controlled second transistor, wherein the voltage comparison circuit includes a first voltage comparison circuit that compares the output voltage with a predetermined first comparison voltage, and a second voltage comparison circuit that compares the output voltage with a predetermined second comparison voltage higher than the predetermined first comparison voltage, wherein the output control circuit includes: a first analog signal acquisition circuit that uses a comparison result signal indicating a comparison result of the first voltage comparison circuit to acquire, as the first analog signal, a signal corresponding to a period from a supply start time of the current by the first ON current supply circuit to a time when the output voltage reaches the predetermined first comparison voltage during the first source transition operation; and a second analog signal acquisition circuit that uses a comparison result signal indicating a comparison result of the second voltage comparison circuit to acquire, as the second analog signal, a signal corresponding to a period from the supply start time of the current by the second ON current supply circuit to a time when the output voltage falls below the predetermined second comparison voltage during the first sink transition operation, wherein, upon determining by the determination circuit that the output control circuit is in the source state, the output control circuit performs the first source transition operation and then starts the second source transition operation after waiting for a lapse of time based on the first analog signal when the second signal change occurs in the rectangular wave input signal, and wherein, upon determining by the determination circuit that the output control circuit is in the sink state, the output control circuit performs the first sink transition operation and then starts the second sink transition operation after waiting for a lapse of time based on the second analog signal when the first signal change occurs in the rectangular wave input signal.

In some embodiments, the first analog signal acquisition circuit includes a first capacitor configured to acquire the first analog signal, changes a terminal voltage of the first capacitor from a first initial voltage by flowing a first constant current to the first capacitor from the supply start time of the current by the first ON current supply circuit to the time when the output voltage reaches the predetermined first comparison voltage, and holds the change as the first analog signal, upon determining by the determination circuit that the output control circuit is in the source state, the output control circuit performs the first source transition operation and then starts the second source transition operation in response to the terminal voltage of the first capacitor returning to the first initial voltage by flowing a second constant current in a reverse direction to the first constant current to the first capacitor from the time when the second signal change occurs in the rectangular wave input signal, the second analog signal acquisition circuit includes a second capacitor configured to acquire the second analog signal, changes a terminal voltage of the second capacitor from a second initial voltage by flowing a third constant current to the second capacitor from the supply start time of the current by the second ON current supply circuit to the time when the output voltage falls below the predetermined second comparison voltage, and holds the change as the second analog signal, and upon determining by the determination circuit that the output control circuit is in the sink state, the output control circuit performs the first sink transition operation and then starts the second sink transition operation in response to the terminal voltage of the second capacitor returning to the second initial voltage by flowing a fourth constant current in a reverse direction to the third constant current to the second capacitor from the time when the first signal change occurs in the rectangular wave input signal.

According to another embodiment of the present disclosure, there is provided a semiconductor device forming the first, second and third bridge output circuits, wherein the bridge output circuit is formed using an integrated circuit.

According to another embodiment of the present disclosure, there is provided a motor driver device including an SPM driver configured to drive a spindle motor configured to rotate a magnetic disk of a magnetic disk device, wherein the third bridge output circuit is installed for each of coils of a plurality of phases forming the spindle motor, and the spindle motor functions as the load.

According to another embodiment of the present disclosure, there is provided a semiconductor device forming the motor driver device, wherein the motor driver device is formed using an integrated circuit.

BRIEF DESCRIPTION OF DRAWINGS

FIG. 2 is an explanatory view for explaining the functions of sensors shown in FIG. 1.

FIG. 3 is a view showing a relationship between an input signal and an output voltage in the bridge output circuit of FIG. 1.

FIG. 8A to FIG. 8C are operation explanatory views of each block in the sample/hold circuit according to the first embodiment of the present disclosure.

FIG. 9 is a view showing various voltage waveforms and signal state transitions focusing on the sample/hold circuit according to the first embodiment of the present disclosure.

FIG. 10 is an explanatory view of an output duty related to an input signal and an output voltage.

FIG. 12 is a view showing various voltage waveforms and signal state transitions when the output voltage decreases in a sink state according to a second embodiment of the present disclosure.

FIG. 15A to FIG. 15C are operation explanatory views of each block in the sample/hold circuit according to the second embodiment of the present disclosure.

DETAILED DESCRIPTION

Figure 1:
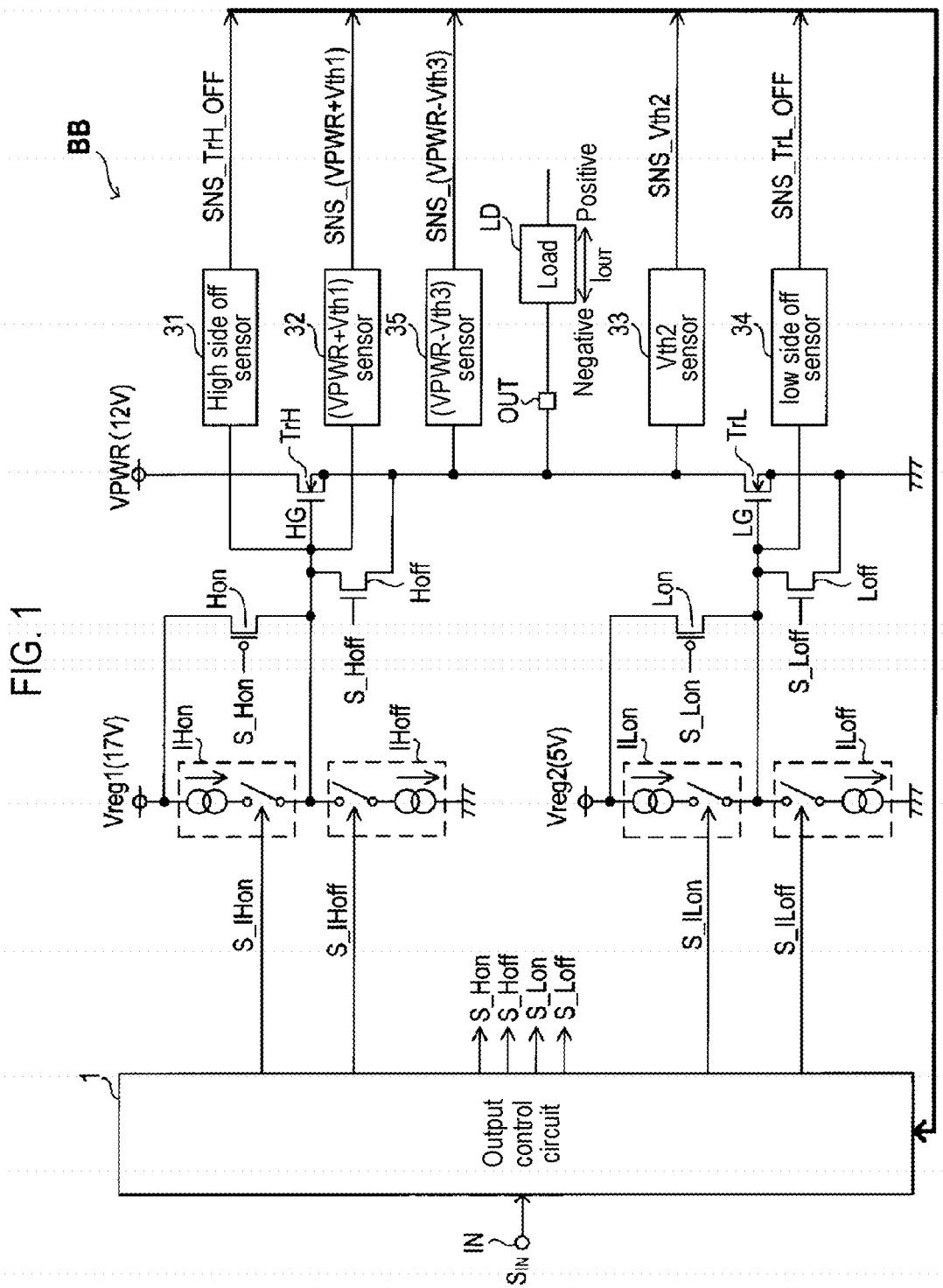
FIG. 1 is a configuration view of a bridge output circuit according to an embodiment of the present disclosure.

Embodiments of the present disclosure will be now described in detail with reference to the drawings. Like or equivalent components, members, and processes illustrated in each drawing are given like reference numerals and a repeated description thereof will be properly omitted. Further, in the present disclosure, in order to simplify the description, names of information, signals, physical quantities, members, etc. corresponding to the symbols or marks are omitted or abbreviated by using symbols or marks referring to information, signals, physical quantities, members, etc. For example, a high side transistor referred to by "TrH" to be described later may be described as a high side transistor TrH or abbreviated as a transistor TrH, but both refer to the same thing.

FIG. 1 is a configuration view of a bridge output circuit BB according to an embodiment of the present disclosure. The bridge output circuit BB includes a high side transistor TrH and a low side transistor TrL which are voltage control type transistors, transistors Hon and Hoff and constant current circuits IHon and IHoff provided for the high side transistor TrH, transistors Lon and Loff and constant current circuits ILon and ILoff provided for the low side transistor TrL, an input terminal IN and an output terminal OUT, an output control circuit 1, a high side off sensor 31, a (VPWR+Vth1) sensor 32, a Vth2 sensor 33, a low side off sensor 34, and a (VPWR−Vth3) sensor 35. LD denotes a load connected to the bridge output circuit BB. A rectangular wave signal $S_{IN}$ is supplied from the outside of the bridge output circuit BB to the input terminal IN, and a rectangular waveform switching voltage corresponding to the input signal $S_{IN}$ is applied to the output terminal OUT as an output voltage $V_{OUT}$ (i.e. the output voltage $V_{OUT}$ is supplied to the load LD).

Prior to description on the configuration of the bridge output circuit BB, some terms will be described. In the present embodiment, a level refers to a potential level, and a high level of any signal or voltage has a potential higher than a low level thereof. A ground refers to a conductive portion having a reference potential of 0V (zero volt) or refers to the reference potential itself. In the present embodiment, a voltage shown without providing any reference refers to a potential seen from the ground.

For any transistor configured as a field effect transistor (FET), including the transistors TrH and TrL, an ON state refers to a state where a conductive state is set between a drain and a source of the transistor, and an OFF state refers to a state where a non-conductive state (cut-off state) is set between the drain and the source of the transistor. However, as a matter of course, even when the ON state of the transistor TrH is referred to as a conductive state, a drain-source resistance changes according to a gate-source voltage (the same applies to the transistor TrL, etc.). For any transistor configured as a FET, including the transistors TrH and TrL, the gate-source voltage is the potential of the gate seen from the potential of the source, and the drain-source resistance refers to a resistance between the drain and the source. The gate-source voltage may be represented by a symbol "$V_{GS}$" and may be expressed as a gate-source voltage $V_{GS}$ or a voltage $V_{GS}$. Any switch to be described later is constituted with one or more field effect transistors (FETs). When a switch is in an ON state, both terminals of the switch are conductive, while when a switch is in an OFF state, both terminals of the switch are non-conductive. The ON state and the OFF state may be expressed simply as ON and OFF, respectively.

The configuration of FIG. 1 will be described below. Each of the transistors TrH and TrL is configured as an N-channel MOSFET (Metal Oxide Semiconductor Field Effect Transistor), and a half bridge circuit is formed by connecting the transistors TrH and TrL in series. Specifically, the drain of the transistor TrH is connected to a first power supply terminal, to which a power supply voltage VPWR is applied, to receive the power supply voltage VPWR, and the source of the transistor TrH and the drain of the transistor TrL are connected in common at a node ND. The node ND is connected to the output terminal OUT. The power supply voltage VPWR is a predetermined positive DC voltage, which is 12V here. "V" in voltage means volt. The source of the transistor TrL is connected to the ground serving as a second power supply terminal. The gate voltage of the transistor TrH is denoted by HG, and the gate voltage of the transistor TrL is denoted by LG.

The output terminal OUT is connected to one end of the load LD, and the other end of the load LD is connected to another circuit (not shown) or the ground. The output terminal OUT is interposed between the node ND and the load LD. A current supplied to the load LD via the output terminal OUT is denoted by $I_{OUT}$. The current $I_{OUT}$ may flow from the node ND toward the load LD via the output terminal OUT or may flow from the load LD toward the node ND via the output terminal OUT. Here, the polarity of the current $I_{OUT}$ directed from the node ND toward the load LD via the output terminal OUT is positive, and the polarity of the current $I_{OUT}$ directed from the load LD toward the node ND via the output terminal OUT is negative.

The transistors Hon and Lon are configured as P-channel MOSFETs, and the transistors Hoff and Loff are configured as N-channel MOSFETs. The transistors Hon, Hoff, Lon and Loff are individually on/off-controlled by controlling their respective gate voltages by the output control circuit 1. Signals S_Hon, S_Hoff, S_Lon and S_Loff, which are signals for controlling the gate voltages of the transistors Hon, Hoff, Lon and Loff, are respectively supplied from the output control circuit 1 to the gates of the transistors Hon, Hoff, Lon and Loff. The drains of the transistors Hon and Hoff are connected in common to the gate of the transistor TrH, and the source of the transistor Hoff is connected in common to the source of the transistor TrH. A power supply voltage Vreg1 is applied to the source of the transistor Hon. The power supply voltage Vreg1 is a predetermined positive DC voltage higher than the power supply voltage VPWR. Here, the power supply voltage Vreg1 is 17V. The drains of the transistors Lon and Loff are connected in common to the gate of the transistor TrL, and the source of the transistor Loff is connected in common to the source of the transistor TrL. A power supply voltage Vreg2 is applied to the source of the transistor Lon. The power supply voltage Vreg2 is a predetermined positive DC voltage, which is 5V here.

The constant current circuits IHon and IHoff are constant current circuits with a switch function to be driven based on the power supply voltage Vreg1. In detail, the constant current circuit IHon takes either the ON state or the OFF state according to the control signal S_IHon from the output control circuit 1 and supplies a predetermined constant current toward the gate of the transistor TrH only in the ON state. The constant current is not supplied to the gate of the transistor TrH in the OFF state, which is equivalent to a state in which the constant current circuit IHon and the transistor TrH are electrically isolated from each other. However, the increase of the gate potential of the transistor TrH due to the ON state of the constant current circuit IHon is limited to the power supply voltage Vreg1. The constant current circuit IHoff takes either the ON state or the OFF state according to the control signal S_IHoff from the output control circuit 1 and operates so as to draw a predetermined constant current from the gate of the transistor TrH only in the ON state. In the OFF state, the constant current does not flow between the gate of the transistor TrH and the constant current circuit Ihoff, which is equivalent to a state in which the constant current circuit IHoff and the transistor TrH are electrically isolated from each other. However, the decrease of the gate potential of the transistor TrH due to the ON state of the constant current circuit IHoff is limited to the potential of the ground.

The constant current circuits ILon and ILoff are constant current circuits with a switch function to be driven based on the power supply voltage Vreg2. In detail, the constant current circuit ILon takes either the ON state or the OFF state according to the control signal S_ILon from the output control circuit 1, and supplies a predetermined constant current toward the gate of the transistor TrL only in the ON state. The constant current is not supplied to the gate of the transistor TrL in the OFF state, which is equivalent to a state in which the constant current circuit ILon and the transistor TrL are electrically isolated from each other. However, the increase of the gate potential of the transistor TrL due to the ON state of the constant current circuit ILon is limited to the power supply voltage Vreg2. The constant current circuit ILoff takes either the ON state or the OFF state according to the control signal S_ILoff from the output control circuit 1 and operates so as to draw a predetermined constant current from the gate of the transistor TrL only in the ON state. In the OFF state, the constant current does not flow between the gate of the transistor TrL and the constant current circuit ILoff, which is equivalent to a state in which the constant current circuit ILoff and the transistor TrL are electrically isolated from each other. However, the decrease of the gate potential of the transistor TrL due to the ON state of the constant current circuit ILoff is limited to the potential of the ground.

FIG. 2 is a functional explanatory view of the sensors 31 to 35. An output signal of each of the sensors 31 to 35 is a binary signal having a value of "1" or "0."

The high side off sensor 31 detects whether or not the transistor TrH is in the OFF state, based on a gate voltage HG (specifically, based on the gate-source voltage $V_{GS}$ of the transistor TrH). Specifically, the sensor 31 compares the gate-source voltage $V_{GS}$ of the transistor TrH with a predetermined gate threshold voltage $V_{THH}$ (gate cutoff voltage) according to the characteristics of the transistor TrH, and outputs a signal SNS_TrH_OFF according to the comparison result ($V_{THH}$>0). The transistor TrH is turned off when the voltage $V_{GS}$ of the transistor TrH is lower than the gate threshold voltage $V_{THH}$, and the transistor TrH is turned on when the voltage $V_{GS}$ of the transistor TrH is equal to or higher than the gate threshold voltage $V_{THH}$. Therefore, when the voltage $V_{GS}$ of the transistor TrH is lower than the gate threshold voltage $V_{THH}$, the sensor 31 outputs the signal SNS_TrH_OFF of "1" as a signal indicating that the transistor TrH is in the OFF state. On the other hand, when the voltage $V_{GS}$ of the transistor TrH is equal to or higher than the gate threshold voltage $V_{THH}$, the sensor 31 outputs the signal SNS_TrH_OFF of "0" as a signal indicating that the transistor TrH is not in the OFF state (in other words, a signal indicating that the transistor TrH is in the ON state).

The (VPWR+Vth1) sensor 32 compares the gate voltage of the transistor TrH with a voltage (VPWR+Vth1) higher by a predetermined voltage Vth1 than the power supply voltage VPWR, and outputs a signal SNS_(VPWR+Vth1) according to the comparison result (Vth1>0). Here, it is assumed that the predetermined voltage Vth1 is equal to the gate threshold voltage $V_{THH}$ of the transistor TrH. The sensor 32 outputs the signal SNS_(VPWR+Vth1) of "1" when the gate voltage of the transistor TrH exceeds the voltage (VPWR+Vth1), and outputs the signal SNS_(VPWR+Vth1) of "0" when the gate voltage of the transistor TrH is lower than the voltage (VPWR+Vth1). When the gate voltage of the transistor TrH is equal to the voltage (VPWR+Vth1), the signal SNS_(VPWR+Vth1) is "1" here although it may be either "1" or "0."

The Vth2 sensor 33 compares the output voltage $V_{OUT}$ applied to the output terminal OUT with a predetermined voltage Vth2 and outputs a signal SNS_Vth2 according to the comparison result (Vth2>0). The sensor 33 outputs the signal SNS_Vth2 of "1" when the output voltage $V_{OUT}$ exceeds the voltage Vth2, and outputs the signal SNS_Vth2 of "0" when the output voltage $V_{OUT}$ is lower than the voltage Vth2. When the output voltage $V_{OUT}$ is equal to the voltage Vth2, the signal SNS_Vth2 is "1" here although it may be either "1" or "0." The voltage Vth2 is a positive voltage of, e.g., 0.5V which is much lower than the power supply voltage VPWR (here, 12V). The voltage Vth2 is lower than at least half the power supply voltage VPWR.

The low side off sensor 34 detects whether or not the transistor TrL is in the OFF state, based on a gate voltage LG (specifically, based on the gate-source voltage $V_{GS}$ of the transistor TrL). Specifically, the sensor 34 compares the gate-source voltage $V_{GS}$ of the transistor TrL with a predetermined gate threshold voltage $V_{THL}$ (gate cutoff voltage) according to the characteristics of the transistor TrL, and outputs a signal SNS_TrL_OFF according to the comparison result ($V_{THL}$>0). The transistor TrH is turned off when the voltage $V_{GS}$ of the transistor TrL is lower than the gate threshold voltage $V_{THL}$, and the transistor TrL is turned on when the voltage $V_{GS}$ of the transistor TrL is equal to or higher than the gate threshold voltage $V_{THL}$. Therefore, when the voltage $V_{GS}$ of the transistor TrL is lower than the gate threshold voltage $V_{THL}$, the sensor 34 outputs the signal SNS_TrL_OFF of "1" as a signal indicating that the transistor TrL is in the OFF state. On the other hand, when the voltage $V_{GS}$ of the transistor TrL is equal to or higher than the gate threshold voltage $V_{THL}$, the sensor 34 outputs the signal SNS_TrH_OFF of "0" as a signal indicating that the transistor TrL is not in the OFF state (in other words, a signal indicating that the transistor TrL is in the ON state).

The (VPWR−Vth3) sensor 35 compares the output voltage $V_{OUT}$ applied to the output terminal OUT with a positive voltage (VPWR−Vth3) lower by a predetermined voltage Vth3 than the power supply voltage VPWR and outputs a signal SNS_(VPWR−Vth3) according to the comparison result (Vth3>0). The sensor 35 outputs the signal SNS_(VPWR−Vth3) of "1" when the output voltage $V_{OUT}$ exceeds the voltage (VPWR−Vth3), and outputs the signal SNS_(VPWR−Vth3) of "0" when the output voltage $V_{OUT}$ is lower than the voltage (VPWR−Vth3). When the output voltage $V_{OUT}$ is equal to the voltage (VPWR−Vth3), the signal SNS_(VPWR−Vth3) is "1" here although it may be either "1" or "0." The voltage Vth3 is a positive voltage of, e.g., 0.5V which is much lower than the power supply voltage VPWR (here, 12V). The voltage Vth3 is lower than at least half the power supply voltage VPWR, and the relationship of "VPWR>VPWR−Vth3>Vth2>0" is established.

The output control circuit 1 performs the on/off control for the transistors TrH and TrL by generating and outputting the signals S_Hon, S_Hoff, S_Lon, S_Loff, S_IHon, S_IHoff, S_ILon and S_Iloff based on the input signal $S_{IN}$, and the signals SNS_TrH_OFF, the signal SNS_(VPWR+Vth1), the signal SNS_Vth2, the signal SNS_TrL_OFF and the signal SNS_(VPWR−Vth3) from the sensors 31 to 35.

As shown in FIG. 3, the input signal $S_{IN}$ is a rectangular wave signal alternating between a low level and a high level, and the output voltage $V_{OUT}$ becomes a rectangular wave voltage alternating between a low level and a high level according to the level of the input signal $S_{IN}$. However, in detail, in the bridge output circuit BB, slew rate control is performed to gradually raise and lower the output voltage $V_{OUT}$. It is known that when the output voltage $V_{OUT}$ is changed abruptly, a high frequency component in the abrupt voltage change increases the overall noise of a device (for example, an HDD device to be described later) including the bridge output circuit BB. The slew rate control is required to contribute to the reduction of such noise.

Figure 4:
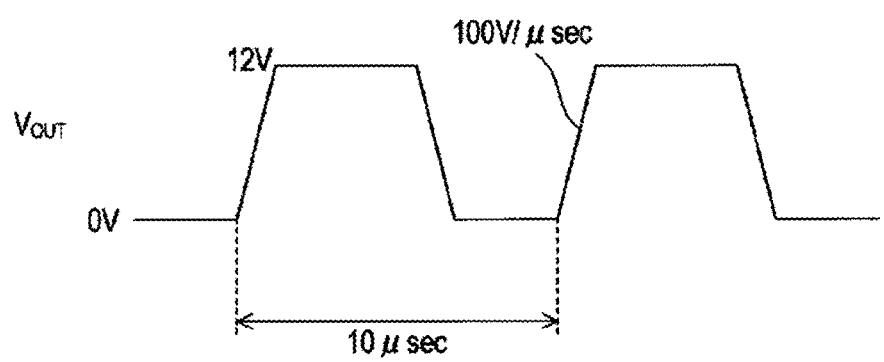
FIG. 4 is a waveform diagram of an output voltage to which slew rate control is applied.

FIG. 4 shows a waveform example of the output voltage $V_{OUT}$ when a pulse width modulation signal (PWM signal) having a PWM frequency of 100 kHz (kilohertz) is supplied to the output control circuit 1 as the input signal $S_{IN}$. In the example of FIG. 4, the slew rate of a change in the output voltage $V_{OUT}$ is 100V/μsec (volt/microsecond).

Figure 14:
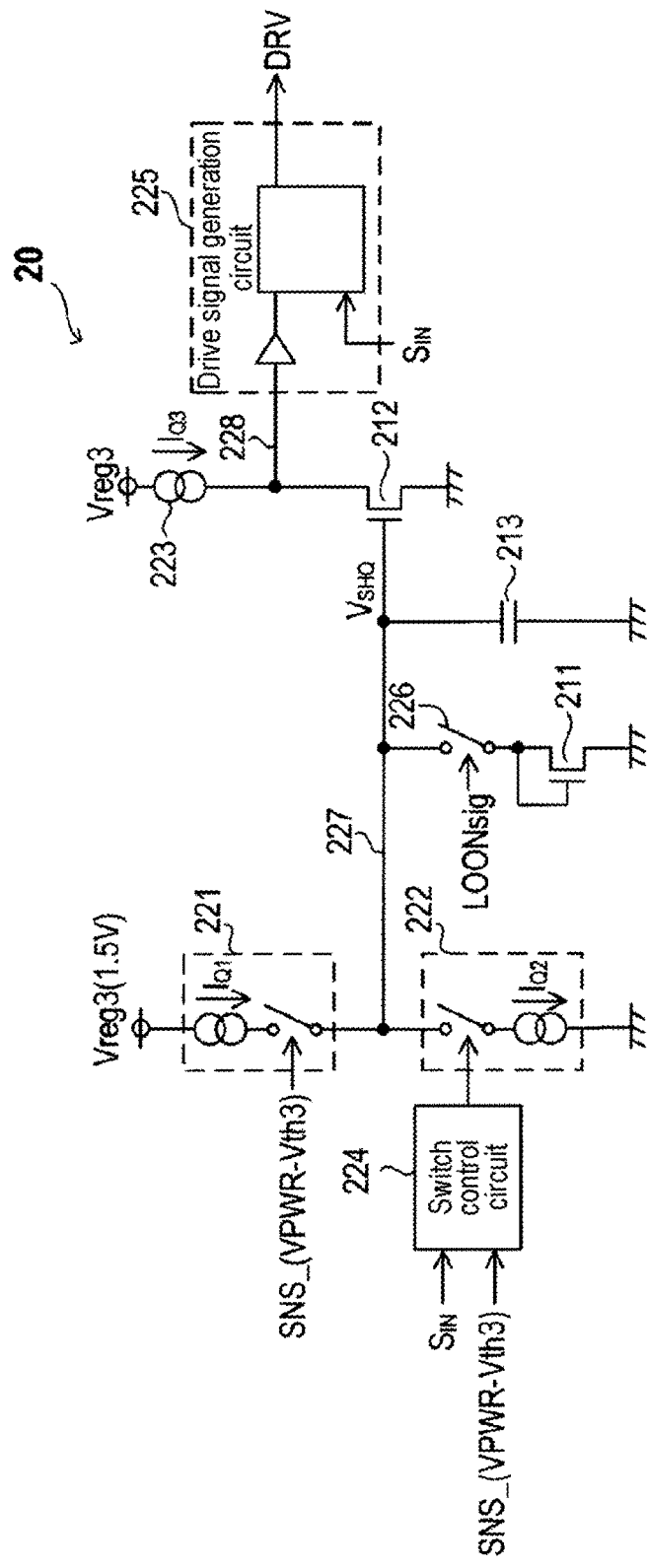
FIG. 14 is a configuration view of a sample/hold circuit according to the second embodiment of the present disclosure.

In the following, for the purpose of simplification of description, the expressions "turn on" and "turn off" are used for not only transistors but also constant current circuits with a switch function (including the above-described constant current circuits IHon, IHoff, ILon and ILoff, and constant current circuits 121, 122, 221 and 222 in FIG. 7 and FIG. 14 to be described below). That is, for the transistors, "turn-on" refers to switching of the transistors from the OFF state to the ON state, and "turn off" refers to switching of the transistors from the ON state to the OFF state. Similarly, for the constant current circuits with a switch function, "turn-on" refers to switching of the constant current circuits from the OFF state to the ON state, and "turn-off" refers to switching of the constant current circuits from the ON state to the OFF state.

Detailed configurations, operations, applications and modifications of the bridge output circuit BB based on the above-described contents will be described by way of the following first to fifth embodiments. Unless particularly mentioned and inconsistent, the above-mentioned matters in the present embodiment is applied to the first to fifth embodiments to be described below, and the descriptions in the first to fifth embodiments are given priority over matters that are inconsistent with the above-described contents in the present embodiment. Further, unless inconsistent, the matters described in any of the first to fifth embodiments to be described below may be applied to any other embodiments (that is, two or more of the first to fifth embodiments may be combined).

First Embodiment

The first embodiment will be described. A state in which the current $I_{OUT}$ flows from the node ND toward the load LD via the output terminal OUT is referred to as a source state. In the source state, the polarity of the current $I_{OUT}$ is positive (see FIG. 1). In the first embodiment, based on a premise that the bridge output circuit BB is in the source state, the operation and configuration of the bridge output circuit BB related to the source state will be described.

Figure 5:
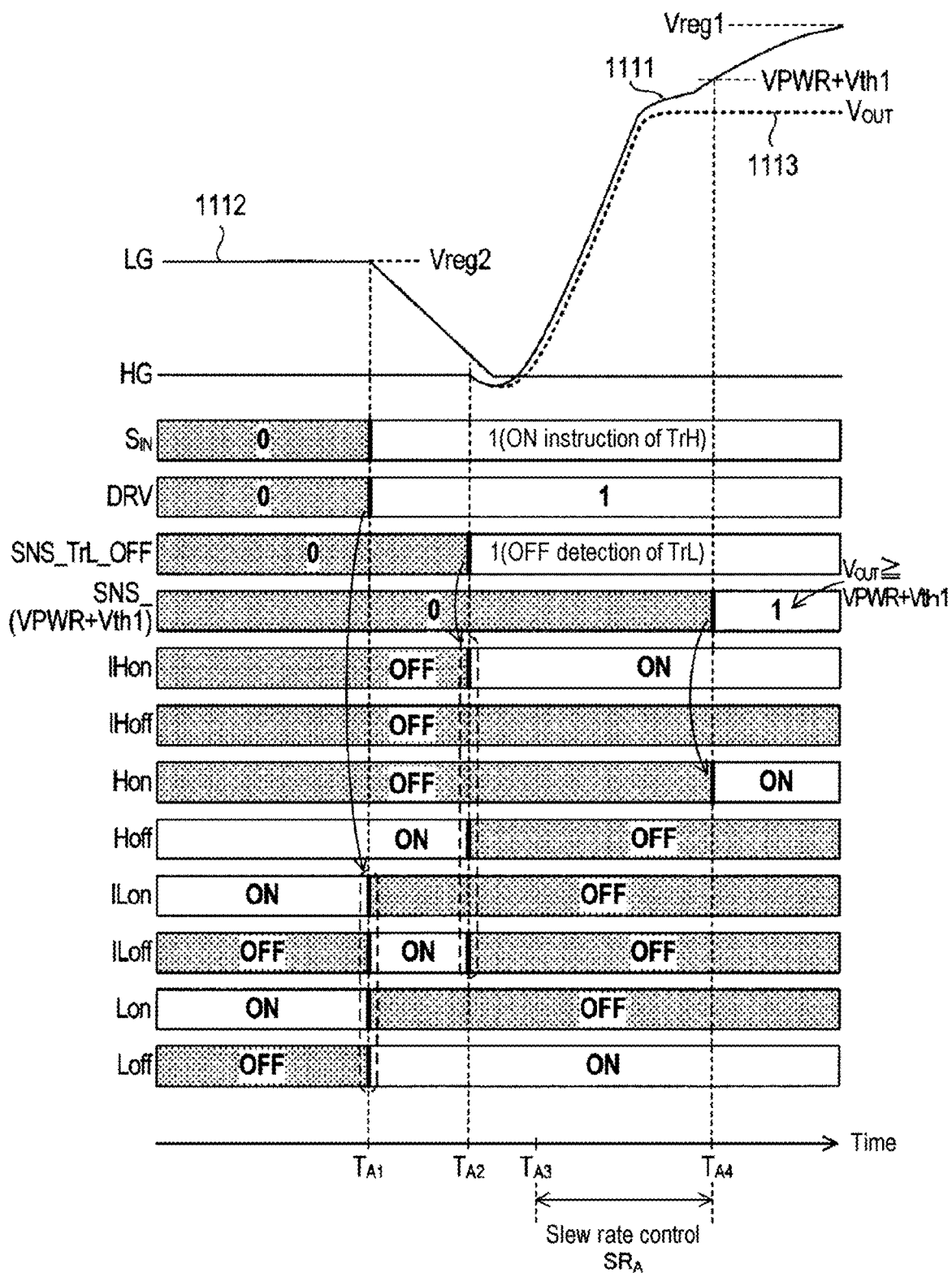
FIG. 5 is a view showing various voltage waveforms and signal state transitions when the output voltage increases in a source state according to a first embodiment of the present disclosure.

FIG. 5 shows the waveforms of the gate voltages HG and LG and the output voltage $V_{OUT}$ when the input signal $S_{IN}$ switches from "0" to "1," along with the states of several signals. A drive signal DRV based on the input signal $S_{IN}$ is generated in the output control circuit 1 (how the signal is generated will be described later). The input signal $S_{IN}$ and the drive signal DRV are binary signals, each of which has a value of "1" or "0." The input signal $S_{IN}$ and the drive signal DRV take a high level or low level potential. In the input signal $S_{IN}$ and the drive signal DRV, the high level has a value of "1" and the low level has a value of "0." The input signal $S_{IN}$ of "1" functions as a signal indicating that the transistor TrH should be turned on and the transistor TrL should be turned off, and the input signal $S_{IN}$ of "0" functions as a signal indicating that the transistor TrH should be turned off and the transistor TrL should be turned on.

In FIG. 5, solid line waveforms 1111 and 1112 represent waveforms of the gate voltages HG and LG, respectively, and a broken line waveform 1113 represents a waveform of the output voltage $V_{OUT}$. As time progresses, times $T_{A1}$, $T_{A2}$, $T_{A3}$ and $T_{A4}$ come in this order. In FIG. 5, the waveforms 1111 and 1113 overlap with each other up to around time $T_{A3}$ (in fact, they are slightly different, but the difference is not shown for the purpose of avoiding complication of the figure).

Immediately before the time $T_{A1}$, the signals $S_{IN}$ and DRV are both "0," the gate voltage LG has a high level (Vreg2; 5V) to put the transistor TrL in the ON state, the gate voltage HG has a low level (0V) to put the transistor TrH in the OFF state, and the output voltage $V_{OUT}$ is substantially 0V. Further, immediately before the time $T_{A1}$, the signals SNS_TrL_OFF and SNS_(VPWR+Vth1) are "0," the constant current circuits IHon, IHoff, ILon and ILoff are in the OFF state, OFF state, ON state and OFF state, respectively, and the transistors Hon, Hoff, Lon and Loff are in the OFF state, ON state, ON state and OFF state, respectively.

At time $T_{A1}$, the input signal $S_{IN}$ changes from "0" to "1." In response to this change, at time $T_{A1}$, the drive signal DRV also changes from "0" to "1." At time $T_{A1}$, the output control circuit 1 turns off the constant current circuit ILon with switch function and the transistor Lon in response to the transition of the drive signal DRV from "0" to "1," and turns on the constant current circuit ILoff with switch function and the transistor Loff. Then, from time $T_{A1}$, the stored charges of the gate-source capacitance of the transistor TrL are discharged through the constant current circuit ILoff and the transistor Loff, and the gate voltage LG decreases.

Then, when the gate voltage LG falls below the gate threshold voltage $V_{THL}$ at time $T_{A2}$, the signal SNS_TrL_OFF changes from "0" to "1." At time $T_{A2}$, in response to the transition of the signal SNS_TrL_OFF from "0" to "1," the output control circuit 1 turns on the constant current circuit IHon with switch function while turning off the transistor Hoff and the constant current circuit ILoff with switch function. Then, from time $T_{A2}$, the gate-source capacitance of the transistor TrH is charged with a current from the constant current circuit IHon. By this charging, the transistor TrH is gradually turned on.

However, until time $T_{A3}$ (or until around time $T_{A3}$), since the transistor TrH is still in the OFF state and the drain-source resistance of the transistor TrH is relatively large, the output voltage $V_{OUT}$ temporarily falls below 0V. The load LD according to the first embodiment may be a constant current load that draws a constant current as the output current $I_{OUT}$ (here, so considered). In this case, during a period in which both the transistors TrH and TrL are in the OFF state (a period between time $T_{A2}$ and time $T_{A3}$), since the current $I_{OUT}$ flows from the ground toward the load LD via a parasitic diode of the transistor TrL, the voltage $V_{OUT}$ becomes lower by a voltage drop of the parasitic diode than 0V.

From around time $T_{A3}$, the gate voltage HG gradually rises from about 0V to the power supply voltage Vreg1 and the output voltage $V_{OUT}$ gradually rises from around 0V to the power supply voltage VPWR. That is, slew rate control $SR_A$ is executed in a period from time $T_{A3}$ to time $T_{A4}$ to be described later.

In the execution period of the slew rate control $SR_A$, when a constant current is supplied from the constant current circuit IHon toward the gate of the transistor TrH, the gate voltage HG of the transistor TrH gradually increases, and the drain-source resistance of the transistor TrH gradually decreases with the increase of the gate voltage HG. As a result, the output voltage $V_{OUT}$ gradually increases. In the period between time $T_{A2}$ and time $T_{A4}$, including the execution period of the slew rate control $SR_A$, only the constant current circuit IHon of the constant current circuits IHon, IHoff, ILon and ILoff is in the ON state, and only the transistor Loff of the transistors Hon, Hoff, Lon and Loff is in the ON state.

The gate voltage HG rising through the execution of the slew rate control $SR_A$ reaches the voltage (VPWR+Vth1) at time $T_{A4}$, and the signal SNS_(VPWR+Vth1) changes from "1" to "0." At time $T_{A4}$, the output control circuit 1 turns on the transistor Hon in response to the transition of the signal SNS_(VPWR+Vth1) from "0" to "1." Then, from time $T_{A4}$, the gate voltage HG promptly rises toward the power supply voltage Vreg1.

Immediately after time $T_{A4}$, the transistor TrH is in the ON state, the transistor TrL is in the OFF state, the constant current circuits IHon, IHoff, ILon and ILoff are in the ON state, OFF state, OFF state and OFF state, respectively, and the transistors Hon, Hoff, Lon and Loff are in the ON state, OFF state, OFF state and ON state, respectively. Immediately after time $T_{A4}$, these states are maintained until the drive signal DRV changes from "1" to "0" next time.

Figure 6:
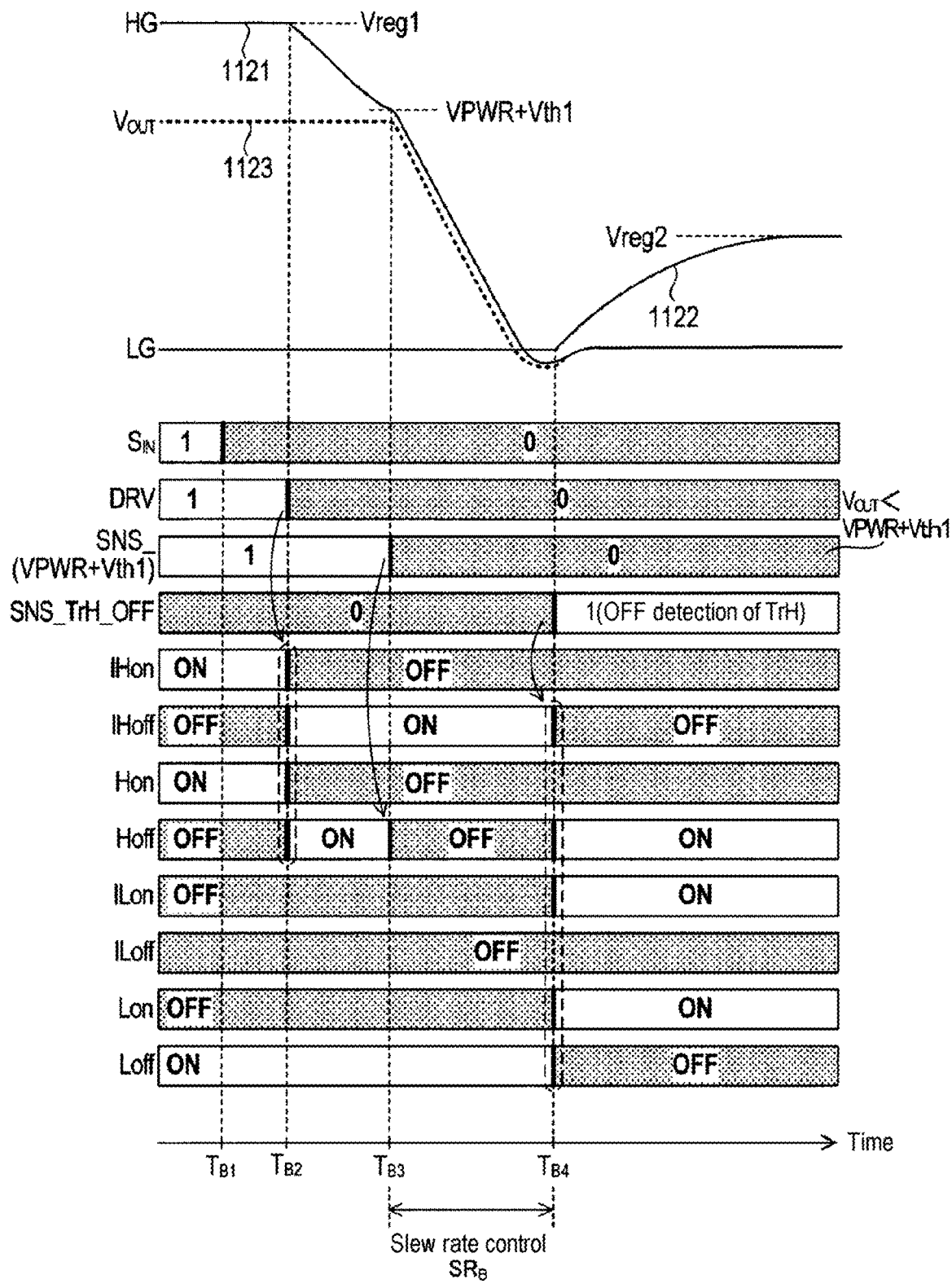
FIG. 6 is a view showing various voltage waveforms and signal state transitions when the output voltage decreases in the source state according to the first embodiment of the present disclosure.

FIG. 6 shows the waveforms of the gate voltages HG and LG and the output voltage $V_{OUT}$ when the input signal $S_{IN}$ switches from "1" to "0," along with the states of several signals. In FIG. 6, solid line waveforms 1121 and 1122 represent waveforms of the gate voltages HG and LG, respectively, and a broken line waveform 1123 represents a waveform of the output voltage $V_{OUT}$. As time progresses, times $T_{B1}$, $T_{B2}$, $T_{B3}$ and $T_{B4}$ come in this order. In FIG. 6, the waveforms 1121 and 1123 overlap with each other in the later part around the time $T_{B4}$ (in fact, they are slightly different, but the difference is not shown for the purpose of avoiding complication of the figure). Here, consider that time $T_{B1}$ corresponds to a time at which, after the input signal $S_{IN}$ changes from "0" to "1" at time $T_{A1}$ of FIG. 5, the input signal $S_{IN}$ changes from "1" to "0" after time $T_{A4}$. The significance of time $T_{B2}$ will be clear from the description with reference to FIG. 9 to be described later.

Immediately before time $T_{B1}$, the signals $S_{IN}$ and DRV are both "1," the gate voltage HG has a high level (Vreg1; 17V) to put the transistor TrH in the ON state, the gate voltage LG has a low level (0V) to put the transistor TrL in the OFF state, and the output voltage $V_{OUT}$ is substantially equal to the power supply voltage VPWR (12V). Further, immediately before time $T_{B1}$, the constant current circuits IHon, IHoff, ILon and ILoff are in the ON state, OFF state, OFF state and OFF state, respectively, and the transistors Hon, Hoff, Lon and Loff are in the ON state, OFF state, OFF state and ON state, respectively.

The input signal $S_{IN}$ changes from "1" to "0" at time $T_{B1}$, and the drive signal DRV changes from "1" to "0" at time $T_{B2}$ after some degree of time elapses from this change (how the drive signal DRV is generated will be described later). At time $T_{B2}$, in response to the transition of the drive signal DRV from "1" to "0," the output control circuit 1 turns off the constant current circuit IHon with switch function and the transistor Hon and turns off the constant current circuit IHoff with switch function and the transistor Hoff. Then, from time $T_{B2}$, the stored charges of the gate-source capacitance of the transistor TrH are discharged through the constant current circuit IHoff and the transistor Hoff, and the gate voltage HG decreases.

Then, when the gate voltage HG falls below a predetermined voltage (VPWR+Vth1) at time $T_{B3}$, the signal SNS_(VPWR+Vth1) changes from "1" to "0." At time $T_{B3}$, in response to the transition of the signal SNS_(VPWR+Vth1) from "1" to "0," the output control circuit 1 turns off the transistor Hoff. Then, from time $T_{B3}$, the stored charges of the gate-source capacitance of the transistor TrH are discharged with a constant current by the constant current circuit IHoff, and accordingly, the gate voltage HG gradually decreases toward 0V. Then, the drain-source resistance of the transistor TrH gradually increases with the decrease of the gate voltage HG. As a result, the output voltage $V_{OUT}$ gradually decreases. That is, slew rate control $SR_B$ in which the output voltage $V_{OUT}$ gradually decreases is executed in a period from time $T_{B3}$ to time $T_{B4}$ to be described later. In the execution period of the slew rate control $SR_B$, only the constant current circuit IHoff of the constant current circuits IHon, IHoff, ILon and ILoff is in the ON state, and only the transistor Loff of the transistors Hon, Hoff, Lon and Loff is in the ON state.

When the gate-source voltage $V_{GS}$ of the transistor TrH falls below the predetermined gate threshold voltage $V_{THH}$ at time $T_{B4}$ through the execution of the slew rate control $SR_B$, the signal SNS_TrH_OFF changes from "0" to "1." At time $T_{B4}$, in response to the transition of the signal SNS_TrH_OFF from "0" to "1," the output control circuit 1 turns off the constant current circuit IHoff with switch function, turns on the transistor Hoff, turns on the constant current circuit ILon with switch function, turns on the transistor Lon, and turns off the transistor Loff. Then, from time $T_{B4}$, the gate voltage LG promptly rises toward the power supply voltage Vreg2, and the transistor TrL goes to the ON state.

Immediately after time $T_{B4}$, the constant current circuits IHon, IHoff, ILon and ILoff are in the OFF state, OFF state, ON state and OFF state, respectively, and the transistors Hon, Hoff, Lon and Loff are in the OFF state, ON state, ON state and OFF state, respectively. Immediately after time $T_{B4}$, these states are maintained until the drive signal DRV changes from "0" to "1" next time. After time $T_{B4}$, after the gate voltage LG becomes equal to or higher than the gate threshold voltage $V_{THL}$, the transistor TrH is in the OFF state and the transistor TrL is in the ON state.

A circuit for determining time $T_{B2}$ will be described with reference to FIG. 7. FIG. 7 is a configuration view of a sample/hold circuit 10 provided in the output control circuit 1. The sample/hold circuit 10 includes transistors 111 and 112 configured as N-channel MOSFETs, a S/H capacitor 113, constant current circuits 121 and 122, a constant current circuit 123, a switch control circuit 124, a drive signal generation circuit 125, a switch 126 and a gate line 127. The gate line 127 is a wiring connected to the gate of the transistor 112.

The drain and gate of the transistor 111 are connected in common to one end of the switch 126, and the other end of the switch 126 is connected to the gate line 127. The source of the transistor 111 is connected to the ground. One end of the S/H capacitor 113 is connected to the gate line 127, and the other end of the S/H capacitor 113 is connected to the ground. The drain of the transistor 112 is connected to the constant current circuit 123, and the source of the transistor 112 is connected to the ground.

The constant current circuits 121 and 122 are constant current circuits with a switch function to be driven based on a power supply voltage Vreg3. The constant current circuit 121 functions as a constant current circuit for charging the capacitor 113, and the constant current circuit 122 functions as a constant current circuit for discharging the capacitor 113. The power supply voltage Vreg3 is a predetermined positive DC voltage, and is 1.5V here. In detail, the charging constant current circuit 121 takes either the ON state or the OFF state according to the signal SNS_Vth2, and supplies a predetermined constant current $I_{P1}$ toward the gate line 127 only in the ON state. The constant current $I_{P1}$ is not supplied to the gate line 127 in the OFF state, which is equivalent to a state in which the charging constant current circuit 121 and the gate line 127 are electrically isolated from each other. However, the rise of the potential of the gate line 127 due to the ON state of the charging constant current circuit 121 is limited to the power supply voltage Vreg3. The discharging constant current circuit 122 takes either the ON state or the OFF state under the control of the switch control circuit 124 and operates to draw a predetermined constant current $I_{P2}$ from the gate line 127 only in the ON state. The constant current $I_{P2}$ does not flow between the gate line 127 and the discharging constant current circuit 122 in the OFF state, which is equivalent to a state in which the discharging constant current circuit 122 and the gate line 127 are electrically isolated from each other. However, the decrease in the potential of the gate line 127 due to the ON state of the discharging constant current circuit 122 is limited to the potential of the ground.

The constant current circuit 123 supplies a predetermined constant current $I_{P3}$ toward the transistor 112 based on the power supply voltage Vreg3. However, the constant current $I_{P3}$ flows as the drain current of the transistor 112 only when the transistor 112 is in the ON state, and acts to raise the voltage of the drain of the transistor 112 to the power supply voltage Vreg3 when the transistor 112 is in the OFF state.

As a specific numerical example, the current values of the constant currents $I_{P1}$, $I_{P2}$ and $I_{P3}$ are 20 μA (microampere), and the capacitance value of the S/H capacitor 113 is 4 pF (picofarad). Although these values can be modified, the current values of the constant currents $I_{P1}$ and $I_{P2}$ are equal to each other. The current values of the constant current $I_{P3}$ may or may not be equal to those of the constant currents $I_{P1}$ and $I_{P2}$.

The transistors 111 and 112 are MOSFETs having the same structure, and the gate threshold voltages of the transistors 111 and 112 are equal to each other at the voltage $V_{TH}$. Therefore, when the gate-source voltage of the transistor 111 is equal to or higher than the voltage $V_{TH}$, the transistor 111 is turned on, while when the gate-source voltage of the transistor 111 is lower than the voltage $V_{TH}$, the transistor 111 is turned off. When the gate-source voltage of the transistor 112 is equal to or higher than the voltage $V_{TH}$, the transistor 112 is turned on, while when the gate-source voltage of the transistor 112 is lower than the voltage $V_{TH}$, the transistor 112 is turned off. A voltage of the gate line 127, which is equal to the gate-source voltage of the transistor 112, is denoted by $V_{SHP}$.

As shown in FIG. 8A, the charging constant current circuit 121 is turned on when the signal SNS_Vth2 is "0" (i.e., when "$V_{OUT}$<Vth2"), and is turned off when the signal SNS_Vth2 is "1" (i.e., when "$V_{OUT}$≥th2"). The switch control circuit 124 controls the state of the discharging constant current circuit 122 based on the signals $S_{IN}$ and SNS_Vth2. As shown in FIG. 8B, the switch control circuit 124 turns on the discharging constant current circuit 122 only when the signal $S_{IN}$ is "0" and the signal SNS_Vth2 is "1," and, otherwise, turns off the discharging constant current circuit 122.

The drive signal generation circuit 125 receives the signal $S_{IN}$ and a signal 128 indicating the voltage of the drain of the transistor 112, and generates and outputs a signal based on these signals as the drive signal DRV. The signal 128 has a low level when the transistor 112 is in the ON state, and has a high level when the transistor 112 is in the OFF state. Therefore, the drive signal generation circuit 125 can recognize the ON/OFF state of the transistor 112 based on the signal 128. Although the details will be described later with reference to FIG. 9, in the source state, the drive signal generation circuit 125 changes the drive signal DRV from "0" to "1" in synchronization with the change of the input signal $S_{IN}$ from "0" to "1," and, thereafter, changes the drive signal DRV from "1" to "0" in response to the transition of the transistor 112 from the ON state to the OFF state through the change of the input signal $S_{IN}$ from "1" to "0."

The switch 126 is in one of the ON state and the OFF state based on a signal HIONsig having a value of "1" or "0." As shown in FIG. 8C, the switch 126 is in the ON state when the signal HIONsig is "1," and is in the OFF state when the signal HIONsig is "0." The signal HIONsig is a signal generated in the output control circuit 1 based on the signal S_IHon for controlling the constant current circuit IHon. The signal HIONsig changes from "1" to "0" at a time when the constant current circuit IHon switches from the OFF state to the ON state (i.e., time $T_{A2}$; see FIG. 5 and FIG. 9 to be described later), and, thereafter, changes from "0" to "1" at a time when the constant current circuit IHon switches from the ON state to the OFF state (time $T_{B2}$; see FIG. 6) or at a time after the time when the constant current circuit IHon switches from the ON state to the OFF state (e.g., time $T_{B3}$ or $T_{B4}$; see FIG. 6).

When the switch 126 is in the OFF state, if the charging constant current circuit 121 is in the ON state and the discharging constant current circuit 122 is in the OFF state, the S/H capacitor 113 is charged by the constant current $I_{P1}$ and the voltage $V_{SHP}$ increases with the power supply voltage Vreg3 as the upper limit. If the charging constant current circuit 121 is in the OFF state and the discharging constant current circuit 122 is in the ON state, the stored charges of the S/H capacitor 113 are discharged by the constant current $I_{P2}$ and the voltage $V_{SHP}$ decreases with 0V as the lower limit.

The operation of generating the drive signal DRV using the sample/hold circuit 10 will be described with reference to FIG. 9. FIG. 9 is a timing chart of various signals and the states thereof. A schematic waveform of the output voltage $V_{OUT}$ is also shown in FIG. 9.

Immediately before time $T_{A1}$, the signals $S_{IN}$ and DRV are "0". Immediately before time $T_{A1}$, the signal HIONsig is "1", the switch 126 is in the ON state, the signal SNS_Vth2 is "0", the charging constant current circuit 121 is in the ON state, and the discharging constant current circuit 122 is in the OFF state by the work of the switch control circuit 124. Therefore, the voltage $V_{SHP}$ is equal to the gate threshold voltage $V_{TH}$ of the transistor 111 immediately before time $T_{A1}$. When the switch 126 is in the ON state, the transistor 112 is in an indeterminate state at the boundary between the ON state and the OFF state, but the drive control generation circuit 125 also maintains the drive signal DRV at "0" based on the input signal $S_{IN}$ of "0" before time $T_{A1}$.

At time $T_{A1}$, the input signal $S_{IN}$ changes from "0" to "1." When the input signal $S_{IN}$ changes from "0" to "1" regardless of the signal 128 (that is, regardless of the state of the transistor 112), the drive signal generation circuit 125 changes the drive signal DRV from "0" to "1" in synchronization with the change of the input signal $S_{IN}$. Therefore, the drive signal DRV changes from "0" to "1" at time $T_{A1}$.

The gate voltage LG decreases from time $T_{A1}$ (see FIG. 5). At time $T_{A2}$, the signal HIONSig changes from "1" to "0" in synchronization with the turning-on of the constant current circuit IHon with switch function. In response to the change, the switch 126 switches from the ON state to the OFF state. Thereafter, the output voltage $V_{OUT}$ increases, the signal SNS_Vth2 changes from "0" to "1" at time $T_{A3}$, and the charging constant current circuit 121 switches from the ON state to the OFF state in response to the change of the signal SNS_Vth2 from "0" to "1." Then, between time $T_{A2}$ and time $T_{A3}$, since the switch 126 is in the OFF state, the charging constant current circuit 121 is in the ON state and the discharging constant current circuit 122 is in the OFF state, the S/H capacitor 113 is charged by the constant current $I_{P1}$, the voltage $V_{SHP}$ increases, and the increase of the voltage $V_{SHP}$ stops at time $T_{A3}$. Thereafter, since both the switch 126 and the constant current circuits 121 and 122 are maintained in the OFF state until time $T_{B1}$, the value of the voltage $V_{SHP}$ at time $T_{A3}$ is maintained until time $T_{B1}$.

After time $T_{A2}$, the transistor 112 receives the voltage $V_{SHP}$ higher than the gate threshold voltage $V_{TH}$ at its gate and enters the stable ON state, and the ON state of the transistor 112 is maintained until time $T_{B2}$ as will be described later.

At time $T_{B1}$, the input signal $S_{IN}$ changes from "1" to "0." At time $T_{B1}$, since the signal SNS_Vth2 is "1," when the input signal $S_{IN}$ changes from "1" to "0," the discharging constant current circuit 122 switches from the OFF state to the ON state by receiving the input signal $S_{IN}$ of "0" and the signal SNS_Vth2 of "1." Further, at time $T_{B1}$, the switch 126 is in the OFF state since the signal HIONSig is "0," and the charging constant current circuit 121 is in the OFF state since the signal SNS_Vth2 is "1." Therefore, from time $T_{B1}$, the stored charges in the S/H capacitor 113 are discharged by the constant current $I_{P2}$, and the voltage $V_{SHP}$ decreases. This decrease continues until time 1141 when the signal SNS_Vth2 changes from "1" to "0" next time. In the example of FIG. 9, the signal HIONsig changes from "0" to "1" at time 1142 after time 1141, and the switch 126 switches from the OFF state to the ON state in synchronization with this change.

That is, when focusing on a period from time $T_{B1}$ to the next change of the input signal $S_{IN}$ from "0" to "1,"

the signal HIONsig is "0" between time $T_{B1}$ and time 1142 and is "1" after time 1142, the switch 126 is in the OFF state between time $T_{B1}$ and time 1142 and is in the ON state after time 1142, the signal SNS_Vth2 is "1" between time $T_{B1}$ and time 1141 and is "0" after time 1141, the charging constant current circuit 121 is in the OFF state between time $T_{B1}$ and time 1141 and is in the ON state after time 1141, and the discharging constant current circuit 122 is in the ON state between time $T_{B1}$ and time 1141 and is in the OFF state after time 1141.

Since the charging constant current circuit 121 switches to the ON state and the discharging constant current circuit 122 switches to the OFF state at time 1141, the voltage $V_{SHP}$ turns from the increasing to the decreasing at time 1141, and since the switch 126 is in the ON state after time 1142, the voltage $V_{SHP}$ becomes equal to the voltage $V_{TH}$.

Time $T_{B2}$ existing between time $T_{B1}$ and time 1141 is a time at which the voltage $V_{SHP}$ transitions from a state higher than the voltage $V_{TH}$ to a state lower than the voltage $V_{TH}$. Therefore, the transistor 112 switches from the ON state to the OFF state at time $T_{B2}$, and thereafter, the OFF state of the transistor 112 is maintained at least until time 1142. In the source state, the drive signal generation circuit 125 changes the drive signal DRV from "0" to "1" in synchronization with the change of the input signal $S_{IN}$ from "0" to "1," and then, changes the drive signal DRV from "1" to "0" in response to the transition of the transistor 112 from the ON state to the OFF state through the change of the input signal $S_{IN}$ from "1" to "0." Therefore, at time $T_{B2}$, the drive signal DRV changes from "1" to "0."

Now, a period between time $T_{A2}$ and time $T_{A3}$ is referred to as a sampling period P1, and a period between time $T_{B1}$ and time $T_{B2}$ is referred to as an adjustment period P2. Since the value of the constant current $I_{P1}$ is equal to the value of the constant current $I_{P2}$, the length of the sampling period P1 is equal to the length of the adjustment period P2.

The sampling period P1 is a period during which the input signal $S_{IN}$ is "1" and the transistor TrH turns from the OFF state to the ON state by the constant current circuit IHon but is not yet sufficiently turned on, which includes or corresponds to a dead time period (hereinafter simply referred to as dead time) in which both of the transistors TrH and TrL are in the OFF state. The dead time is necessary to prevent a through-current. However, when the half bridge circuit including the transistors TrH and TrL is driven and controlled while ignoring the existence of the dead time, an output duty of the half bridge circuit may greatly deviate from that indicated by the input signal $S_{IN}$. Taking this into consideration, the output control circuit 1 uses the sample/hold circuit 10 to hold the information of the dead time length, and delays the change of the drive signal DRV from "1" to "0" by the amount of time corresponding to the dead time after changing the input signal $S_{IN}$ from "1" to "0." A period corresponding to the delay length corresponds to the adjustment period P2. The adjustment period P2 is inserted before starting the operation of turning off the high side transistor TrH in response to the switching of the input signal $S_{IN}$ to "0."

This will be described with reference to FIG. 10 and the like. Now, a period in which the input signal $S_{IN}$ is "1" and a period in which the input signal $S_{IN}$ is "0" are respectively referred to as a designated ON period and a designated OFF period. A ratio of the designated on period length Ton to the sum of the designated ON period length Ton and the designated OFF period length Toff is referred to as a designated output duty, which is denoted by a symbol "$DUTY_{IDEAL}$." That is, $DUTY_{IDEAL}$=Ton/(Ton+Toff). Further, a period in which the output voltage $V_{OUT}$ is equal to or higher than half (here, 6V) of the power supply voltage VPWR is referred to as a real ON period, and a period in which the output voltage $V_{OUT}$ is lower than half of the power supply voltage VPWR is referred to as a real OFF period. The ratio of the real ON period length Ton' to the sum of the real ON period length Ton' and the real OFF period length Toff' is referred to as a real output duty, which is denoted by a symbol "$DUTY_{REAL}$." That is, $DUTY_{REAL}$=Ton'/(Ton'+Toff').

The time from when the input signal $S_{IN}$ changes from "0" to "1" to when the output voltage $V_{OUT}$ reaches half of the power supply voltage VPWR due to the increase in the output voltage $V_{OUT}$ is denoted by "don." The time from when the input signal $S_{IN}$ changes from "1" to "0" to when the output voltage $V_{OUT}$ becomes half or lower of the power supply voltage VPWR due to the decrease in the output voltage $V_{OUT}$ is denoted by "doff." Further, ΔTon is defined as |don−doff|.

When the time ΔTon is zero, "$DUTY_{IDEAL}$=$DUTY_{REAL}$." That is, the output duty as instructed by the input signal $S_{IN}$ can be obtained. However, when the time ΔTon is not zero, $DUTY_{IDEAL}$≠$DUTY_{REAL}$, and the deviation between $DUTY_{IDEAL}$ and $DUTY_{REAL}$ increases with the increase of the frequency of the input signal $S_{IN}$.

For the sake of convenience, assuming that a bridge output circuit using the input signal $S_{IN}$ itself as the drive signal DRV (hereinafter referred to as a comparison bridge output circuit), numerical examples of the deviation in the comparison bridge output circuit will be described (in the source state, in the comparison bridge output circuit, don>doff). That is, for example, with respect to the comparison bridge output circuit, under the condition that the time ΔTon is 0.2 μs (microseconds) and "$DUTY_{IDEAL}$ is 0.66," when the frequency of the input signal $S_{IN}$ is 50 kHz (kilohertz), Ton is 13.2 μs (=20 μs×0.66) and Ton' is 13.0 μs (=20 μs×0.66−0.2 μs). Accordingly, "$DUTY_{IDEAL}$=0.65" and the deviation between $DUTY_{IDEAL}$ and $DUTY_{REAL}$ is not so large. However, when the frequency of the input signal $S_{IN}$ is 200 kHz (kilohertz), Ton is 3.3 μs (=5 μs×0.66) and Ton' is 3.1 μs (=50 μs×0.66−0.2 μs). Accordingly, "$DUTY_{IDEAL}$=0.62" and the deviation between $DUTY_{IDEAL}$ and $DUTY_{REAL}$ becomes remarkable.

It is naturally not preferable to drive the load LD with $DUTY_{REAL}$ greatly deviated from $DUTY_{IDEAL}$ when the drive of the load LD with $DUTY_{IDEAL}$ is specified by the input signal $S_{IN}$.

On the other hand, the reason why "don>doff" in the comparison bridge output circuit in the source state assumed in the first embodiment is that a dead time exists when the transistor TrH switches from the OFF state to the ON state. This dead time (dead time period) can be considered to correspond to the sampling period P1 of FIG. 9. Taking this into consideration, as described above, the output control circuit 1 uses the sample/hold circuit 10 to acquire and hold the information on the length of the dead time, and delays the change of the drive signal DRV from "1" to "0" by the amount of time corresponding to the dead time after changing the input signal $S_{IN}$ from "1" to "0." A period corresponding to the delay length corresponds to the adjustment period P2. The adjustment period P2 is inserted before starting the operation of turning off the high side transistor TrH in response to the switching of the input signal $S_{IN}$ to "0."

Figure 11A:
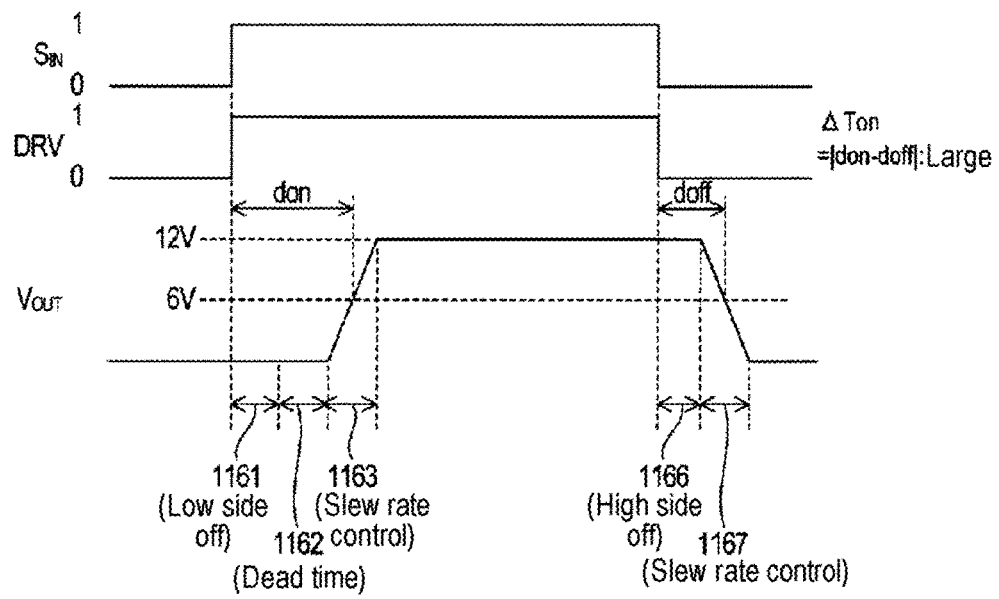
FIG. 11A and FIG. 11B are views showing the input/output relation of a bridge output circuit in the source state for comparison with the input/output relation of the bridge output circuit of the first embodiment in the source state.
Figure 11B:
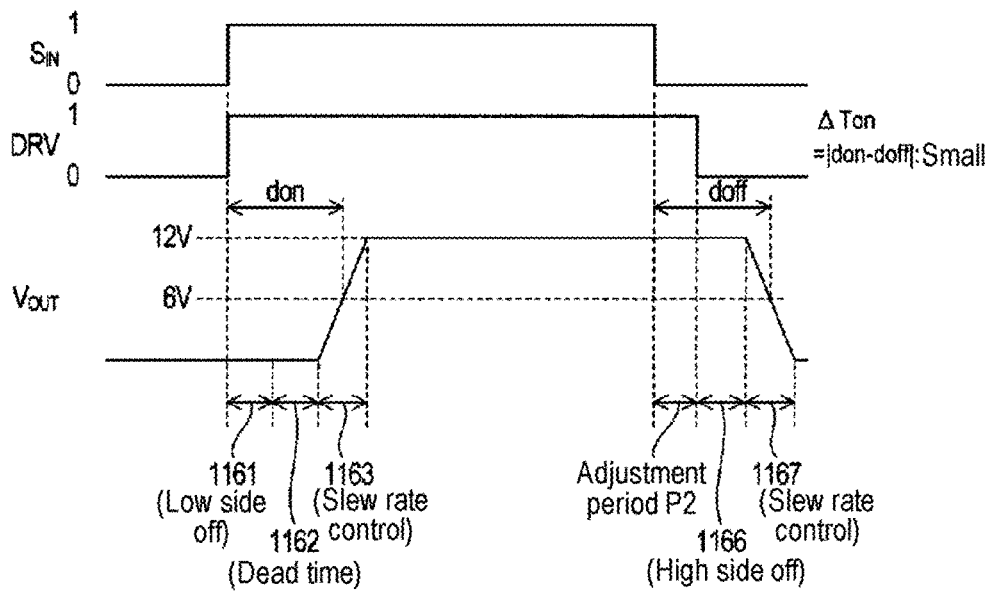

FIG. 11A shows schematic waveforms of the signals $S_{IN}$ and DRV and the output voltage $V_{OUT}$ in the comparison bridge output circuit using the input signal $S_{IN}$ itself as the drive signal DRV as it is, and FIG. 11B shows schematic waveforms of the signals $S_{IN}$ and DRV and the output voltage $V_{OUT}$ in the bridge output circuit BB according to the first embodiment.

In FIG. 11A and FIG. 11B, a period 1161 is a period during which the low side transistor TrL is turned off in response to the change of the input signal $S_{IN}$ to "1" (corresponding to a period between time $T_{A1}$ and time $T_{A2}$; see FIG. 5 and FIG. 9), a period 1162 corresponds to a dead time period in which both of the transistors TrH and TrL are turned off after the transistor TrL is turned off (corresponding to a period between time $T_{A2}$ and time $T_{A3}$, i.e., the sampling period P1; see FIG. 5 and FIG. 9), and a period 1163 is a period in which the slew rate control $SR_A$ is performed (corresponding to a period between time $T_{A3}$ and time $T_{A4}$; see FIG. 5). A period 1166 is a period in which the high side transistor TrH is turned off in response to the change of the input signal $S_{IN}$ to "0" (corresponding to a period between time $T_{B2}$ and time $T_{B3}$; see FIG. 6), and a period 1167 is a period in which the slew rate control $SR_B$ is performed (corresponding to a period between time $T_{B3}$ and time $T_{B4}$; see FIG. 6). However, specifically, both of the periods 1166 and 1167 are used to turn off the high side transistor TrH.

In the comparison bridge output circuit, the amount of time corresponding to the dead time period 1162 appears as a difference (ΔTon) between the time don and the time doff. On the other hand, in the bridge output circuit BB according to the first embodiment, the adjustment period P2 having the same length as the dead time period 1162 is provided, and the drive signal changes from "1" to "0" after waiting for an elapse of time corresponding to the adjustment period P2 when the input signal $S_{IN}$ changes from "1" to "0," whereby ΔTon is suppressed to zero or near zero. More specifically, for example (see also FIG. 5 and FIG. 6 as appropriate), the bridge output circuit BB may be configured such that the length of the period 1161 corresponding to the length between time $T_{A1}$ and time $T_{A2}$ is equal to the length of the period 1166 corresponding to the length between time $T_{B2}$ and time $T_{B3}$ and the length of the period 1163 corresponding to the length between time $T_{A3}$ and time $T_{A4}$ is equal to the length of the period 1167 corresponding to the length between time $T_{B3}$ and time $T_{B4}$. Based on the premise of such a configuration, by providing the adjustment period P2 (corresponding to the period between time $T_{B1}$ and time $T_{B2}$) having the same length as that of the dead time period 1162 (corresponding to the period between time $T_{A2}$ and time $T_{A3}$), ΔTon can be suppressed to zero or near zero. The term "equal" used herein includes substantially "equal" and may include some errors.

The following can be mentioned about the source state.

In the source state, the output control circuit 1 performs a first source transition operation of turning on the transistor TrH after turning off the transistor TrL in response to the change of the input signal $S_{IN}$ from "0" to "1," and then performs a second source transition operation of turning on the transistor TrL after turning off the transistor TrH in response to the change of the input signal $S_{IN}$ from "1" to "0." The first source transition operation is performed in the periods 1161 to 1163 (corresponding to the period between time $T_{A1}$ and time $T_{A4}$ in FIG. 5) in FIG. 11B. In the periods 1166 and 1167 of FIG. 11B (corresponding to the period between time $T_{B2}$ and time $T_{B4}$ in FIG. 6), the turn-off of the transistor TrH, which is a part of the second source transition operation, is realized, and thereafter (after time $T_{B4}$ in FIG. 6), the turning-on of the transistor TrL, which is the remaining part of the second source transition operation, is realized.

The output control circuit 1 acquires an analog signal corresponding to the length of the dead time in which both the transistors TrH and TrL are turned off in the process of the first source transition operation. Thereafter, when the input signal $S_{IN}$ changes from "1" to "0," the second source transition operation is started after the lapse of time based on the acquired analog signal. The analog signal is a signal corresponding to the time from the supply start time $T_{A2}$ of a current by the constant current circuit IHon for turning on the transistor TrH to time $T_{A3}$ at which the output voltage $V_{OUT}$ reaches the predetermined voltage Vth2. The analog signal is acquired and held using the S/H capacitor 113.

That is, the sample/hold circuit 10 provided in the output control circuit 1 changes the terminal voltage of the capacitor 113 (that is, the voltage $V_{SHP}$ corresponding to the voltage between both terminals of the capacitor 113) from the initial voltage ($V_{TH}$) by flowing the constant current $I_{P1}$ to the capacitor 113 from the supply start time $T_{A2}$ of the current by the constant current circuit IHon for turning on the transistor TrH to time $T_{A3}$ at which the output voltage $V_{OUT}$ reaches the threshold voltage Vth2, and holds this change as an analog signal. Thereafter, the sample/hold circuit 10 flows the constant current $I_{P2}$, which is reverse of the constant current $I_{P1}$, to the capacitor 113 from time $T_{B1}$ of the change in the input signal $S_{IN}$ from "1" to "0," and the output control circuit 1 starts the second source transition operation in response to the terminal voltage (voltage $V_{SHP}$) of the capacitor 113 returning to the initial voltage ($V_{TH}$). The second source transition operation is started in response to the turning-off of the transistor 112 at time $T_{B2}$.

In the source state, the sample/hold circuit 10 samples the time length corresponding to the dead time between time $T_{A2}$ and time $T_{A3}$ and holds the sampling result as the terminal voltage change amount of the capacitor 113 between time $T_{A2}$ and time $T_{A3}$. Using the held sampling result, the adjustment period P2 can be inserted when the input signal $S_{IN}$ is changed from "1" to "0."

Second Embodiment

A second embodiment will be described. A state in which the current $I_{OUT}$ flows from the load LD toward the node ND via the output terminal OUT is referred to as a sink state. In the sink state, the polarity of the current $I_{OUT}$ is negative (see FIG. 1). In the second embodiment, based on the premise that the bridge output circuit BB is in the sink state, the operation and configuration of the bridge output circuit BB related to the sink state will be described.

FIG. 12 shows the waveforms of the gate voltages HG and LG and the output voltage $V_{OUT}$ when the input signal $S_{IN}$ switches from "1" to "0," along with the states of several signals. A drive signal DRV based on the input signal $S_{IN}$ is generated in the output control circuit 1 (how the signal is generated will be described later). As mentioned in the first embodiment, the input signal $S_{IN}$ and the drive signal DRV are binary signals, each of which has a value of "1" or "0." The input signal $S_{IN}$ and the drive signal DRV take a high level or low level potential. In the input signal $S_{IN}$ and the drive signal DRV, the high level has a value of "1" and the low level has a value of "0." The input signal $S_{IN}$ of "1" functions as a signal indicating that the transistor TrH should be turned on and the transistor TrL should be turned off, and the input signal $S_{IN}$ of "0" functions as a signal indicating that the transistor TrH should be turned off and the transistor TrL should be turned on.

In FIG. 12, solid line waveforms 1211 and 1212 represent waveforms of the gate voltages HG and LG, respectively, and a broken line waveform 1213 represents a waveform of the output voltage $V_{OUT}$. As time progresses, times $T_{C1}$, $T_{C2}$, $T_{C3}$ and $T_{C4}$ come in this order. In FIG. 12, the waveforms 1211 and 1213 overlap each other from around time $T_{C2}$ (in fact, they are slightly different, but the difference is not shown for the purpose of avoiding complication of the figure).

Immediately before time $T_{C1}$, both of the signals $S_{IN}$ and DRV are "1," the gate voltage LG has a low level (0V) to put the transistor TrL in the OFF state, the gate voltage HG has a high level (Vreg1; 17V) to put the transistor TrH in the ON state, and the output voltage $V_{OUT}$ is substantially equal to the power supply voltage VPWR. Further, immediately before time $T_{C1}$, the signals SNS_TrH_OFF and SNS_Vth2 are "0" and "1," respectively, the constant current circuits IHon, IHoff, ILon and ILoff are in the ON state, OFF state, OFF state and OFF state, respectively, and the transistors Hon, Hoff, Lon and Loff are in the ON state, OFF state, OFF state and ON state, respectively.

At time $T_{C1}$, the input signal $S_{IN}$ changes from "1" to "0." In response to this change, at time $T_{C1}$, the drive signal DRV also changes from "1" to "0." At time $T_{C1}$, the output control circuit 1 turns off the constant current circuit IHon with switch function and the transistor Hon in response to the transition of the drive signal DRV from "1" to "0," and turns on the constant current circuit IHoff with switch function and the transistor Hoff. Then, from time $T_{C1}$, the stored charges of the gate-source capacitance of the transistor TrH are discharged through the constant current circuit IHoff and the transistor Hoff, and the gate voltage HG decreases.

Then, when the gate voltage HG falls below the gate threshold voltage $V_{THH}$ at time $T_{C2}$, the signal SNS_TrH_OFF changes from "0" to "1." At time $T_{C2}$, in response to the transition of the signal SNS_TrH_OFF from "0" to "1," the output control circuit 1 turns on the constant current circuit ILon with switch function while turning off the transistor Loff and the constant current circuit IHoff with switch function. Then, from time $T_{C2}$, the gate-source capacitance of the transistor TrL is charged with a current from the constant current circuit ILon. By this charging, the transistor TrL is gradually turned on.

However, until time $T_{C3}$ (or until around time $T_{C3}$), since the transistor TrL is still in the OFF state and the drain-source resistance of the transistor TrL is relatively large, the output voltage $V_{OUT}$ temporarily rises (the output voltage $V_{OUT}$ may be higher than the power supply voltage VPWR). The load LD according to the second embodiment may be a constant current load that discharges a constant current as the output current $I_{OUT}$ toward the output terminal OUT (here, so considered). In this case, during a period in which both of the transistors TrH and TrL are in the OFF state, since the current $I_{OUT}$ flows from the load LD to a line to which the power supply voltage VPWR is applied via the parasitic diode of the transistor TrH, the voltage $V_{OUT}$ becomes higher by a voltage drop of the parasitic diode than the power supply voltage VPWR.

From around time $T_{C3}$, the gate voltage HG gradually decreases from around the power supply voltage VPWR to 0V and the output voltage $V_{OUT}$ gradually decreases from around the power supply voltage VPWR to 0V. That is, slew rate control $SR_C$ is executed in a period from time $T_{C3}$ to time $T_{C4}$ to be described later.

In the execution period of the slew rate control $SR_C$, a constant current is supplied from the constant current circuit ILon toward the gate of the transistor TrL, the gate voltage LG of the transistor TrL gradually increases, and the drain-source resistance of the transistor TrL gradually decreases with the increase of the gate voltage LG. As a result, the output voltage $V_{OUT}$ gradually decreases. In the period between time $T_{C2}$ and time $T_{C4}$, including the execution period of the slew rate control $SR_C$, only the constant current circuit ILon of the constant current circuits IHon, IHoff, ILon and ILoff is in the ON state, and only the transistor Hoff of the transistors Hon, Hoff, Lon and Loff is in the ON state.

The signal SNS_Vth2 changes from "1" to "0" when the output voltage $V_{OUT}$ decreasing through the execution of the slew rate control $SR_C$ falls below the voltage Vth2 at time $T_{C4}$. At time $T_{C4}$, the output control circuit 1 turns on the transistor Lon in response to the transition of the signal SNS_Vth2 from "1" to "0." Then, from time $T_{C4}$, the gate voltage LG rapidly rises toward the power supply voltage Vreg2.

Immediately after time $T_{C4}$, the transistor TrH is in the OFF state, the transistor TrL is in the ON state, the constant current circuits IHon, IHoff, Ilon and ILoff are in the OFF state, OFF state, ON state and OFF state, respectively, and the transistors Hon, Hoff, Lon and Loff are in the OFF state, ON state, ON state and OFF state, respectively. Immediately after time $T_{C4}$, these states are maintained until the drive signal DRV changes from "0" to "1" next time.

Figure 13:
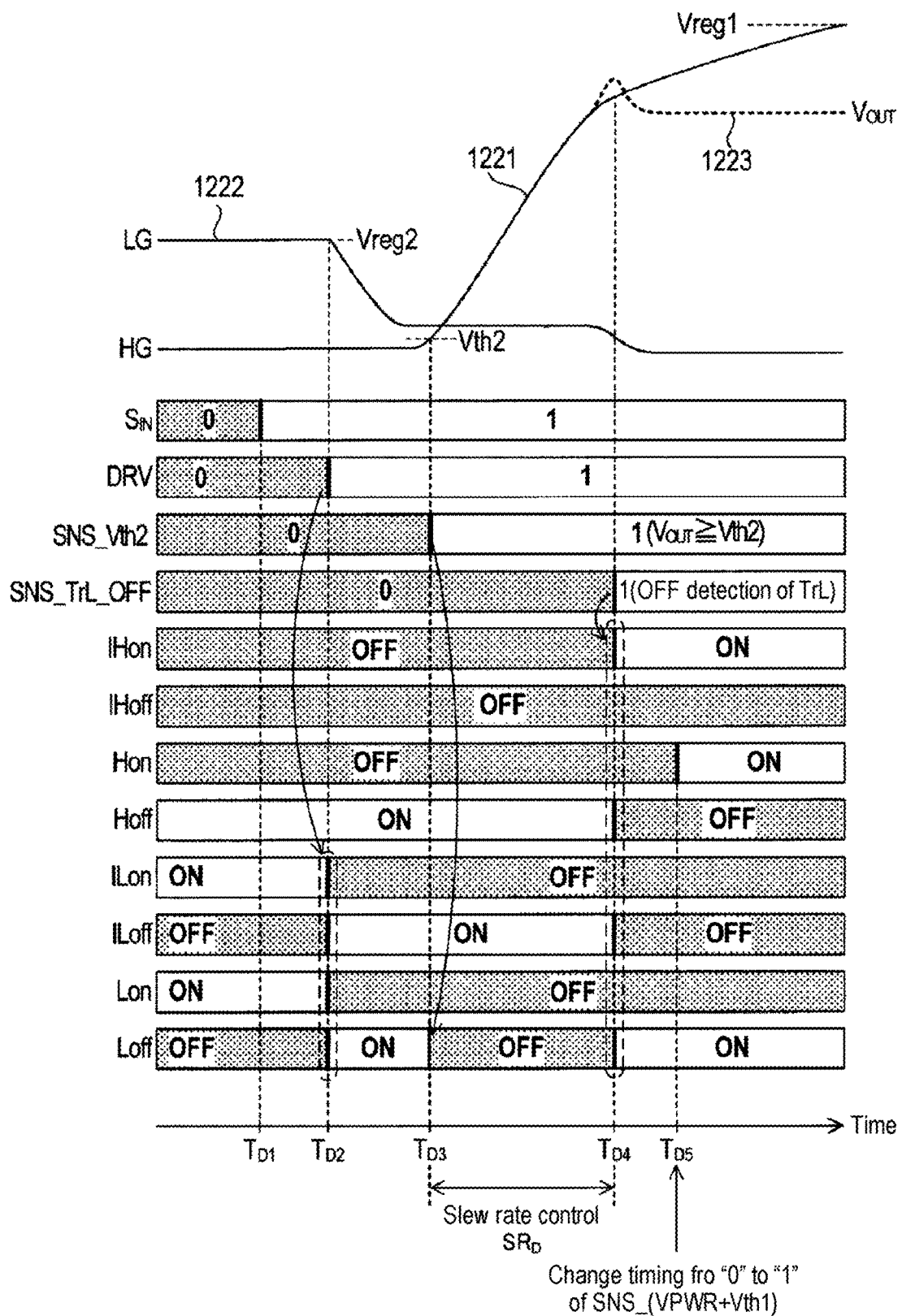
FIG. 13 is a view showing various voltage waveforms and signal state transitions when the output voltage increases in the sink state according to the second embodiment of the present disclosure.

FIG. 13 shows the waveforms of the gate voltages HG and LG and the output voltage $V_{OUT}$ when the input signal $S_{IN}$ switches from "0" to "1," along with the states of several signals. In FIG. 13, solid line waveforms 1221 and 1222 represent waveforms of the gate voltages HG and LG, respectively, and a broken line waveform 1223 represents a waveform of the output voltage $V_{OUT}$. As time progresses, times $T_{D1}$, $T_{D2}$, $T_{D3}$, $T_{D4}$ and $T_{D5}$ come in this order. In FIG. 13, the waveforms 1221 and 1223 overlap with each other in the earlier part around time $T_{D4}$ (in fact, they are slightly different, but the difference is not shown for the purpose of avoiding complication of the figure). Here, consider that time $T_{D1}$ corresponds to a time at which, after the input signal $S_{IN}$ changes from "1" to "0" at time $T_{C1}$ of FIG. 12, the input signal $S_{IN}$ changes from "0" to "1" after time $T_{C4}$. The significance of time $T_{D2}$ will be clear from the description with reference to FIG. 16 to be described later.

Immediately before time $T_{D1}$, both of the signals $S_{IN}$ and DRV are "0," the gate voltage HG has a low level (0V) to put the transistor TrH in the OFF state, the gate voltage LG has a high level (Vreg2; 5V) to put the transistor TrL in the ON state, and the output voltage $V_{OUT}$ is substantially equal to 0V. Further, immediately before time $T_{D1}$, the constant current circuits IHon, IHoff, ILon and ILoff are in the OFF state, OFF state, ON state and OFF state, respectively, and the transistors Hon, Hoff, Lon and Loff are in the OFF state, ON state, ON state and OFF state, respectively.

The input signal $S_{IN}$ changes from "0" to "1" at time $T_{D1}$, and the drive signal DRV changes from "0" to "1" at time $T_{D2}$ after some degree of time elapses from this change (how the drive signal DRV is generated will be described later). At time $T_{D2}$, in response to the transition of the drive signal DRV from "0" to "1," the output control circuit 1 turns off the constant current circuit ILon with switch function and the transistor Lon and turns on the constant current circuit ILoff with switch function and the transistor Loff. Then, from time $T_{D2}$, the stored charges of the gate-source capacitance of the transistor TrL are discharged through the constant current circuit ILoff and the transistor Loff, and the gate voltage LG decreases.

The decrease of the gate voltage LG causes the transistor TrL to go from the ON state to the OFF state with the increase in the drain-source resistance of the transistor TrL. First, the output voltage $V_{OUT}$ exceeds the threshold voltage Vth2 at time $T_{D3}$ and the signal SNS_Vth2 changes from "0" to "1" at time $T_{D3}$. The change of the signal SNS_Vth2 from "0" to "1" at time $T_{D3}$ indicates that the drain-source resistance of the transistor TrL increases such that the output voltage $V_{OUT}$ cannot be maintained at near 0V, and the output voltage $V_{OUT}$ starts to rise. In response to this, the output control circuit 1 executes the slew rate control $SR_D$ to gradually increase the output voltage $V_{OUT}$.

When the transistor Loff is in the ON state, the discharging speed of the stored charges of the gate-source capacitance of the transistor TrL is fast. As a result, since the rising speed of the output voltage $V_{OUT}$ becomes too fast, the output control circuit 1 turns off the transistor Loff at time $T_{D3}$ in response to the transition of the signal SNS_Vth2 from "0" to "1." Then, starting from time $T_{D3}$, the stored charges of the gate-source capacitance of the transistor TrL is discharged with a constant current by the constant current circuit ILoff, the gate voltage LG gradually decreases toward 0V, and the output voltage $V_{OUT}$ gradually rises toward the power supply voltage VPWR with the increase in the drain-source resistance of the transistor TrL due to the decrease.

That is, the slew rate control $SR_D$ gradually increasing the output voltage $V_{OUT}$ from time $T_{D3}$ to time $T_{D4}$ to be described later is executed. In the execution period of the slew rate control $SR_D$, only the constant current circuit ILoff of the constant current circuits IHon, IHoff, ILon and ILoff is in the ON state, and only the transistor Hoff of the transistors Hon, Hoff, Lon and Loff is in the ON state.

When the gate-source voltage $V_{GS}$ of the transistor TrL falls below the predetermined gate threshold voltage $V_{THL}$ at time $T_{D4}$ through the execution of the slew rate control $SR_D$, the signal SNS_TrL_OFF changes from "0" to "1." At time $T_{D4}$, in response to the transition of the signal SNS_TrL_OFF from "0" to "1," the output control circuit 1 turns off the constant current circuit ILoff with switch function while turning on the transistor Loff, and turns on the constant current circuit IHon with switch function while turning off the transistor Hoff. Then, from time $T_{D4}$, the gate voltage HG rises toward the power supply voltage Vreg1, and the transistor TrH goes to the ON state. Further, in the process of increasing the gate voltage HG, the signal SNS_

(VPWR+Vth1) changes from "0" to "1" at time $T_{D5}$, and the output control circuit 1 turns on the transistor Hon in response to this change.

In the vicinity of time $T_{D4}$, the drain-source resistance of the transistor TrL becomes relatively large, and as a result, some or all of a current from the load LD flows into a line to which the power supply voltage VPWR is applied via the parasitic diode of the transistor TrH. Therefore, the voltage $V_{OUT}$ becomes higher by a voltage drop of the parasitic diode than the power supply voltage VPWR.

Immediately after time $T_{D5}$, the constant current circuits IHon, IHoff, ILon and ILoff are in the ON state, OFF state, OFF state and OFF state, respectively, and the transistors Hon, Hoff, Lon and Loff are in the ON state, OFF state, OFF state and ON state, respectively. Immediately after time $T_{D5}$, these states are maintained until the drive signal DRV changes from "1" to "0" next time. After time $T_{D5}$, the transistor TrH is in the ON state, and the transistor TrL is in the OFF state.

A circuit for determining time $T_{D2}$ will be described with reference to FIG. 14. FIG. 14 is a configuration view of a sample/hold circuit 20 provided in the output control circuit 1. The sample/hold circuit 20 includes transistors 211 and 212 configured as N-channel MOSFETs, a S/H capacitor 213, constant current circuits 221 and 222, a constant current circuit 223, a switch control circuit 224, a drive signal generation circuit 225, a switch 226 and a gate line 227. The gate line 227 is a wiring connected to the gate of the transistor 212.

The drain and gate of the transistor 211 are connected in common to one end of the switch 226, and the other end of the switch 226 is connected to the gate line 227. The source of the transistor 211 is connected to the ground. One end of the S/H capacitor 213 is connected to the gate line 227, and the other end of the S/H capacitor 213 is connected to the ground. The drain of the transistor 212 is connected to the constant current circuit 223, and the source of the transistor 212 is connected to the ground.

The constant current circuits 221 and 222 are constant current circuits with switch function to be driven based on a power supply voltage Vreg3. The constant current circuit 221 functions as a constant current circuit for charging the capacitor 213, and the constant current circuit 222 functions as a constant current circuit for discharging the capacitor 213. The power supply voltage Vreg3 is a predetermined positive DC voltage, and is 1.5V here. In detail, the charging constant current circuit 221 takes either the ON state or the OFF state according to the signal SNS_(VPWR−Vth3), supplies a predetermined constant current $I_{Q1}$ toward the gate line 227 only in the ON state. The constant current $I_{Q1}$ is not supplied to the gate line 227 in the OFF state, which is equivalent to a state in which the charging constant current circuit 221 and the gate line 227 are electrically isolated from each other. However, the rise of the potential of the gate line 227 due to the ON state of the charging constant current circuit 221 is limited to the power supply voltage Vreg3. The discharging constant current circuit 222 takes either the ON state or the OFF state under the control of the switch control circuit 224 and operates to draw a predetermined constant current $I_{Q2}$ from the gate line 227 only in the ON state. The constant current $I_{Q2}$ does not flow between the gate line 227 and the discharging constant current circuit 222 in the OFF state, which is equivalent to a state in which the discharging constant current circuit 222 and the gate line 227 are electrically isolated from each other. However, the decrease in the potential of the gate line 227 due to the ON state of the discharging constant current circuit 222 is limited to the potential of the ground.

The constant current circuit 223 supplies a predetermined constant current $I_{Q3}$ toward the transistor 212 based on the power supply voltage Vreg3. However, the constant current $I_{Q3}$ flows as the drain current of the transistor 212 only when the transistor 212 is in the ON state, and acts to raise the voltage of the drain of the transistor 212 to the power supply voltage Vreg3 when the transistor 212 is in the OFF state.

As a specific numerical example, the current values of the constant currents $I_{Q1}$, $I_{Q2}$ and $I_{Q3}$ are 20 μA (microampere), and the capacitance value of the S/H capacitor 213 is 4 pF (picofarad). Although these values can be modified, the current values of the constant currents $I_{Q1}$ and $I_{Q2}$ are equal to each other. The current values of the constant current $I_{Q3}$ may or may not be equal to those of the constant currents $I_{Q1}$ and $I_{Q2}$.

The transistors 211 and 212 are MOSFETs having the same structure, and the gate threshold voltages of the transistors 211 and 212 are equal to each other, and each of the gate threshold voltage is the voltage $V_{TH}$. Therefore, when the gate-source voltage of the transistor 211 is equal to or higher than the voltage $V_{TH}$, the transistor 211 is turned on, while when the gate-source voltage of the transistor 211 is lower than the voltage $V_{TH}$, the transistor 211 is turned off. When the gate-source voltage of the transistor 212 is equal to or higher than the voltage $V_{TH}$, the transistor 212 is turned on, while when the gate-source voltage of the transistor 212 is lower than the voltage $V_{TH}$, the transistor 212 is turned off. A voltage of the gate line 227, which is equal to the gate-source voltage of the transistor 212, is denoted by $V_{SHQ}$.

As shown in FIG. 15A, the charging constant current circuit 221 is turned off when the signal SNS_(VPWR−Vth3) is "0" (i.e., when "$V_{OUT}$<(VPWR−Vth3)"), and is turned on when the signal SNS_(VPWR−Vth3) is "1" (i.e., when "$V_{OUT}$≥(VPWR−Vth3)"). The switch control circuit 224 controls the state of the discharging constant current circuit 222 based on the signals $S_{IN}$ and SNS_(VPWR−Vth3). As shown in FIG. 15B, the switch control circuit 224 turns on the discharging constant current circuit 222 only when the signal $S_{IN}$ is "1" and the signal SNS_(VPWR−Vth3) is "0," and, otherwise, turns off the discharging constant current circuit 222.

The drive signal generation circuit 225 receives the signal $S_{IN}$ and a signal 228 indicating the voltage of the drain of the transistor 212, and generates and outputs a signal based on these signals as the drive signal DRV. The signal 228 has a low level when the transistor 212 is in the ON state, and has a high level when the transistor 212 is in the OFF state. Therefore, the drive signal generation circuit 225 can recognize the ON/OFF state of the transistor 212 based on the signal 228. Although the details will be described later with reference to FIG. 16, in the sink state, the drive signal generation circuit 225 changes the drive signal DRV from "1" to "0" in synchronization with the change of the input signal $S_{IN}$ from "1" to "0," and, thereafter, changes the drive signal DRV from "0" to "1" in response to the transition of the transistor 212 from the ON state to the OFF state through the change of the input signal $S_{IN}$ from "0" to "1."

The switch 226 is in one of the ON state and the OFF state based on a signal LOONsig having a value of "1" or "0." As shown in FIG. 15C, the switch 226 is in the ON state when the signal LOONSig is "1," and is in the OFF state when the signal LOONSig is "0." The signal LOONsig is a signal generated in the output control circuit 1 based on the signal S_ILon for controlling the constant current circuit ILon. The signal LOONsig changes from "1" to "0" at a time when the constant current circuit ILon switches from the OFF state to the ON state (i.e., time $T_{C2}$; see FIG. 12 and FIG. 16 to be described later), and, thereafter, changes from "0" to "1" at a time when the constant current circuit ILon switches from the ON state to the OFF state (time $T_{D2}$; see FIG. 13) or at a time after the time when the constant current circuit ILon switches from the ON state to the OFF state (e.g., time $T_{D3}$ or $T_{D4}$; see FIG. 13).

When the switch 226 is in the OFF state, if the charging constant current circuit 221 is in the ON state and the discharging constant current circuit 222 is in the OFF state, the S/H capacitor 213 is charged by the constant current $I_{Q1}$ and the voltage $V_{SHQ}$ increases with the power supply voltage Vreg3 as the upper limit. If the charging constant current circuit 221 is in the OFF state and the discharging constant current circuit 222 is in the ON state, the stored charges of the S/H capacitor 213 are discharged by the constant current $I_{Q2}$ and the voltage $V_{SHQ}$ decreases with 0V as the lower limit.

Figure 16:
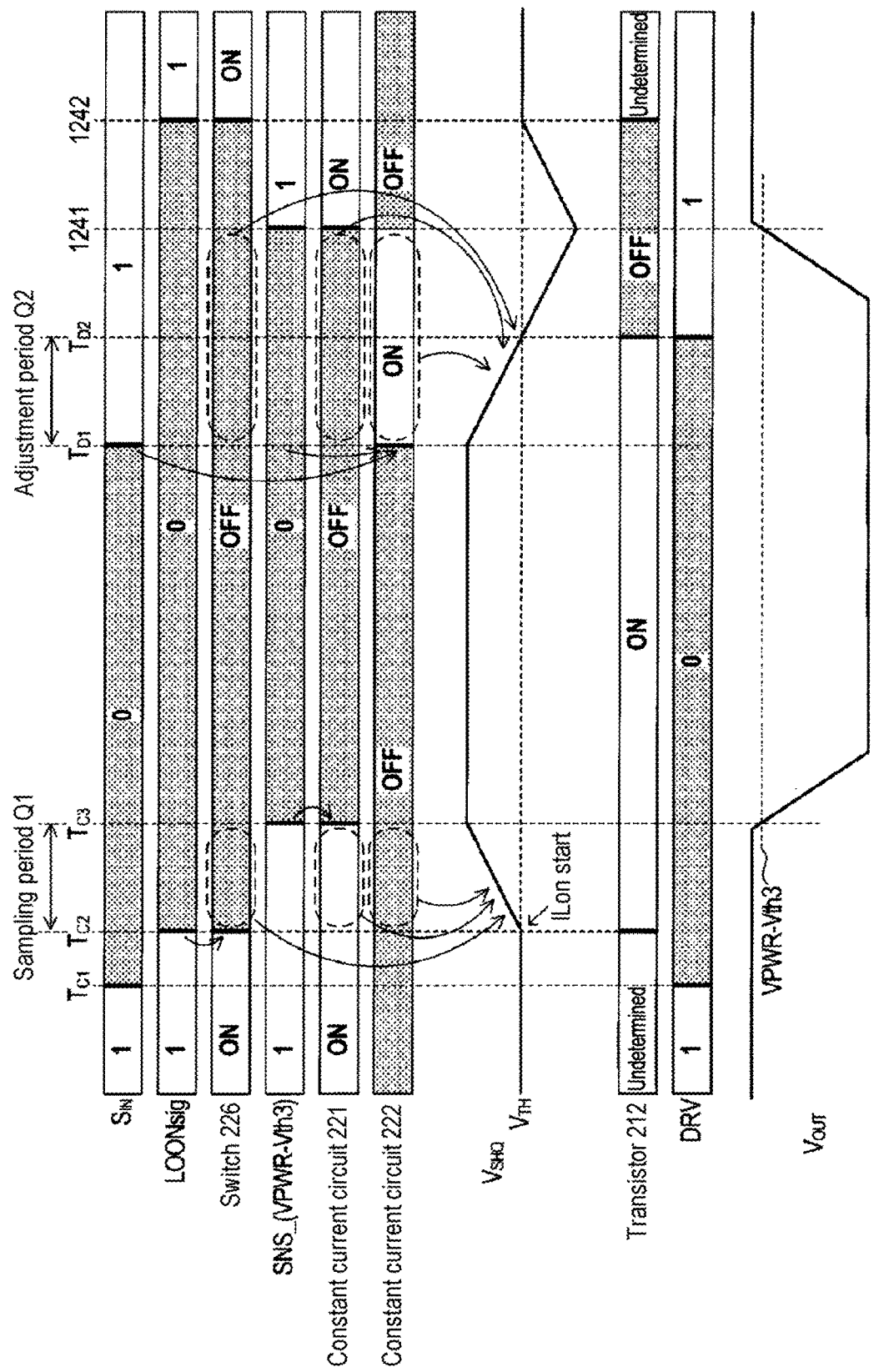
FIG. 16 is a view showing various voltage waveforms and signal state transitions focusing on the sample/hold circuit according to the second embodiment of the present disclosure.

The operation of generating the drive signal DRV using the sample/hold circuit 20 will be described with reference to FIG. 16. FIG. 16 is a timing chart of various signals and the states thereof. A schematic waveform of the output voltage $V_{OUT}$ is also shown in FIG. 16.

Immediately before time $T_{C1}$, the signals $S_{IN}$ and DRV are "1." Immediately before time $T_{C1}$, the signal LOONsig is "1," the switch 226 is in the ON state, the signal SNS_(VPWR-Vth3) is "1," the charging constant current circuit 221 is in the ON state, and the discharging constant current circuit 222 is in the OFF state by the work of the switch control circuit 224. Therefore, the voltage $V_{SHQ}$ is equal to the gate threshold voltage $V_{TH}$ of the transistor 211 immediately before time $T_{C1}$. When the switch 226 is in the ON state, the transistor 212 is in an indeterminate state at the boundary between the ON state and the OFF state, but the drive control generation circuit 225 also maintains the drive signal DRV at "1" based on the input signal $S_{IN}$ of "1" before time $T_{C1}$.

At time $T_{C1}$, the input signal $S_{IN}$ changes from "1" to "0." When the input signal $S_{IN}$ changes from "1" to "0" regardless of the signal 228 (that is, regardless of the state of the transistor 212), the drive signal generation circuit 225 changes the drive signal DRV from "1" to "0" in synchronization with the change of the input signal $S_{IN}$. Therefore, the drive signal DRV changes from "1" to "0" at time $T_{C1}$.

The gate voltage HG decreases from time $T_{C1}$ (see FIG. 12). At time $T_{C2}$, the signal LOONSig changes from "1" to "0" in synchronization with the turning-on of the constant current circuit ILon with switch function. In response to the change, the switch 226 switches from the ON state to the OFF state. Thereafter, the output voltage $V_{OUT}$ decreases, the signal SNS_(VPWR-Vth3) changes from "1" to "0" at time $T_{33}$, and the charging constant current circuit 221 switches from the ON state to the OFF state in response to the change of the signal SNS_(VPWR-Vth3) from "1" to "0." Then, between time $T_{C2}$ and time $T_{C3}$, since the switch 226 is in the OFF state, the charging constant current circuit 221 is in the ON state and the discharging constant current circuit 222 is in the OFF state, the S/H capacitor 213 is charged by the constant current $I_{Q1}$, the voltage $V_{SHQ}$ increases, and the increase of the voltage $V_{SHQ}$ stops at time $T_{C3}$. After that, since both of the switch 226 and the constant current circuits 221 and 222 are maintained in the OFF state until time $T_{D1}$, the value of the voltage $V_{SHQ}$ at time $T_{C3}$ is maintained until time $T_{D1}$.

After time $T_{C2}$, the transistor 212 receives the voltage $V_{SHQ}$ higher than the gate threshold voltage $V_{TH}$ at its gate and enters the stable ON state, and the ON state of the transistor 212 is maintained until time $T_{D2}$ as will be described later.

At time $T_{D1}$, the input signal $S_{IN}$ changes from "0" to "1." At time $T_{D1}$, since the signal SNS_(VPWR-Vth3) is "0," when the input signal $S_{IN}$ changes from "0" to "1," the discharging constant current circuit 222 switches from the OFF state to the ON state by receiving the input signal $S_{IN}$ of "1" and the signal SNS_(VPWR-Vth3) of "0." Further, at time $T_{D1}$, the switch 226 is in the OFF state since the signal LOONSig is "0," and the charging constant current circuit 221 is in the OFF state since the signal SNS_(VPWR-Vth3) is "0." Therefore, from time $T_{D1}$, the stored charges in the S/H capacitor 213 are discharged by the constant current $I_{Q2}$, and the voltage $V_{SHQ}$ decreases. This decrease continues until time 1241 when the signal SNS_(VPWR-Vth3) changes from "0" to "1" next time. In the example of FIG. 16, the signal LOONSig changes from "0" to "1" at time 1242 after time 1241, and the switch 226 switches from the OFF state to the ON state in synchronization with this change.

That is, when focusing on a period from time $T_{D1}$ to the next change of the input signal $S_{IN}$ from "1" to "0,"

the signal LOONSig is "0" between time $T_{D1}$ and time 1242 and is "1" after time 1242, the switch 226 is in the OFF state between time $T_{D1}$ and time 1242 and is in the ON state after time 1242, the signal SNS_(VPWR-Vth3) is "0" between time $T_{D1}$ and time 1241 and is "1" after time 1241, the charging constant current circuit 221 is in the OFF state between time $T_{D1}$ and time 1241 and is in the ON state after time 1241, and the discharging constant current circuit 222 is in the ON state between time $T_{D1}$ and time 1241 and is in the OFF state after time 1241.

Since the charging constant current circuit 221 switches to the ON state and the discharging constant current circuit 222 switches to the OFF state at time 1241, the voltage $V_{SHQ}$ turns from the increasing to the decreasing at time 1241, and since the switch 226 is in the ON state after time 1242, the voltage $V_{SHQ}$ becomes equal to the voltage $V_{TH}$.

Time $T_{D2}$ existing between time $T_{D1}$ and time 1241 is a time at which the voltage $V_{SHQ}$ transitions from a state higher than the voltage $V_{TH}$ to a state lower than the voltage $V_{TH}$. Therefore, the transistor 212 switches from the ON state to the OFF state at time $T_{D2}$, and thereafter, the OFF state of the transistor 212 is maintained at least until time 1242. In the sink state, the drive signal generation circuit 225 changes the drive signal DRV from "1" to "0" in synchronization with the change of the input signal $S_{IN}$ from "1" to "0," and then, changes the drive signal DRV from "0" to "1" in response to the transition of the transistor 212 from the ON state to the OFF state through the change of the input signal $S_{IN}$ from "0" to "1." Therefore, at time $T_{D2}$, the drive signal DRV changes from "0" to "1."

Now, a period between time $T_{C2}$ and time $T_{C3}$ is referred to as a sampling period Q1, and a period between time $T_{D1}$ and time $T_{D2}$ is referred to as an adjustment period Q2. Since the value of the constant current $I_{Q1}$ is equal to the value of the constant current $I_{Q2}$, the length of the sampling period Q1 is equal to the length of the adjustment period Q2.

The sampling period Q1 is a period during which the input signal $S_{IN}$ is "0" and the transistor TrL turns from the OFF state to the ON state by the constant current circuit ILon but is not yet sufficiently turned on, which includes or corresponds to a dead time period (hereinafter simply referred to as dead time) in which both of the transistors TrH and TrL are in the OFF state. The dead time is necessary to prevent a through-current. However, when the half bridge circuit including the transistors TrH and TrL is driven and controlled while ignoring the existence of the dead time, the output duty of the half bridge circuit may greatly deviate from that indicated by the input signal $S_{IN}$. Taking this into consideration, the output control circuit 1 uses the sample/hold circuit 20 to acquire and hold the information of the dead time length, and delays the change of the drive signal DRV from "0" to "1" by the amount of time corresponding to the dead time after changing the input signal $S_{IN}$ from "0" to "1." A period corresponding to the delay length corresponds to the adjustment period Q2. The adjustment period Q2 is inserted before starting the operation of turning off the low side transistor TrL in response to the switching of the input signal $S_{IN}$ to "1."

When the adjustment period Q2 is not inserted, a deviation occurs between the designated output duty $DUTY_{IDEAL}$ by the input signal $S_{IN}$ and the designated output duty $DUTY_{REAL}$ by the output voltage $V_{OUT}$, and the deviation increases with the frequency increase of the input signal $S_{IN}$, as described in the first embodiment. It is naturally not preferable to drive the load LD with $DUTY_{REAL}$ greatly deviated from the $DUTY_{IDEAL}$ when the drive of the load LD by the $DUTY_{IDEAL}$ is designated by the input signal $S_{IN}$.

Figure 17A:
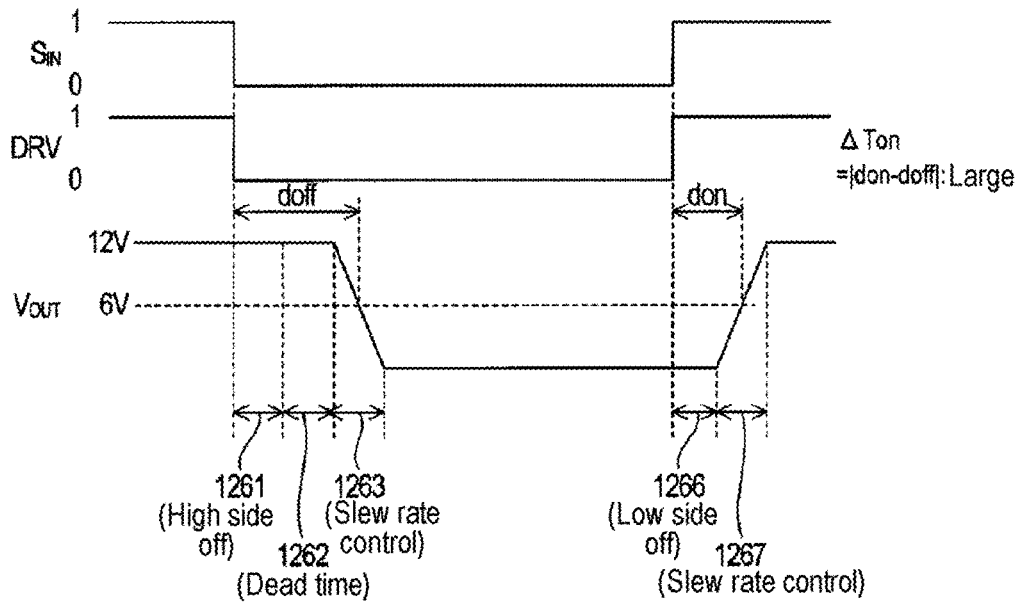
FIG. 17A and FIG. 17B are views showing the input/output relation of a bridge output circuit in the sink state for comparison with the input/output relation of the bridge output circuit of the second embodiment in the sink state.
Figure 17B:
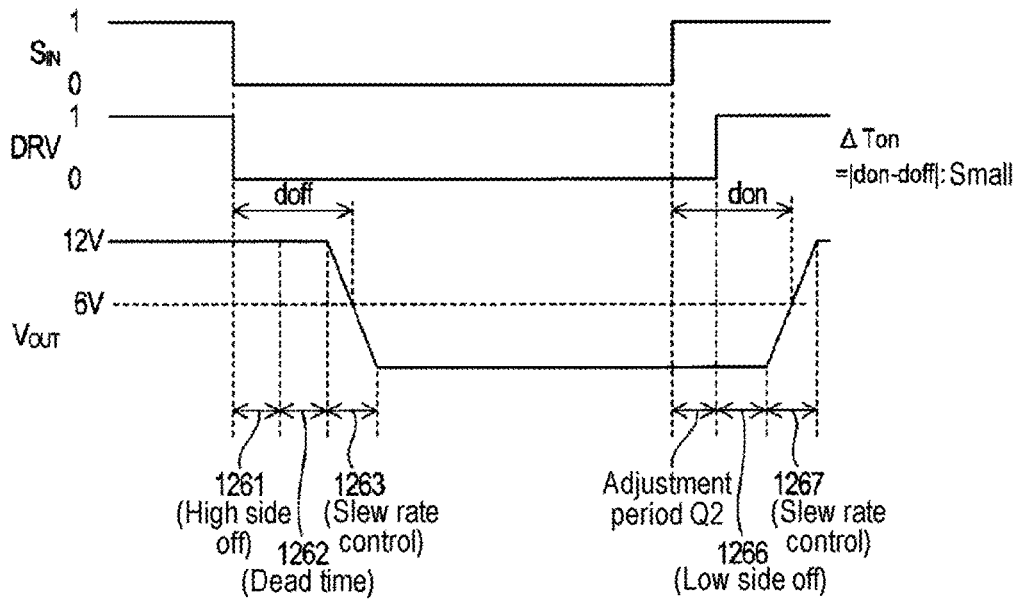

FIG. 17A shows schematic waveforms of the signals $S_{IN}$ and DRV and the output voltage $V_{OUT}$ in the comparison bridge output circuit using the input signal $S_{IN}$ itself as the drive signal DRV as it is, and FIG. 17B shows schematic waveforms of the signals $S_{IN}$ and DRV and the output voltage $V_{OUT}$ in the bridge output circuit BB according to the second embodiment.

In FIG. 17A and FIG. 17B, a period 1261 is a period during which the high side transistor TrH is turned off in response to the change of the input signal $S_{IN}$ to "0" (corresponding to a period between time $T_{C1}$ and time $T_{C2}$; see FIG. 12 and FIG. 16), a period 1262 corresponds to a dead time period in which both the transistors TrH and TrL are turned off after the transistor TrH is turned off (corresponding to a period between time $T_{C2}$ and time $T_{C3}$, i.e., the sampling period Q1; see FIG. 12 and FIG. 16), and a period 1263 is a period in which the slew rate control $SR_C$ is performed (corresponding to a period between time $T_{C3}$ and time $T_{C4}$; see FIG. 12). A period 1266 is a period in which the low side transistor TrL is turned off in response to the change of the input signal $S_{IN}$ to "1" (corresponding to a period between time $T_{D2}$ and time $T_{D3}$; see FIG. 13), and a period 1267 is a period in which the slew rate control $SR_D$ is performed (corresponding to a period between time $T_{D3}$ and time $T_{D4}$; see FIG. 13). However, in detail, both of the periods 1266 and 1267 are used to turn off the low side transistor TrL.

In the comparison bridge output circuit, the amount of time corresponding to the dead time period 1262 appears as a difference (ΔTon) between the time don and the time doff. On the other hand, in the bridge output circuit BB according to the second embodiment, the adjustment period Q2 having the same length as the dead time period 1262 is provided, and the drive signal changes from "0" to "1" after waiting for an elapse of time corresponding to the adjustment period Q2 when the input signal $S_{IN}$ changes from "0" to "1," whereby ΔTon is suppressed to zero or near zero. In the comparison bridge output circuit, in the sink state, "doff>don" is obtained, contrary to the source state. More specifically, for example (see also FIG. 12 and FIG. 13 as appropriate), the bridge output circuit BB may be configured such that the length of the period 1261 corresponding to the length between time $T_{C1}$ and time $T_{C2}$ is equal to the length of the period 1266 corresponding to the length between time $T_{C2}$ and time $T_{C3}$ and the length of the period 1263 corresponding to the length between time $T_{C3}$ and time $T_{C4}$ is equal to the length of the period 1267 corresponding to the length between time $T_{D3}$ and time $T_{D4}$. Based on the premise of such a configuration, by providing the adjustment period Q2 (corresponding to the period between time $T_{D1}$ and time $T_{D2}$) having the same length as that of the dead time period 1262 (corresponding to the period between time $T_{C2}$ and time $T_{C3}$), ΔTon can be suppressed to zero or near zero. The term "equal" used herein includes substantially "equal" and may include some errors.

The following can be mentioned about the sink state.

In the sink state, the output control circuit 1 performs a first sink transition operation of turning on the transistor TrL after turning off the transistor TrH in response to the change of the input signal $S_{IN}$ from "1" to "0," and then performs a second sink transition operation of turning on the transistor TrH after turning off the transistor TrL in response to the change of the input signal $S_{IN}$ from "0" to "1." The first sink transition operation is performed in the periods 1261 to 1263 (corresponding to the period between time $T_{C1}$ and time $T_{C4}$ in FIG. 12) in FIG. 17B. In the periods 1266 and 1267 of FIG. 17B (corresponding to the period between time $T_{D2}$ and time $T_{D4}$ in FIG. 13), the turn-off of the transistor TrL, which is a part of the second sink transition operation, is realized, and thereafter (after time $T_{D4}$ in FIG. 13), the turning-on of the transistor TrH, which is the remaining part of the second sink transition operation, is realized.

The output control circuit 1 acquires an analog signal corresponding to the length of the dead time in which both the transistors TrH and TrL are turned off in the process of the first sink transition operation. Thereafter, when the input signal $S_{IN}$ changes from "0" to "1," the second sink transition operation is started after the lapse of time based on the acquired analog signal. The analog signal is a signal corresponding to the time from the supply start time $T_{C2}$ of a current by the constant current circuit ILon for turning on the transistor TrL to time $T_{C3}$ at which the output voltage $V_{OUT}$ falls below the predetermined voltage (VPWR−Vth3). The analog signal is acquired and held using the S/H capacitor 213.

That is, the sample/hold circuit 20 provided in the output control circuit 1 changes the terminal voltage of the capacitor 213 (that is, the voltage $V_{SHQ}$ corresponding to the voltage between both terminals of the capacitor 213) from the initial voltage ($V_{TH}$) by flowing the constant current $I_{Q1}$ to the capacitor 213 from the supply start time $T_{C2}$ of the current by the constant current circuit ILon for turning on the transistor TrL to time $T_{C3}$ at which the output voltage $V_{OUT}$ falls below the predetermined voltage (VPWR−Vth3), and holds this change as an analog signal. Thereafter, the sample/hold circuit 20 flows the constant current $I_{Q2}$, which is reverse of the constant current $I_{Q1}$, to the capacitor 213 from time $T_{D1}$ of the change in the input signal $S_{IN}$ from "0" to "1," and the output control circuit 1 starts the second sink transition operation when the terminal voltage (voltage $V_{SHQ}$) of the capacitor 213 returns to the initial voltage ($V_{TH}$). The second sink transition operation is started in response to the turning-off of the transistor 212 at time $T_{D2}$.

In the sink state, the sample/hold circuit 20 samples the time length corresponding to the dead time between time $T_{C2}$ and time $T_{C3}$ and holds the sampling result as the terminal voltage change amount of the capacitor 213 between time $T_{C2}$ and time $T_{C3}$. Using the held sampling result, the adjustment period Q2 can be inserted when the input signal $S_{IN}$ is changed from "0" to "1."

Third Embodiment

A third embodiment will be described. It is assumed that the method shown in the first embodiment is in the source state, and the method shown in the second embodiment is in the sink state. In the third embodiment, the configuration of the output control circuit 1 applicable to both the source state and the sink state will be described.

The source state and the sink state can be considered to be states of the bridge output circuit BB. In this case, if the existence of a period in which no current flows in the load LD is ignored, the bridge output circuit BB takes either the source state or the sink state. However, the source state and the sink state may be considered to be states of the load LD. In this case, if the existence of a period in which no current flows in the load LD is ignored, the load LD takes either the source state or the sink state. In the following, unless otherwise mentioned, the source state and the sink state are considered to be the states of the bridge output circuit BB.

Figure 18:
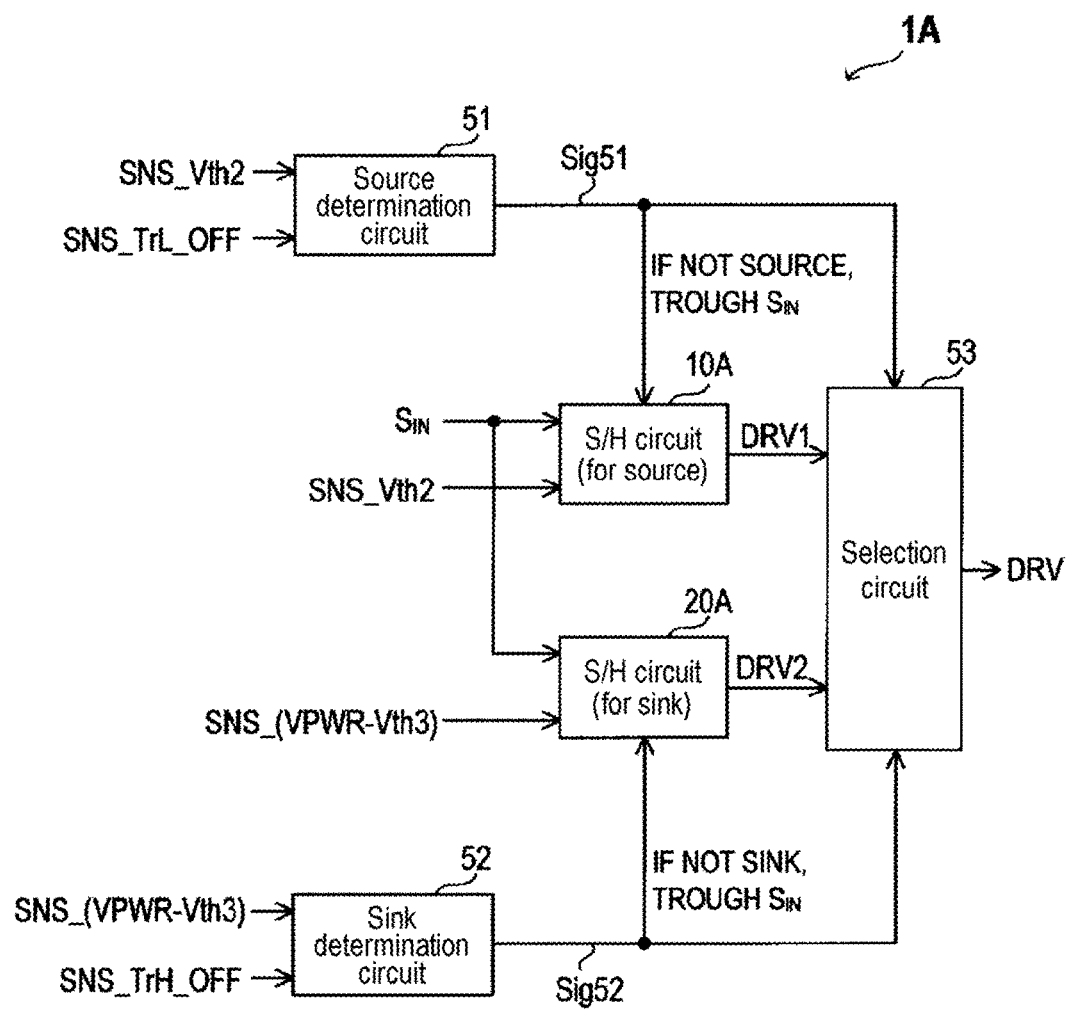
FIG. 18 is a block diagram of an output control circuit according to a third embodiment of the present disclosure.

FIG. 18 is a block diagram of an output control circuit 1A according to a third embodiment. In the third embodiment, the output control circuit 1A is used as the output control circuit 1 of FIG. 1. The output control circuit 1A includes sample/hold circuits 10A and 20A, a source determination circuit 51, a sink determination circuit 52 and a selection circuit 53.

The signals SNS_Vth2 and SNS_TrL_OFF are input to the source determination circuit 51. The source determination circuit 51 determines whether or not the state of the bridge output circuit BB is the source state based on the signals SNS_Vth2 and SNS_TrL_OFF, and outputs a source determination result signal Sig51 indicating the result of the determination to the sample/hold circuit 10A and the selection circuit 53. When it is determined that the state of the bridge output circuit BB is in the source state, the signal Sig51 has a value of "1." Otherwise, the signal Sig51 has a value of "0."

Specifically, when the transistor TrL is in the OFF state, the source determination circuit 51 determines that the state of the bridge output circuit BB is in the source state when there is a time when the output voltage $V_{OUT}$ becomes lower than the predetermined voltage Vth2, and outputs the signal Sig51 of "1." In the sink state, since the output voltage $V_{OUT}$ is sufficiently high when the transistor TrL is in the OFF state, if the output voltage $V_{OUT}$ is lower than the threshold voltage Vth2 when the transistor TrL is in the OFF state, the state of the bridge output circuit BB is considered to be the reverse of the sink state, i.e., the source state.

More specifically, the source determination circuit 51 is configured with a flip flop circuit. On the condition that the signal SNS_TrL_OFF is "1" (that is, on the condition that the transistor TrL is in the OFF state), when the signal SNS_Vth2 of "0" is input (that is, when a signal indicating "$V_{OUT}$<Vth2" is input), the source determination circuit 51 sets the signal Sig51 to "1" using the input as a trigger and latches (i.e., holds) the signal Sig51 at "1." The latch of the signal Sig51 of "1" is reset when the value of the signal SNS_TrL_OFF changes from "1" to "0" (that is, when cancellation of the OFF state of the transistor TrL is detected). That is, the signal Sig51 becomes "0." The initial value of the signal Sig51 is "0."

The signals SNS_(VPWR−Vth3) and SNS_TrH_OFF are input to the sink determination circuit 52. The sink determination circuit 52 determines whether or not the state of the bridge output circuit BB is in the sink state based on the signals SNS_(VPWR−Vth3) and SNS_TrH_OFF, and outputs a sink determination result signal Sig52 indicating a sink determination result to the sample/hold circuit 20A and the selection circuit 53. The signal Sig52 has a value of "1" when it is determined that the state of the bridge output circuit BB is in the sink state. Otherwise, the signal Sig52 has a value of "0."

Specifically, when the transistor TrH is in the OFF state, the sink determination circuit 52 determines that the state of the bridge output circuit BB is in the sink state when there is a time when the output voltage $V_{OUT}$ becomes equal to or lower than the predetermined voltage (VPWR−Vth3), and outputs the signal Sig52 of "1." In the sink state, even when the transistor TrH is in the OFF state, there is a time when the output voltage $V_{OUT}$ becomes equal to or higher than the predetermined voltage (VPWR−Vth3) due to a flow of a current from the load LD side.

More specifically, the sink determination circuit 52 is configured with a flip flop circuit. On the condition that the signal SNS_TrH_OFF is "1" (that is, on the condition that the transistor TrH is in the OFF state), when the signal SNS_(VPWR−Vth3) of "1" is input (that is, when a signal indicating "$V_{OUT}$≥(VPWR−Vth3)" is input), the sink determination circuit 52 sets the signal Sig52 to "1" using the input as a trigger and latches (i.e., holds) the signal Sig52 at "1." The latch of the signal Sig52 of "1" is reset when the value of the signal SNS_TrH_OFF changes from "1" to "0" (that is, when cancellation of the OFF state of the transistor TrH is detected). That is, the signal Sig52 becomes "0." The initial value of the signal Sig52 is "0."

The signals $S_{IN}$ and SNS_Vth2 are input to the sample/hold circuit 10A, and the signals $S_{IN}$ and SNS_(VPWR−Vth3) are input to the sample/hold circuit 20A. The sample/hold circuit 10A has the same configuration as the sample/hold circuit 10 of FIG. 7 shown in the first embodiment, and basically performs the same operation as that shown in the first embodiment. Similarly, the sample/hold circuit 20A has the same configuration as the sample/hold circuit 20 of FIG. 14 shown in the second embodiment, and basically performs the same operation as that shown in the second embodiment.

However, in the output control circuit 1A, a signal DRV1 output from the sample/hold circuit 10A functions as a first candidate for the drive signal DRV to be output from the selection circuit 53, while a signal DRV2 output from the sample/hold circuit 20A functions as a second candidate of the drive signal DRV to be output from the selection circuit 53. The selection circuit 53 selectively outputs either the signal DRV1 from the circuit 10A or the signal DRV2 from the circuit 20A as the drive signal DRV based on the signals Sig51 and Sig52.

Figure 7:
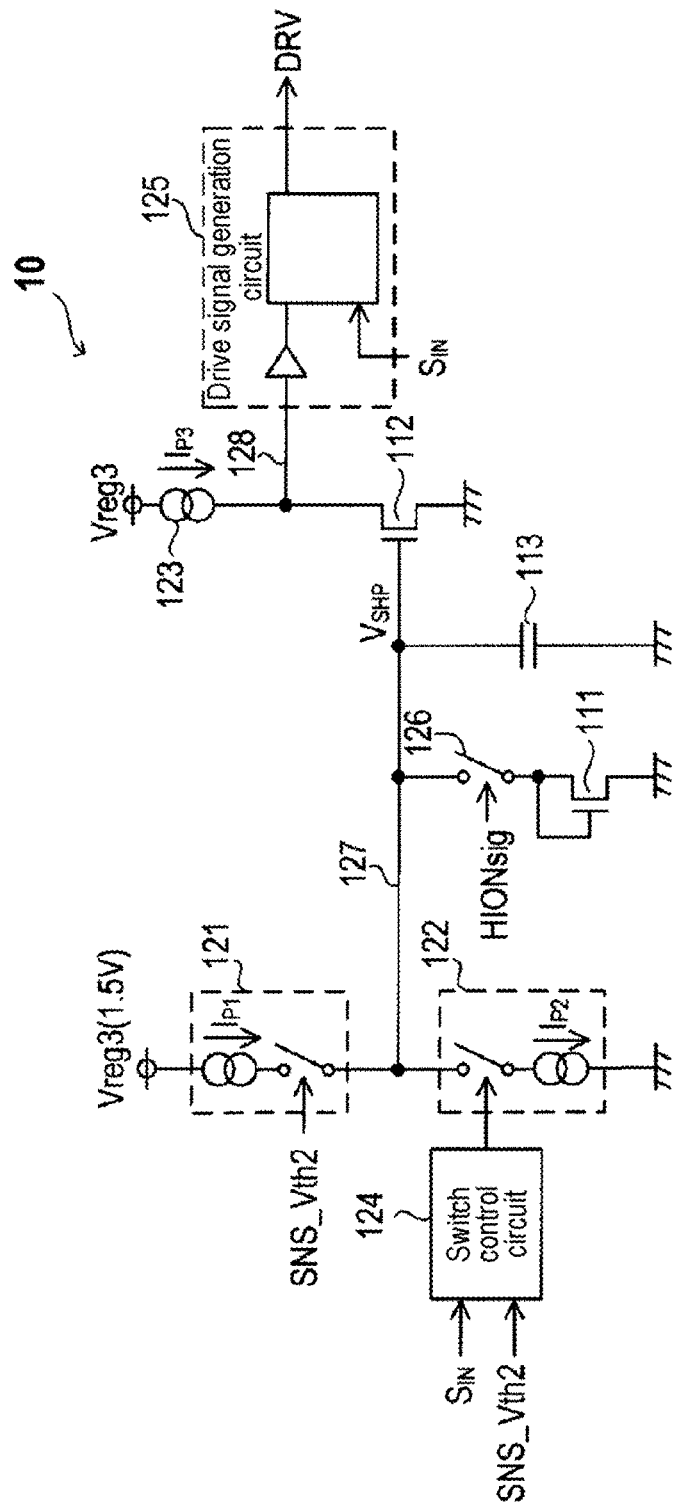
FIG. 7 is a configuration view of a sample/hold circuit according to the first embodiment of the present disclosure.

That is, when the signal Sig51 is "1," since the state of the bridge output circuit BB is in the source state, the output signal of the drive signal generation circuit 125 of FIG. 7 is output as the signal DRV1 from the sample/hold circuit 10A, and the signal DRV1 is output as the drive signal DRV from the selection circuit 53. Conversely, when the signal Sig52 is "1," since the state of the bridge output circuit BB is in the sink state, the output signal of the drive signal generation circuit 225 of FIG. 14 is output as a signal DRV2 from the sample/hold circuit 20A, and the signal DRV2 is output as the drive signal DRV from the selection circuit 53.

When the signal Sig51 is "0," since the state of the bridge output circuit BB is not in the source state, the sample/hold circuit 10A outputs the input signal $S_{IN}$ itself as the signal DRV1. When the signal Sig52 is "0," since the state of the bridge output circuit BB is not in the sink state, the sample/hold circuit 20A outputs the input signal $S_{IN}$ itself as the signal DRV2.

Depending on the situation, both of the signals Sig51 and Sig52 may be "0." When both of the signals Sig51 and Sig52 become "0," it becomes unclear whether the state is the source state or the sink state, but since the drive signal DRV is required, any one of the signals DRV1 and DRV2 may be output as the drive signal DRV. That is, when both of the signals Sig51 and Sig52 are "0," the selection circuit 53 outputs predetermined one of the signal DRV1 and the signal DRV2 as the drive signal DRV. In principle, both of the signals Sig51 and Sig52 will not be "1." However, if both of the signals Sig51 and Sig52 are "1," they may be handled in the same manner as when they are "0." In the following, it is assumed that both of the signals Sig51 and Sig52 will not be "1."

Based on the drive signal DRV output from selection circuit 53, the output control circuit 1A controls the states of the constant current circuits IHon, IHoff, ILon and ILoff and the transistors Hon, Hoff, Lon and Loff, whereby the transistors TrH and TrL are driven and controlled.

That is, when the signal Sig51 is "1," the signal DRV1 from the circuit 10A (that is, the output signal of the drive signal generation circuit 125 of FIG. 7) becomes the drive signal DRV, and as a result, the same operations as those of the bridge output circuit BB according to the first embodiment including the operations described in FIG. 5, FIG. 6 and FIG. 9 are realized. When the signal Sig52 is "1," the signal DRV2 from the circuit 10B (that is, the output signal of the drive signal generation circuit 225 of FIG. 14) becomes the drive signal DRV, and as a result, the same operations as those of the bridge output circuit BB according to the second embodiment including the operations described in FIG. 12, FIG. 13 and FIG. 16 are realized. When both of the signals Sig51 and Sig52 are "0," since the input signal $S_{IN}$ itself becomes the drive signal DRV, the adjustment periods P2 and Q2 are not inserted.

Determination as to whether the state is the source state or the sink state is made in each cycle of the input signal $S_{IN}$, and control according to the determination result is performed in each cycle of the input signal $S_{IN}$.

Fourth Embodiment

A fourth embodiment will be described. In the fourth embodiment, an application of the above-described bridge output circuit BB to a magnetic disk drive will be described.

Figure 19:
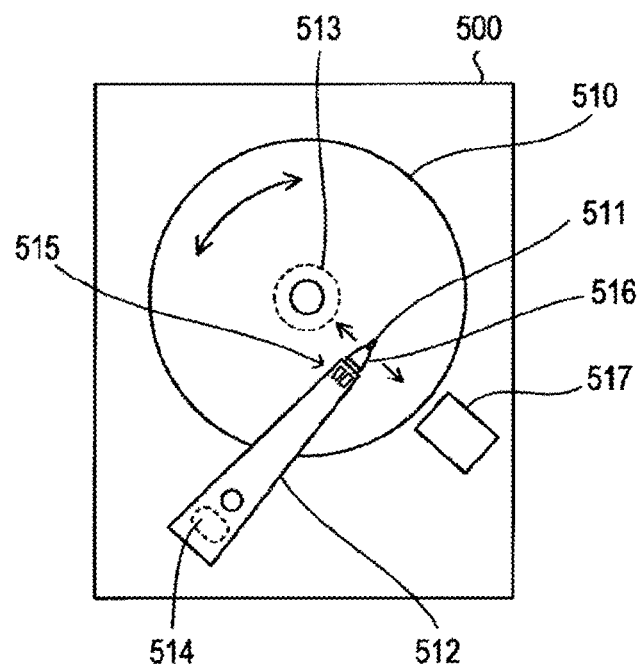
FIG. 19 is a schematic configuration view of a hard disk drive according to a fourth embodiment of the present disclosure.

FIG. 19 is a schematic configuration view of a mechanism of a hard disk drive 500 (hereinafter, referred to as an HDD device) as a magnetic disk drive according to the fourth embodiment.

The HDD device 500 includes a magnetic disk 510 as a recording medium, a magnetic head 511 (hereinafter, also referred to as a head 511) for writing/reading information in/from the magnetic disk 510, an arm 512 for movably supporting the magnetic head 511 in the radial direction of the magnetic disk 510, a spindle motor 513 (hereinafter, also referred to as SPM 513) for supporting and rotating the magnetic disk 510, and a voice coil motor 514 (hereinafter, also referred to as a VCM 514) for rotationally driving and positioning the arm 512 and moving and positioning the magnetic head 511 in the radial direction of the magnetic disk 510.

The HDD 500 further includes a pair of piezoelectric elements 515, a load beam 516 and a ramp 517 for holding the magnetic head 511 at a predetermined withdrawal position apart from the magnetic disk 510. The load beam 516 is attached to the tip of the arm 512, and the magnetic head 511 is attached to the tip of the load beam 516. The pair of piezoelectric elements 515 is disposed near a mounting portion of the load beam 516 at the tip of the arm 512. By applying voltages in opposite phases to the pair of piezoelectric elements 515, the pair of piezoelectric elements 515 expand and contract in opposite phases to displace the magnetic head 511 at the tip of the load beam 516 in the radial direction of the magnetic disk 510.

In this manner, the HDD 500 adopts a so-called two-stage actuator method. The VCM 514 functions as a coarse movement actuator that coarsely positions the magnetic head 511 (positions with relatively coarse resolution) on the magnetic disk 510 by driving the arm 512, and the pair of piezoelectric elements 515 functions as a fine movement actuator that precisely positions the magnetic head 511 (positions with a finer resolution than those of the VCM 514) on the magnetic disk 510 by adjusting the position of the magnetic head 511 on the basis of the position of the arm 512. Hereinafter, an actuator including the pair of piezoelectric elements 515 is referred to as an MA 515 using an abbreviation "MA" of a micro-actuator.

The magnetic disk 510, the magnetic head 511, the arm 515 having the MA 515 and the load beam 516 attached thereto, the SPM 513, the VCM 514, and the ramp 517 are housed in a housing of the HDD 500. The movement and displacement in the radial direction of the magnetic disk 510 relative to the movement and displacement of the magnetic head 511 by the VCM 514 or the MA 515 means the movement and displacement in a direction connecting the outer periphery and the center of the magnetic disk 510 having a disk shape. However, the movement and displacement of the magnetic head 511 in the radial direction of the magnetic disk 510 by the VCM 514 or the MA 515 may include the components of the movement and displacement in directions other than the movement and displacement in the radial direction of the magnetic disk 510 (for example, a tangential direction of an outer periphery of the magnetic disk 510).

Figure 20:
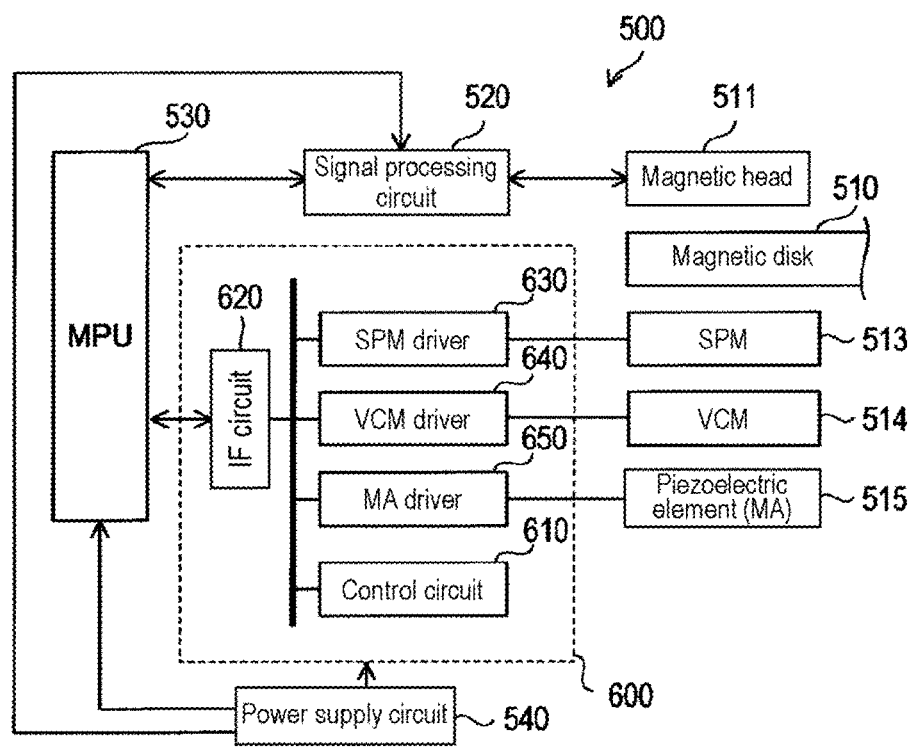
FIG. 20 is an electrical schematic block diagram of the hard disk drive according to the fourth embodiment of the present disclosure.

FIG. 20 is a schematic electrical block diagram of the HDD device 500. The HDD device 500 includes a driver IC 600, a signal processing circuit 520, an MPU (microprocessing unit) 530 and a power supply circuit 540, as electrical components. The power supply circuit 540 supplies power supply voltages for driving the driver IC 600, the signal processing circuit 520 and the MPU 530. The MPU 530 is connected to each of the signal processing circuit 520 and the driver IC 600 so that bi-directional communication can be performed.

When writing information in the magnetic disk 510, the signal processing circuit 520 outputs a recording signal for writing the information to the magnetic head 511. When reading information from the magnetic disk 510, the signal processing circuit 520 performs a necessary signal processing on the signal read from the magnetic disk 510, and sends a resultant signal to the MPU 530. The MPU 530 controls the information write/read operation by the magnetic head 511 through the control of the signal processing circuit 520.

Figure 21:
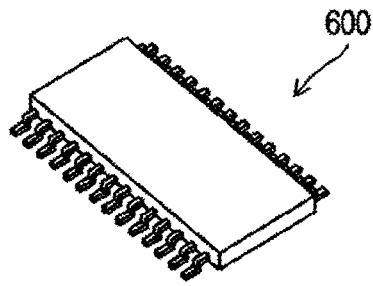
FIG. 21 is an external perspective view of a driver IC mounted on the hard disk drive according to the fourth embodiment of the present disclosure.

The driver IC 600 is an electronic component (driver device) formed by sealing a semiconductor integrated circuit in a housing (package) made of resin, as shown in FIG. 21. The number of pins (external terminals) of the driver IC 600 shown in FIG. 21 is merely an example. The driver IC 600 includes an SPM driver 630 for driving and controlling the SPM 513, a VCM driver 640 for driving and controlling the VCM 514, an MA driver 650 for driving and controlling the MA 515, an IF circuit (interface circuit) 620 for enabling bi-directional communication between the MPU 530 and the driver IC 600, a control circuit 610 for controlling the operation of the drivers 630, 640 and 650 based on control data received from the MPU 530 via the IF circuit 620 and the like.

The MPU 530 controls rotation of the magnetic disk 510 through drive control of the SPM 513 by controlling the SPM driver 630 of the driver IC 600, and performs movement control and positioning of the magnetic head 511 through drive control of the VCM 514 and the MA 515 by controlling the VCM driver 640 and the MA driver 650 of the driver IC 600. The position information indicating each position on the magnetic disk 510 is recorded at each location of the magnetic disk 510. When the magnetic head 511 is positioned on the magnetic disk 510, this position information is read by the magnetic head 511 and transmitted to the MPU 530 through the signal processing circuit 520. The MPU 530 can control the VCM driver 640 and the MA driver 650 based on the position information. Through this control, the VCM driver 640 supplies a necessary drive current to the VCM 514 to realize a first stage positioning of the magnetic head 511. A second stage positioning of the magnetic head 511 is realized by the MA driver 650 supplying a necessary voltage to the MA 515. The positioning of the magnetic head 511 on the magnetic disk 510 means that the magnetic head 511 is positioned above the magnetic disk 510 with a minute space therebetween.

In the case where the position information is not read by the magnetic head 511, for example, when the magnetic head 511 is located outside the outer periphery of the magnetic disk 510, the MPU 530 may control the VCM driver 640 and the MA driver 650 without relying on the position information. For example, when moving the magnetic head 511 from the retracted position in the ramp 517 to the magnetic disk 510, the MPU 530 may output, to the driver IC 600, a signal instructing to supply a predetermined drive current suitable for the movement to the VCM 514, whereby the VCM driver 640 supplies the VCM 514 with a predetermined drive current based on the signal. In a state where the position information is not read by the magnetic head 511, since the precise position control of the magnetic head 511 is not necessary, a voltage supplied to the pair of piezoelectric elements 515 may be zero or may be a fixed voltage.

Figure 22:
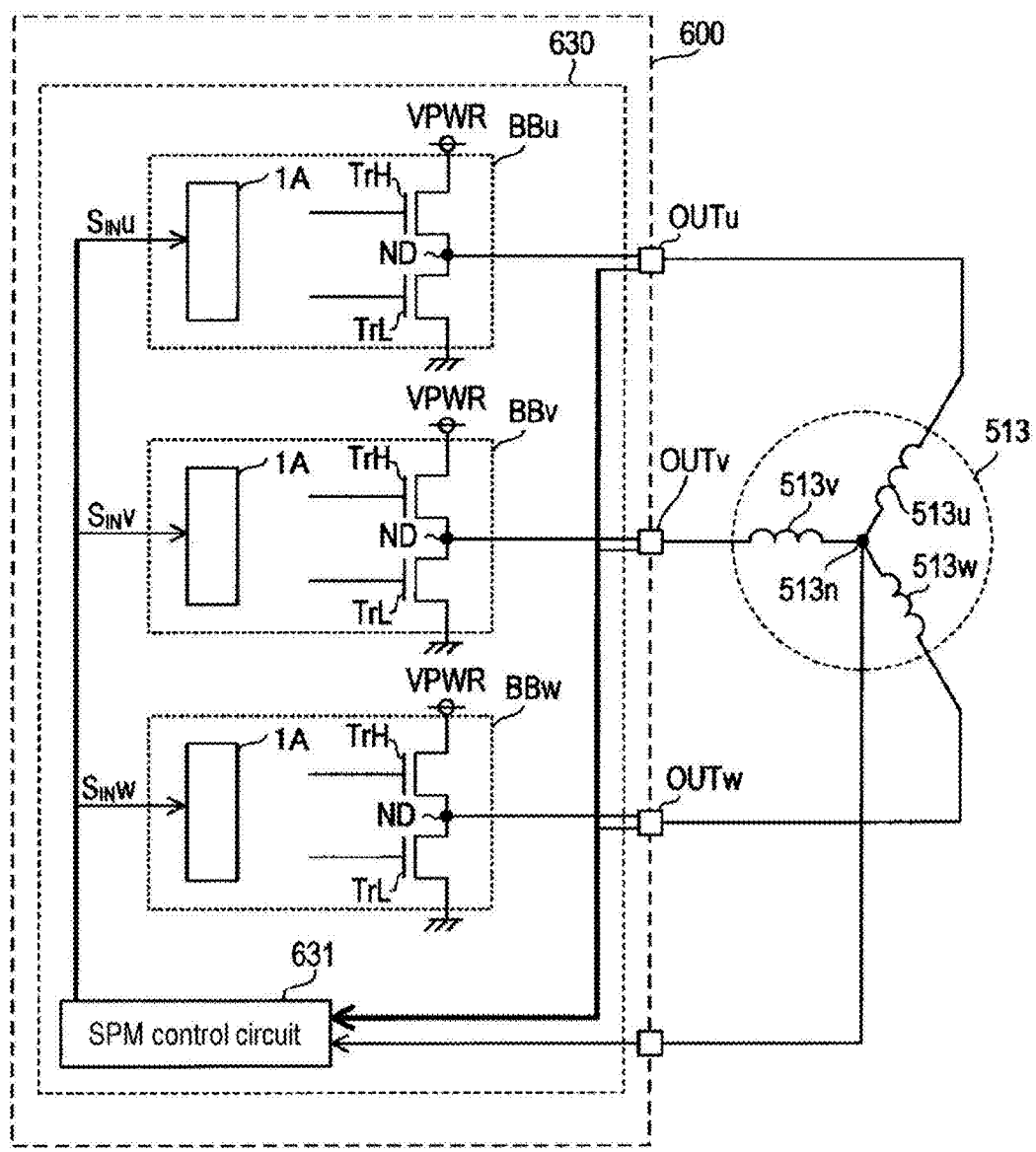
FIG. 22 is a view showing the internal configuration of an SPM (spindle motor) and an SPM driver, and a connection relation thereof according to the fourth embodiment of the present disclosure.

FIG. 22 shows an internal configuration of the SPM 513 and the SPM driver 630 and their connection relationship. The SPM 513 is a three-phase DC motor including star-connected U-phase coil 513$u$, V-phase coil 513$v$ and W-phase coil 513$w$. One end of the coil 513$u$, one end of the coil 513$v$ and one end of the coil 513$w$ are connected to external terminals OUTu, OUTv and OUTw provided in the driver IC 600, respectively, and the other ends of the coils 513$u$, 513$v$ and 513$w$ are connected in common at a neutral point 513$n$.

The SPM driver 630 includes a U-phase bridge output circuit BBu, a V-phase bridge output circuit BBv, a W-phase bridge output circuit BBw and an SPM control circuit 631. Each of the bridge output circuits BBu, BBv and BBw is the same as the bridge output circuit BB of FIG. 1. However, in each of the bridge output circuits BBu, BBv and BBw, the output control circuit 1A according to the third embodiment is used as the output control circuit 1. Only a part of the internal configuration of each bridge output circuit is shown in FIG. 22 in order to prevent complication of the drawings.

Nodes ND of the bridge output circuits BBu, BBv and BBw are connected to the output terminal OUTu functioning as the U-phase output terminal OUT, the output terminal OUTv functioning as the V-phase output terminal OUT, and the output terminal OUTw functioning as the W-phase output terminal OUT, respectively. The SPM 513 corresponds to the load LD for the bridge output circuits BBu, BBv and BBw (see also FIG. 1 as appropriate).

The SPM control circuit 631 generates a U-phase PWM signal, a V-phase PWM signal and a W-phase PWM signal based on the potentials of the output terminals OUTu, OUTv and OUTw and the potential of the neutral point 513$n$. The U-phase PWM signal is input as a signal $S_{IN}u$ to the output control circuit 1A of the bridge output circuit BBu, the V-phase PWM signal is input as a signal $S_{IN}v$ to the output control circuit 1A of the bridge output circuit BBv, and the W-phase PWM signal is input as a signal $S_{IN}w$ to the output control circuit 1A of the bridge output circuit BBw.

The input signals $S_{IN}u$, $S_{IN}v$ and $S_{IN}w$ correspond to the input signals $S_{IN}$ for the output control circuits 1A of the bridge output circuits BBu, BBv and BBw, respectively. Therefore, in the bridge output circuits BBu, BBv and BBw, the drive signal DRV is generated based on the input signals $S_{IN}u$, $S_{IN}v$ and $S_{IN}w$ by the method shown in the third embodiment while determining whether the state is the source state or the sink state.

The operation of the bridge output circuit BB according to the first embodiment is referred to as a source operation, and the operation of the bridge output circuit BB according to the second embodiment is referred to as a sink operation. Then, the source operation is realized in the bridge output circuit BBu when it is determined to be in the source state, and the sink operation is realized in the bridge output circuit BBu when it is determined to be in the sink state. The same applies to the bridge output circuits BBv and BBw. When the SPM 513 is driven to be rotated, since the direction of a current flowing through the coils 513$u$, 513$v$ and 513$w$ changes periodically, the operations performed in the bridge output circuits BBu, BBv and BBw are switched between the source operation and the sink operation one after another (however, there is a phase shift of 120° or 240° between the circuits BBu, BBv and BBw).

The output control circuit 1A of the bridge output circuit BBu, BBv and BBw generates the drive signal DRV based on the input signals SNu, SNv and SNw as PWM signals supplied from the SPM control circuit 631 according to the method shown in the third embodiment while determining whether the state is the source state or the sink state. The bridge output circuits BBu, BBv and BBw generate switching voltages for U-phase, V-phase and the W-phase, which are voltages obtained by pulse width modulation of the power supply voltage VPWR by turning on/off the corresponding output transistors TrH and TrL using the drive signal DRV, and supply them to the coils 513$u$, 513$v$ and 513$w$, respectively. The switching voltages for U-phase, V-phase and W-phase applied to the output terminals OUTu, OUTv and OUTw correspond to the output voltages $V_{OUT}$ for the bridge output circuits BBu, BBv and BBw, respectively. For example, the SPM control circuit 631 may generate a PWM signal of each phase so that each of the currents flowing through the coils 513$u$, 513$v$, and 513$w$ has a form of sine wave.

Figure 23A:
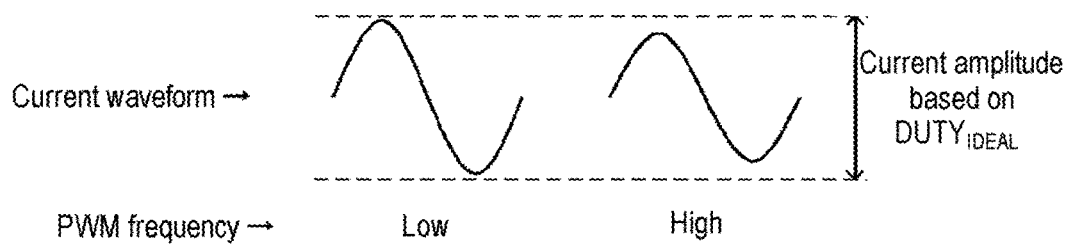
FIG. 23A and FIG. 23B are views showing a relationship between PWM frequency and current amplitude when using a bridge output circuit for comparison, and a relationship between PWM frequency and current amplitude when using the bridge output circuit according to the fourth embodiment of the present disclosure.
Figure 23B:
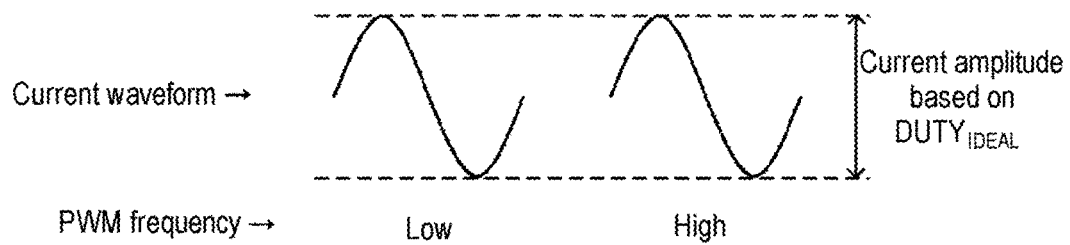

The frequency (PWM frequency) of the input signal $S_{IN}u$ may change under the assumption that the output duty $DUTY_{IDEAL}$ specified by the input signal $S_{IN}u$ is constant. At this time, assuming that the comparison bridge output circuit is used as the bridge output circuit BBu, since Ton and Ton' are not equal to each other and "$DUTY_{IDEAL} > DUTY_{REAL}$" (see FIG. 10), the current amplitude of the U-phase coil 513$u$ deviates from (is smaller than) the current amplitude based on the input signal $S_{IN}u$, and the deviation becomes larger as the PWM frequency becomes higher (see FIG. 23A). By using the bridge output circuit according to the present disclosure, the deviation can be suppressed to be low even in a high PWM frequency range (see FIG. 23B). The same applies to the V-phase and the W-phase.

Figure 24:
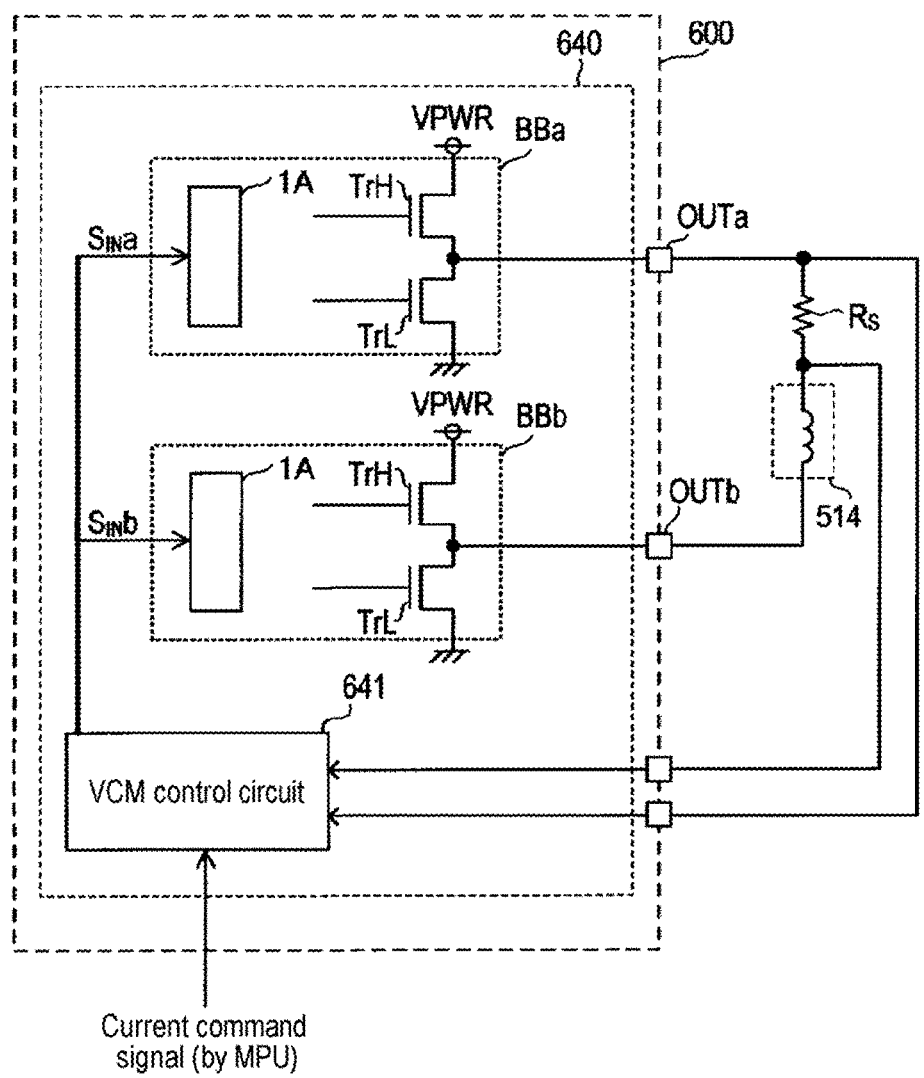
FIG. 24 is a view showing the internal configuration of a VCM (voice coil motor) and a VCM driver, and a connection relation thereof according to the fourth embodiment of the present disclosure.

FIG. 24 shows the internal configuration of the VCM 514 and the VCM driver 640 and their connection relationship. The external terminals provided in the driver IC 600 include external terminals OUTa and OUTb. The external terminal OUTa is connected to one end of the VCM 514 via a sense resistor Rs, and the external terminal OUTb is directly connected to the other end of the VCM 514.

The VCM driver 640 includes a bridge output circuit BBa connected to the external terminal OUTa, a bridge output circuit BBb connected to the external terminal OUTb, and a VCM control circuit 641. Each of the bridge output circuits BBa and BBb is the same as the bridge output circuit BB of FIG. 1. However, in each of the bridge output circuits BBa and BBb, the output control circuit 1A according to the third embodiment is used as the output control circuit 1. Only a part of the internal configuration of each bridge output circuit is shown in FIG. 24 in order to avoid complication of the drawings.

The node ND of the bridge output circuit BBa is connected to the output terminal OUTa functioning as the output terminal OUT of the bridge output circuit BBa, while the node ND of the bridge output circuit BBb is connected to the output terminal OUTb functioning as the output terminal OUT of the bridge output circuit BBb. The VMC 514 corresponds to the load LD for the bridge output circuits BBa and BBb (see also FIG. 1 as appropriate).

For example, based on a signal of voltage drop of a resistor Rs indicating the magnitude and direction of a current flowing to the VCM 514 via the output terminals OUTa and OUTb, and a current command signal for specifying the magnitude and direction of a current to be supplied to the VCM 514, the VCM control circuit 641 generates and outputs a PWM signal for each half bridge circuit in the VCM driver 640 so that the current flowing to the VCM 514 conforms to the current command signal. For example, the current command signal is supplied from the MPU 530 to the driver IC 600. The PWM signal for the half bridge circuit in the bridge output circuit BBa is input from the VCM control circuit 641 to the bridge output circuit BBa as the input signal $S_{IN}a$, and the PWM signal for the half bridge circuit in the bridge output circuit BBb is input from the VCM control circuit 641 to the bridge output circuit BBb as the input signal $S_{IN}b$.

The input signals $S_{IN}a$ and $S_{IN}b$ correspond to the input signal $S_{IN}$ for the output control circuit 1A of the bridge output circuits BBa and BBb, respectively. Therefore, in the bridge output circuits BBa and BBb, the drive signal DRV is generated on the basis of the input signals $S_{IN}a$ and $S_{IN}b$ according to the method shown in the third embodiment while determining whether the state is the source state or the sink state.

That is, based on the input signals $S_{IN}a$ and $S_{IN}b$ as PWM signals supplied from the VCM control circuit 641, the output control circuit 1A of the bridge output circuits BBa and BBb generates the drive signal DRV according to the method shown in the third embodiment while determining whether the state is the source state or the sink state. The bridge output circuits BBa and BBb control the current flowing to the VCM 514 according to the current command signal by using pulse width modulation by turning on/off the corresponding output transistors TrH and TrL using the drive signal DRV. At this time, a current flowing from the output terminal OUTa to the output terminal OUTb is supplied to the VCM 514 such that the head 111 moves from the outer periphery of the magnetic disk 110 toward the center of the magnetic disk 110. In addition, a current flowing from the output terminal OUTb to the output terminal OUTa is supplied to the VCM 514 such that the head 111 moves from the center of the magnetic disk 110 toward the outer periphery of the magnetic disk 110.

The torque to be generated at the VCM 514 is specified by the input signals $S_{IN}a$ and $S_{IN}b$, but when the bridge output circuit according to the present disclosure is used, since the deviation between the specified output duty $DUTY_{IDEAL}$ based on the input signals $S_{IN}a$ and $S_{IN}b$ and the real output duty $DUTY_{REAL}$ can be suppressed to a low level, it is possible to drive the VCM 514 in an ideal or near ideal manner.

When the SPM 513 or VCM 514 is PWM-driven, if a voltage at the output terminal (OUTu, OUTa, etc.) connected to the SPM 513 or VCM 514 is sharply changed, the high frequency component in the sharp voltage change may increase the entire noise of the HDD device 500. Therefore, in order to reduce such noise as much as possible, slew rate control that smoothly changes the voltage of the output terminal at a desired slew rate in the turn-on/off operation of the power transistors TrH and TrL is generally required in the HDD device.

In addition to the HDD device, if the voltage at the output terminal (OUT) is sharply changed, high frequency components in the sharp voltage change may adversely affect other circuit operations as noise. Taking this into consideration, the slew rate control described above may also be required.

Fifth Embodiment

A fifth embodiment will be described.

For the source state, in the sampling period P1, the terminal voltage $V_{SHP}$ of the capacitor 113 is changed from the initial voltage $V_{TH}$ by supplying a constant current in the first direction to the capacitor 113. Thereafter, in the adjustment period P2, the terminal voltage $V_{SHP}$ of the capacitor 113 returns to the initial voltage $V_{TH}$ by supplying a constant current in the second direction to the capacitor 113. In the configuration of FIG. 7, the first direction matches a direction in which the terminal voltage $V_{SHP}$ of the capacitor 113 increases, and the second direction matches a direction in which the terminal voltage $V_{SHP}$ of the capacitor 113 decreases. However, these directions may be reversed. In this case, for the source state, in the sampling period P1, the terminal voltage of the capacitor 113 is lowered from the initial voltage by a constant current, and thereafter, the terminal voltage of the capacitor 113 is increased by a constant current from time $T_{B1}$ at which the input signal $S_{IN}$ changes from "1" to "0," and a time at which the terminal voltage of the capacitor 113 returns to the initial voltage functions as time $T_{B2}$. Then, the sample/hold circuit 10 of FIG. 7 may be modified so that the output signal DRV of the drive signal generation circuit 125 changes from "1" to "0" at time $T_{B2}$ in the source state.

For the sink state, in the sampling period Q1, the terminal voltage $V_{SHQ}$ of the capacitor 213 changes from the initial voltage $V_{TH}$ by supplying a constant current in the first direction to the capacitor 213. Thereafter, in the adjustment period Q2, the terminal voltage $V_{SHQ}$ of the capacitor 213 returns to the initial voltage $V_{TH}$ by supplying a constant current in the second direction to the capacitor 213. In the configuration of FIG. 14, the first direction matches a direction in which the terminal voltage $V_{SHQ}$ of the capacitor 213 increases, and the second direction matches a direction in which the terminal voltage $V_{SHQ}$ of the capacitor 213 decreases. However, these directions may be reversed. In this case, for the sink state, in the sampling period Q1, the terminal voltage of the capacitor 213 is lowered from the initial voltage by a constant current, and thereafter, the terminal voltage of the capacitor 213 is increased by a constant current from time $T_{D1}$ at which the input signal $S_{IN}$ changes from "0" to "1," and a time at which the terminal voltage of the capacitor 213 returns to the initial voltage functions as time $T_{D2}$. Then, the sample/hold circuit 20 of FIG. 14 may be modified so that the output signal DRV of the drive signal generation circuit 225 changes from "0" to "1" at time $T_{D2}$ in the sink state.

Each component of the driver IC 600 is formed in the form of a semiconductor integrated circuit, and a semiconductor device is configured by sealing the semiconductor integrated circuit in a housing (package) made of resin. However, a circuit equivalent to the circuit in the driver IC 600 may be configured using a plurality of discrete components.

Further, the bridge output circuit BB alone may be formed in the form of a semiconductor integrated circuit, and a semiconductor device may be configured by sealing the semiconductor integrated circuit in a housing (package) made of resin.

Although an inductive load including a coil can be considered as the load LD of the bridge output circuit BB, the present disclosure can be applied to any bridge output circuit that allows a current to flow in the source state or the sink state for any load LD.

When it is known that the bridge output circuit BB is driven in the source state, it is not necessary to determine whether the state of the bridge output circuit BB is in the source state or the sink state shown in the third embodiment. It is sufficient to drive the load LD simply by using the bridge output circuit BB according to the first embodiment. Similarly, when it is known that the bridge output circuit BB is driven in the sink state, the load LD may be simply driven using the bridge output circuit BB according to the second embodiment.

In the half bridge circuit including the transistors TrH and TrL, the drain of the transistor TrH is connected to the first power supply terminal, and the source of the transistor TrL is connected to the second power supply terminal. The first and second power supply terminals are optional as long as they have a fixed potential. However, the potential at the first power supply terminal is higher than the potential at the second power supply terminal.

With regard to any signal or voltage indicating a logical value, the relationship between the high level and the low level may be reversed (that is, it may be arbitrary whether to assign the high level or the low level to the logical value "1") without losing the above-mentioned purpose.

The transistor TrH may be formed of a P-channel type MOSFET. In this case, a voltage level supplied to the gate of the transistor TrH is modified from that described above so that the above-mentioned switching control is realized. It is also possible to make the transistor TrL a P-channel MOSFET.

The transistors TrH and TrL may be any type of transistor as long as they are voltage control type transistors. The same applies to the transistors 111 and 112 of FIG. 7 and the transistors 211 and 212 of FIG. 14. The transistors described above other than these transistors may be any type of transistors. For example, the transistor described above as a MOSFET can be replaced with a junction type FET, an insulated gate bipolar transistor (IGBT) or a bipolar transistor. An arbitrary transistor has a first electrode, a second electrode and a control electrode. In the FET, one of the first and second electrodes is a drain, the other is a source, and the control electrode is a gate. In the IGBT, one of the first and second electrodes is a collector, the other is an emitter, and the control electrode is a gate. In a bipolar transistor not belonging to the IGBT, one of the first and second electrodes is a collector, the other is an emitter, and the control electrode is a base.

DISCUSSION OF THE PRESENT DISCLOSURE

The present disclosure embodied in the embodiments described above will be considered below.

According to one aspect of the present disclosure, there is provided a bridge output circuit WA that receives a rectangular wave input signal $S_{IN}$ and supplies an output voltage $V_{OUT}$ corresponding to the input signal to a load connected to an output terminal, including: a voltage-controlled first transistor TrH provided between a first power supply terminal to which a predetermined power supply voltage is applied and the output terminal; a voltage-controlled second transistor TrL provided between the output terminal and a second power supply terminal having a potential lower than the potential of the first power supply terminal; a first OFF detection circuit 31 configured to detect whether or not the first transistor is in an OFF state based on a gate voltage of the first transistor; a second OFF detection circuit 34 configured to detect whether or not the second transistor is in an OFF state based on a gate voltage of the second transistor; and an output control circuit configured to perform a first source transition operation (corresponding to periods including 1161 to 1163 in FIG. 11B) of turning off the second transistor and then turning on the first transistor in response to a first signal change (0→1) in the input signal based on the input signal, the detection result of the first OFF detection circuit and the detection result of the second OFF detection circuit in a source state in which a current flows from a connection node between the first transistor and the second transistor toward the load via the output terminal, and then to perform a second source transition operation (corresponding to periods including 1166 to 1167 in FIG. 11B) of turning off the first transistor and then turning on the second transistor in response to a second signal change (1→0) in the input signal, wherein the output control circuit acquires an analog signal according to the length of dead time in which both the first transistor and the second transistor are turned off during the first source transition operation, and then starts the second source transition operation after waiting for the lapse of time based on the acquired analog signal when the second signal change occurs in the input signal.

Specifically, for example, the bridge output circuit $W_A$ may further include: an ON current supply circuit IHon configured to supply a current to the gate of the first transistor to turn on the first transistor after detecting that the second transistor is in the OFF state ($T_{A2}$) in the first source transition operation; and a voltage comparison circuit 33 configured to compare the output voltage with a predetermined comparison voltage Vth2, wherein the output control circuit may use a comparison result signal (SNS_Vth2) indicating the comparison result of the voltage comparison circuit to acquire, as the analog signal, a signal corresponding to a period from a supply start time ($T_{A2}$) of the current by the ON current supply circuit to a time ($T_{A3}$) when the output voltage reaches the comparison voltage.

More specifically, for example, in the bridge output circuit $W_A$, the output control circuit may include a capacitor for acquiring the analog signal, change the terminal voltage $V_{SHP}$ of the capacitor from the initial voltage $V_{TH}$ by flowing a first constant current $I_{P1}$ to the capacitor from the supply start time ($T_{A2}$) of the current by the ON current supply circuit IHon to the time ($T_{A3}$) when the output voltage reaches the comparison voltage, hold the change as the analog signal, and then allow a second constant current $I_{P2}$ to flow through the capacitor in a reverse direction to the first constant current from a time ($T_{B1}$) when a second signal change (1→0) occurs in the input signal, and start the second source transition operation in response to the terminal voltage of the capacitor returning to the initial voltage.

According to one aspect of the present disclosure, there is provided a bridge output circuit $W_B$ that receives a rectangular wave input signal $S_{IN}$ and supplies an output voltage $V_{OUT}$ corresponding to the input signal to a load connected to an output terminal, including: a voltage-controlled first transistor TrH provided between a first power supply terminal to which a predetermined power supply voltage is applied and the output terminal; a voltage-controlled second transistor TrL provided between the output terminal and a second power supply terminal having a potential lower than the potential of the first power supply terminal; a first OFF detection circuit 31 configured to detect whether or not the first transistor is in an OFF state based on a gate voltage of the first transistor; a second OFF detection circuit 34 configured to detect whether or not the second transistor is in an OFF state based on a gate voltage of the second transistor; and an output control circuit configured to perform a first sink transition operation (corresponding to periods including 1261 to 1263 in FIG. 17B) of turning off the first transistor and then turning on the second transistor in response to a first signal change (1→0) in the input signal based on the input signal, the detection result of the first OFF detection circuit and the detection result of the second OFF detection circuit in a sink state in which a current flows from the load toward the connection node via the output terminal, and then to perform a second sink transition operation (corresponding to periods including 1266 to 1267 in FIG. 17B) of turning off the second transistor and then turning on the first transistor in response to a second signal change (0→1) in the input signal, wherein the output control circuit acquires an analog signal according to the length of dead time in which both the first transistor and the second transistor are turned off during the first sink transition operation, and then starts the second sink transition operation after waiting for a lapse of time based on the acquired analog signal when the second signal change occurs in the input signal.

Specifically, for example, the bridge output circuit $W_B$ may further include: an ON current supply circuit ILon configured to supply a current to the gate of the second transistor to turn on the second transistor after detecting that the first transistor is in the OFF state ($T_{C2}$) in the first sink transition operation; and a voltage comparison circuit 35 configured to compare the output voltage with a predetermined comparison voltage (VPWR−Vth3), wherein the output control circuit may use a comparison result signal (SNS_(VPWR−Vth3)) indicating the comparison result of the voltage comparison circuit to acquire, as the analog signal, a signal corresponding to a period from a supply start time ($T_{C2}$) of the current by the ON current supply circuit to a time ($T_{C3}$) when the output voltage falls below the comparison voltage.

More specifically, for example, in the bridge output circuit $W_B$, the output control circuit may include a capacitor for acquiring the analog signal, change the terminal voltage $V_{SHQ}$ of the capacitor from the initial voltage $V_{TH}$ by flowing a first constant current $I_{Q1}$ to the capacitor from the supply start time ($T_{C2}$) of the current by the ON current supply circuit ILon to the time ($T_{C3}$) when the output voltage falls below the comparison voltage, hold the change as the analog signal, and then allow a second constant current $I_{Q2}$ to flow through the capacitor in a reverse direction to the first constant current from a time ($T_{D1}$) when a second signal change (0→1) occurs in the input signal, and start the second sink transition operation in response to the terminal voltage of the capacitor returning to the initial voltage.

According to one aspect of the present disclosure, there is provided a bridge output circuit $W_C$ that receives a rectangular wave input signal $S_{IN}$ and supplies an output voltage corresponding to the input signal to a load connected to an output terminal, including: a voltage-controlled first transistor provided between a first power supply terminal to which a predetermined power supply voltage is applied and the output terminal; a voltage-controlled second transistor provided between the output terminal and a second power supply terminal having a potential lower than the potential of the first power supply terminal; a first OFF detection circuit configured to detect whether or not the first transistor is in an OFF state based on a gate voltage of the first transistor; a second OFF detection circuit configured to detect whether or not the second transistor is in an OFF state based on a gate voltage of the second transistor; a voltage comparison circuit 33 and 35 configured to compare the output voltage with a plurality of comparison voltages Vth2 and VPWR−Vth3; and an output control circuit configured to control the ON/OFF state of the first transistor and the second transistor based on the input signal, the detection result of the first OFF detection circuit and the detection result of the second OFF detection circuit, wherein the output control circuit performs a first source transition operation (corresponding to periods including 1161 to 1163 in FIG. 11B) of turning off the second transistor and then turning on the first transistor in response to a first signal change (0→1) in the input signal in a source state in which a current flows from a connection node between the first transistor and the second transistor toward the load via the output terminal, and then performs a second source transition operation (corresponding to periods including 1166 to 1167 in FIG. 11B) of turning off the first transistor and then turning on the second transistor in response to a second signal change (1→0) in the input signal, wherein the output control circuit performs a first sink transition operation (corresponding to periods including 1261 to 1263 in FIG. 17B) of turning off the first transistor and then turning on the second transistor in response to the second signal change (1→0) in the input signal in a sink state in which a current flows from the load toward the connection node via the output terminal, and then performs a second sink transition operation (corresponding to periods including 1266 to 1267 in FIG. 17B) of turning off the second transistor and then turning on the first transistor in response to the first signal change (0→1) in the input signal, wherein the output control circuit includes a determination circuit 51 and 52 that determines whether the output control circuit is in the source state or the sink state based on the detection result of the first OFF detection circuit, the detection result of the second OFF detection circuit and the comparison result of the voltage comparison circuit, wherein, upon determining by the determination circuit that the output control circuit is in the source state, the output control circuit acquires a first analog signal according to the length of dead time in which both the first transistor and the second transistor are turned off during the first source transition operation, and then starts the second source transition operation after waiting for a lapse of time based on the acquired first analog signal when the second signal change (1→0) occurs in the input signal, and wherein, upon determining by the determination circuit that the output control circuit is in the sink state, the output control circuit acquires a second analog signal according to the length of dead time in which both the first transistor and the second transistor are turned off during the first sink transition operation, and then starts the second sink transition operation after waiting for a lapse of time based on the acquired second analog signal when the first signal change (0→1) occurs in the input signal.

Specifically, for example, the bridge output circuit $W_C$ may further include: a first ON current supply circuit IHon configured to supply a current to the gate of the first transistor to turn on the first transistor; and a second ON current supply circuit ILon configured to supply a current to the gate of the second transistor to turn on the second transistor, wherein the voltage comparison circuit may include a first voltage comparison circuit 33 that compares the output voltage with a predetermined first comparison voltage Vth2, and a second voltage comparison circuit 35 that compares the output voltage with a predetermined second comparison voltage (VPWR−Vth3) higher than the first comparison voltage, wherein the output control circuit may include: a first analog signal acquisition circuit 10 and 10A that uses a comparison result signal (SNS_Vth2) indicating the comparison result of the first voltage comparison circuit to acquire, as the first analog signal, a signal corresponding to a period from a supply start time $(T_{A2})$ of the current by the first ON current supply circuit IHon to a time $(T_{A3})$ when the output voltage reaches the first comparison voltage during the first source transition operation; and a second analog signal acquisition circuit 20 and 20A that uses a comparison result signal (SNS_(VPWR−Vth3)) indicating the comparison result of the second voltage comparison circuit to acquire, as the second analog signal, a signal corresponding to a period from the supply start time $(T_{C2})$ of the current by the second ON current supply circuit ILon to a time $(T_{C3})$ when the output voltage falls below the second comparison voltage during the first sink transition operation, wherein, upon determining by the determination circuit that the output control circuit is in the source state, the output control circuit may perform the first source transition operation and then starts the second source transition operation after waiting for the lapse of time based on the first analog signal when the second signal change (1→0) occurs in the input signal, and wherein, upon determining by the determination circuit that the output control circuit is in the sink state, the output control circuit may perform the first sink transition operation and then starts the second sink transition operation after waiting for the lapse of time based on the second analog signal when the first signal change (0→1) occurs in the input signal.

More specifically, for example, in the bridge output circuit, the first analog signal acquisition circuit may include a first capacitor for acquiring the first analog signal, changes the terminal voltage $V_{SHP}$ of the first capacitor from a first initial voltage $V_{TH}$ by flowing a first constant current $I_{P1}$ to the first capacitor from the supply start time $(T_{A2})$ of the current by the first ON current supply circuit to the time $(T_{A3})$ when the output voltage reaches the first comparison voltage, and holds the change as the first analog signal, wherein, upon determining by the determination circuit that the output control circuit is in the source state, the output control circuit may perform the first source transition operation and then starts the second source transition operation in response to the terminal voltage of the first capacitor returning to the first initial voltage by flowing a second constant current $I_{P2}$ in the reverse direction to the first constant current to the first capacitor from the time $(T_{B1})$ when the second signal change (1→0) occurs in the input signal, wherein the second analog signal acquisition circuit may include a second capacitor for acquiring the second analog signal, changes the terminal voltage $V_{SHQ}$ of the second capacitor from a second initial voltage $V_{TH}$ by flowing a third constant current $I_{Q1}$ to the second capacitor from the supply start time $(T_{C2})$ of the current by the second ON current supply circuit to the time $(T_{C3})$ when the output voltage falls below the second comparison voltage, and holds the change as the second analog signal, and wherein, upon determining by the determination circuit that the output control circuit is in the sink state, the output control circuit may perform the first sink transition operation and then starts the second sink transition operation in response to the terminal voltage of the second capacitor returning to the second initial voltage by flowing a fourth constant current $I_{Q2}$ in the reverse direction to the third constant current to the second capacitor from the time $(T_{D1})$ when the first signal change (0→1) occurs in the input signal.

According to the bridge output circuits $W_A$, $W_B$ and $W_C$, it is possible to suppress the deviation between the output duty specified by the input signal and a real output duty to a low level.

According to the present disclosure in some embodiments, it is possible to provide a bridge output circuit, a motor driver device and a semiconductor device which contribute to the reduction of the deviation between an output duty specified by an input signal and a real output duty.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A bridge output circuit that receives a rectangular wave input signal and supplies an output voltage corresponding to the rectangular wave input signal to a load connected to an output terminal, comprising:
   a voltage-controlled first transistor provided between a first power supply terminal to which a predetermined power supply voltage is applied and the output terminal;
   a voltage-controlled second transistor provided between the output terminal and a second power supply terminal having a potential lower than the potential of the first power supply terminal;
   a first OFF detection circuit configured to detect whether or not the voltage-controlled first transistor is in an OFF state based on a gate voltage of the voltage-controlled first transistor;

a second OFF detection circuit configured to detect whether or not the voltage-controlled second transistor is in an OFF state based on a gate voltage of the voltage-controlled second transistor; and an output control circuit configured to perform a first source transition operation of turning off the voltage-controlled second transistor and then turning on the voltage-controlled first transistor in response to a first signal change in the rectangular wave input signal based on the rectangular wave input signal, a detection result of the first OFF detection circuit and a detection result of the second OFF detection circuit in a source state in which a current flows from a connection node between the voltage-controlled first transistor and the voltage-controlled second transistor toward the load via the output terminal, and then to perform a second source transition operation of turning off the voltage-controlled first transistor and then turning on the voltage-controlled second transistor in response to a second signal change in the rectangular wave input signal, wherein the output control circuit acquires an analog signal according to a length of dead time in which both the voltage-controlled first transistor and the voltage-controlled second transistor are turned off during the first source transition operation, and then starts the second source transition operation after waiting for a lapse of time based on the acquired analog signal when the second signal change occurs in the rectangular wave input signal.

2. The bridge output circuit of claim 1, further comprising:

an ON current supply circuit configured to supply a current to the gate of the voltage-controlled first transistor to turn on the voltage-controlled first transistor after detecting that the voltage-controlled second transistor is in the OFF state in the first source transition operation; and a voltage comparison circuit configured to compare the output voltage with a predetermined comparison voltage, wherein the output control circuit uses a comparison result signal indicating a comparison result of the voltage comparison circuit to acquire, as the analog signal, a signal corresponding to a period from a supply start time of the current by the ON current supply circuit to a time when the output voltage reaches the predetermined comparison voltage.

3. The bridge output circuit of claim 2, wherein the output control circuit includes a capacitor configured to acquire the analog signal, changes a terminal voltage of the capacitor from an initial voltage by flowing a first constant current to the capacitor from the supply start time of the current by the ON current supply circuit to the time when the output voltage reaches the predetermined comparison voltage, holds the change as the analog signal, and then allows a second constant current to flow through the capacitor in a reverse direction to the first constant current from a time when the second signal change occurs in the rectangular wave input signal, and starts the second source transition operation in response to the terminal voltage of the capacitor returning to the initial voltage.

4. A bridge output circuit that receives a rectangular wave input signal and supplies an output voltage corresponding to the rectangular wave input signal to a load connected to an output terminal, comprising:

a voltage-controlled first transistor provided between a first power supply terminal to which a predetermined power supply voltage is applied and the output terminal;

a voltage-controlled second transistor provided between the output terminal and a second power supply terminal having a potential lower than the potential of the first power supply terminal;

a first OFF detection circuit configured to detect whether or not the voltage-controlled first transistor is in an OFF state based on a gate voltage of the voltage-controlled first transistor;

a second OFF detection circuit configured to detect whether or not the voltage-controlled second transistor is in an OFF state based on a gate voltage of the voltage-controlled second transistor; and an output control circuit configured to perform a first sink transition operation of turning off the voltage-controlled first transistor and then turning on the voltage-controlled second transistor in response to a first signal change in the rectangular wave input signal based on the rectangular wave input signal, a detection result of the first OFF detection circuit and a detection result of the second OFF detection circuit in a sink state in which a current flows from the load toward a connection node between the voltage-controlled first transistor and the voltage-controlled second transistor via the output terminal, and then to perform a second sink transition operation of turning off the voltage-controlled second transistor and then turning on the voltage-controlled first transistor in response to a second signal change in the rectangular wave input signal, wherein the output control circuit acquires an analog signal according to a length of dead time in which both the voltage-controlled first transistor and the voltage-controlled second transistor are turned off during the first sink transition operation, and then starts the second sink transition operation after waiting for a lapse of time based on the acquired analog signal when the second signal change occurs in the rectangular wave input signal.

5. The bridge output circuit of claim 4, further comprising:

an ON current supply circuit configured to supply a current to the gate of the voltage-controlled second transistor to turn on the voltage-controlled second transistor after detecting that the voltage-controlled first transistor is in the OFF state in the first sink transition operation; and a voltage comparison circuit configured to compare the output voltage with a predetermined comparison voltage, wherein the output control circuit uses a comparison result signal indicating a comparison result of the voltage comparison circuit to acquire, as the analog signal, a signal corresponding to a period from a supply start time of the current by the ON current supply circuit to a time when the output voltage falls below the predetermined comparison voltage.

6. The bridge output circuit of claim 5, wherein the output control circuit includes a capacitor configured to acquire the analog signal, changes a terminal voltage of the capacitor from an initial voltage by flowing a first constant current to the capacitor from the supply start time of the current by the ON current supply circuit to the time when the output voltage falls below the predetermined comparison voltage, holds the change as the analog signal, and then allow a second constant current to flow through the capacitor in a reverse direction to the first constant current from a time when the second signal change occurs in the rectangular wave input signal, and starts the second sink transition operation in response to the terminal voltage of the capacitor returning to the initial voltage.

7. A bridge output circuit that receives a rectangular wave input signal and supplies an output voltage corresponding to the rectangular wave input signal to a load connected to an output terminal, comprising:
a voltage-controlled first transistor provided between a first power supply terminal to which a predetermined power supply voltage is applied and the output terminal;
a voltage-controlled second transistor provided between the output terminal and a second power supply terminal having a potential lower than the potential of the first power supply terminal;
a first OFF detection circuit configured to detect whether or not the voltage-controlled first transistor is in an OFF state based on a gate voltage of the voltage-controlled first transistor;
a second OFF detection circuit configured to detect whether or not the voltage-controlled second transistor is in an OFF state based on a gate voltage of the voltage-controlled second transistor;
a voltage comparison circuit configured to compare the output voltage with a plurality of comparison voltages; and
an output control circuit configured to control an ON/OFF state of the voltage-controlled first transistor and the voltage-controlled second transistor based on the rectangular wave input signal, a detection result of the first OFF detection circuit and a detection result of the second OFF detection circuit,
wherein the output control circuit performs a first source transition operation of turning off the voltage-controlled second transistor and then turning on the voltage-controlled first transistor in response to a first signal change in the rectangular wave input signal in a source state in which a current flows from a connection node between the voltage-controlled first transistor and the voltage-controlled second transistor toward the load via the output terminal, and then performs a second source transition operation of turning off the voltage-controlled first transistor and then turning on the voltage-controlled second transistor in response to a second signal change in the rectangular wave input signal,
wherein the output control circuit performs a first sink transition operation of turning off the voltage-controlled first transistor and then turning on the voltage-controlled second transistor in response to the second signal change in the rectangular wave input signal in a sink state in which a current flows from the load toward the connection node via the output terminal, and then performs a second sink transition operation of turning off the voltage-controlled second transistor and then turning on the voltage-controlled first transistor in response to the first signal change in the rectangular wave input signal,
wherein the output control circuit includes a determination circuit that determines whether the output control circuit is in the source state or the sink state based on the detection result of the first OFF detection circuit, the detection result of the second OFF detection circuit and a comparison result of the voltage comparison circuit,
wherein, upon determining by the determination circuit that the output control circuit is in the source state, the output control circuit acquires a first analog signal according to a length of dead time in which both the voltage-controlled first transistor and the voltage-controlled second transistor are turned off during the first source transition operation, and then starts the second source transition operation after waiting for a lapse of time based on the acquired first analog signal when the second signal change occurs in the rectangular wave input signal, and
wherein, upon determining by the determination circuit that the output control circuit is in the sink state, the output control circuit acquires a second analog signal according to a length of dead time in which both the voltage-controlled first transistor and the voltage-controlled second transistor are turned off during the first sink transition operation, and then starts the second sink transition operation after waiting for a lapse of time based on the acquired second analog signal when the first signal change occurs in the rectangular wave input signal.

8. The bridge output circuit of claim 7, further comprising:
a first ON current supply circuit configured to supply a current to the gate of the voltage-controlled first transistor to turn on the voltage-controlled first transistor; and
a second ON current supply circuit configured to supply a current to the gate of the voltage-controlled second transistor to turn on the voltage-controlled second transistor,
wherein the voltage comparison circuit includes a first voltage comparison circuit that compares the output voltage with a predetermined first comparison voltage, and a second voltage comparison circuit that compares the output voltage with a predetermined second comparison voltage higher than the predetermined first comparison voltage,
wherein the output control circuit includes:
a first analog signal acquisition circuit that uses a comparison result signal indicating a comparison result of the first voltage comparison circuit to acquire, as the first analog signal, a signal corresponding to a period from a supply start time of the current by the first ON current supply circuit to a time when the output voltage reaches the predetermined first comparison voltage during the first source transition operation; and
a second analog signal acquisition circuit that uses a comparison result signal indicating a comparison result of the second voltage comparison circuit to acquire, as the second analog signal, a signal corresponding to a period from the supply start time of the current by the second ON current supply circuit to a time when the output voltage falls below the predetermined second comparison voltage during the first sink transition operation,
wherein, upon determining by the determination circuit that the output control circuit is in the source state, the output control circuit performs the first source transition operation and then starts the second source transition operation after waiting for a lapse of time based on the first analog signal when the second signal change occurs in the rectangular wave input signal, and
wherein, upon determining by the determination circuit that the output control circuit is in the sink state, the output control circuit performs the first sink transition operation and then starts the second sink transition operation after waiting for a lapse of time based on the second analog signal when the first signal change occurs in the rectangular wave input signal.

9. The bridge output circuit of claim 8, wherein the first analog signal acquisition circuit includes a first capacitor configured to acquire the first analog signal, changes a terminal voltage of the first capacitor from a first initial voltage by flowing a first constant current to the first capacitor from the supply start time of the current by the first ON current supply circuit to the time when the output voltage reaches the predetermined first comparison voltage, and holds the change as the first analog signal, wherein, upon determining by the determination circuit that the output control circuit is in the source state, the output control circuit performs the first source transition operation and then starts the second source transition operation in response to the terminal voltage of the first capacitor returning to the first initial voltage by flowing a second constant current in a reverse direction to the first constant current to the first capacitor from the time when the second signal change occurs in the rectangular wave input signal, wherein the second analog signal acquisition circuit includes a second capacitor configured to acquire the second analog signal, changes a terminal voltage of the second capacitor from a second initial voltage by flowing a third constant current to the second capacitor from the supply start time of the current by the second ON current supply circuit to the time when the output voltage falls below the predetermined second comparison voltage, and holds the change as the second analog signal, and wherein, upon determining by the determination circuit that the output control circuit is in the sink state, the output control circuit performs the first sink transition operation and then starts the second sink transition operation in response to the terminal voltage of the second capacitor returning to the second initial voltage by flowing a fourth constant current in a reverse direction to the third constant current to the second capacitor from the time when the first signal change occurs in the rectangular wave input signal.

10. A semiconductor device forming the bridge output circuit of claim 1, wherein the bridge output circuit is formed using an integrated circuit.

11. A motor driver device including an SPM driver configured to drive a spindle motor configured to rotate a magnetic disk of a magnetic disk device, wherein the bridge output circuit of claim 7 is installed for each of coils of a plurality of phases forming the spindle motor, and the spindle motor functions as the load.

12. A semiconductor device forming the motor driver device of claim 11, wherein the motor driver device is formed using an integrated circuit.

* * * * *